US012648152B2

(12) United States Patent
Fan et al.

(10) Patent No.: US 12,648,152 B2
(45) Date of Patent: Jun. 2, 2026

(54) THREE-DIMENSIONAL MEMORY DEVICES AND FABRICATING METHODS THEREOF

(71) Applicant: YANGTZE MEMORY TECHNOLOGIES CO., LTD., Wuhan (CN)

(72) Inventors: Dongyu Fan, Wuhan (CN); Dongxue Zhao, Wuhan (CN); Wenxi Zhou, Wuhan (CN); Zhiliang Xia, Wuhan (CN); Zongliang Huo, Wuhan (CN); Wei Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 431 days.

(21) Appl. No.: 18/141,274

(22) Filed: Apr. 28, 2023

(65) Prior Publication Data

US 2023/0422520 A1 Dec. 28, 2023

Related U.S. Application Data

(63) Continuation of application No. PCT/CN2023/083667, filed on Mar. 24, 2023.
(Continued)

(30) Foreign Application Priority Data

Jun. 22, 2022 (CN) .......................... 202210714042.6

(51) Int. Cl.
*H10B 80/00* (2026.01)
*H10B 41/27* (2023.01)
(Continued)

(52) U.S. Cl.
CPC ............. *H10B 80/00* (2023.02); *H10B 41/27* (2023.02); *H10B 43/27* (2023.02); *H10B 51/20* (2023.02);
(Continued)

(58) Field of Classification Search
CPC ........ H10B 80/00; H10B 43/27; H10B 51/20; H10B 51/40; H10B 43/40; H01L 24/08;
(Continued)

(56) References Cited

U.S. PATENT DOCUMENTS

2020/0135755 A1* 4/2020 Shin ....................... H10B 41/10
2020/0328180 A1 10/2020 Cheng et al.
(Continued)

OTHER PUBLICATIONS

International Search Report issued in corresponding International Application No. PCT/CN2023/083667, mailed Jul. 13, 2023, 3 pages.

*Primary Examiner* — Thanh Y. Tran
(74) *Attorney, Agent, or Firm* — BAYES PLLC

(57) ABSTRACT

Three-dimensional (3D) memory devices and fabricating methods are disclosed. A disclosed 3D memory device includes a first semiconductor structure. The first semiconductor structure includes an array of first-type through stack structures in a first region and an array of second-type through stack structures in a second region, and a slit structure separating the array of first-type through stack structures from the array of second-type through stack structures. The 3D memory device further includes a second semiconductor structure. The second semiconductor structure includes a first periphery circuit and a second periphery circuit at different levels. The second semiconductor structure and the first semiconductor structure are bonded together, such that the first periphery circuit is located between the second periphery circuit and the first semiconductor structure.

20 Claims, 32 Drawing Sheets

Related U.S. Application Data

(60) Provisional application No. 63/433,131, filed on Dec. 16, 2022.

(51) Int. Cl.
| | |
|---|---|
| *H10B 43/27* | (2023.01) |
| *H10B 51/20* | (2023.01) |
| *H10D 1/00* | (2025.01) |
| *H10W 90/00* | (2026.01) |
| *H10W 80/00* | (2026.01) |

(52) U.S. Cl.
CPC .............. *H10D 1/00* (2025.01); *H10W 90/00* (2026.01); *H10W 80/312* (2026.01); *H10W 80/327* (2026.01); *H10W 90/792* (2026.01)

(58) Field of Classification Search
CPC ..... H01L 24/80; H01L 25/0652; H01L 25/18; H01L 25/50; H01L 2224/08145; H01L 2224/80895; H01L 2224/80896; H01L 2924/1431; H01L 2924/1441; H01L 2924/14511; H01L 2225/06541; H01L 2225/06527; H01L 2225/06565; H01L 25/0657; H10D 1/00
See application file for complete search history.

(56) References Cited

U.S. PATENT DOCUMENTS

| | | | |
|---|---|---|---|
| 2021/0265319 A1 | 8/2021 | Liu | |
| 2021/0399014 A1 | 12/2021 | Wu et al. | |
| 2022/0189993 A1* | 6/2022 | Tirukkonda | ........... H10B 41/10 |

* cited by examiner

500C

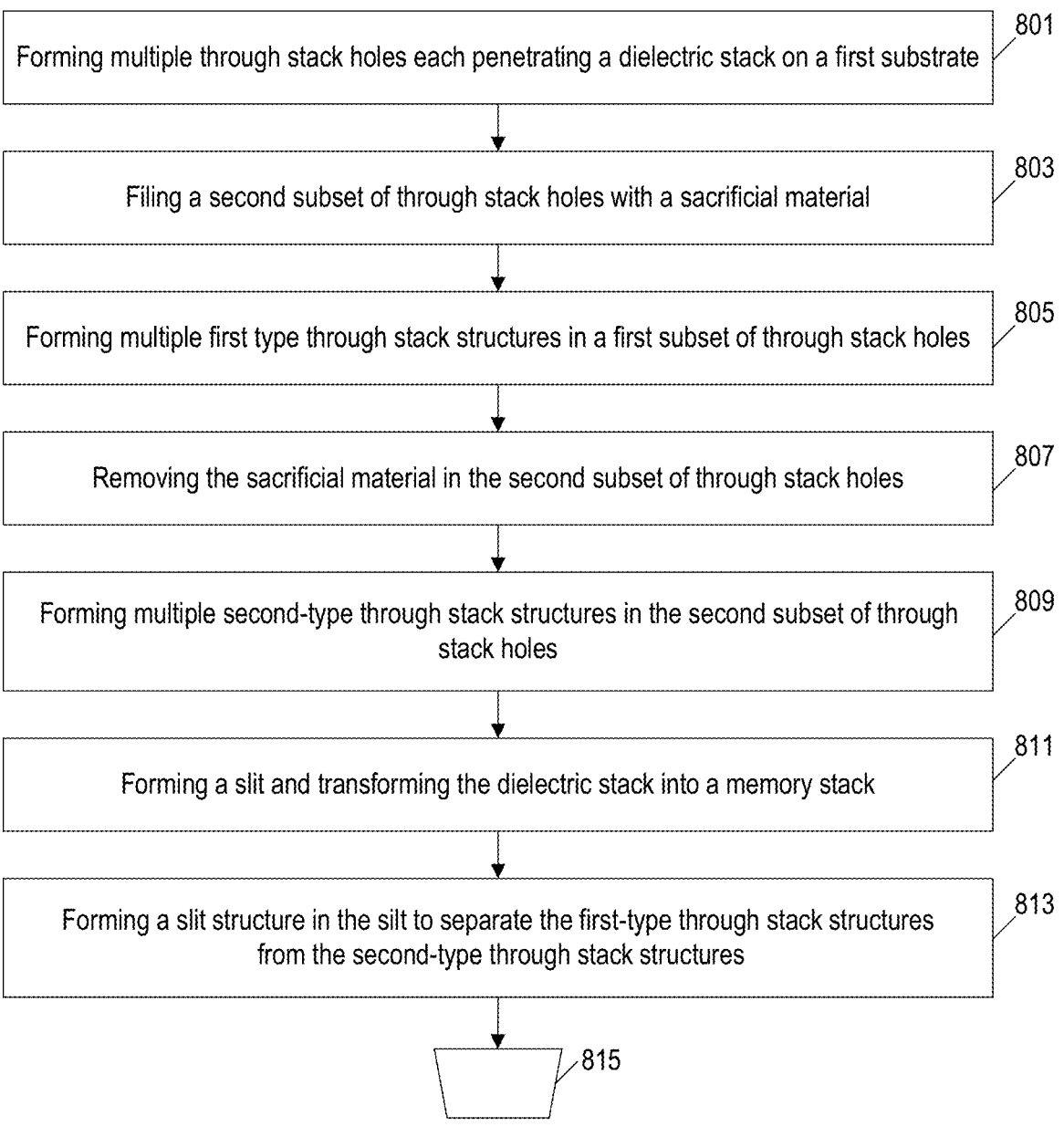

800A

Forming multiple through stack holes each penetrating a dielectric stack on a first substrate `801`

Filing a second subset of through stack holes with a sacrificial material `803`

Forming multiple first type through stack structures in a first subset of through stack holes `805`

Removing the sacrificial material in the second subset of through stack holes `807`

Forming multiple second-type through stack structures in the second subset of through stack holes `809`

Forming a slit and transforming the dielectric stack into a memory stack `811`

Forming a slit structure in the silt to separate the first-type through stack structures from the second-type through stack structures `813`

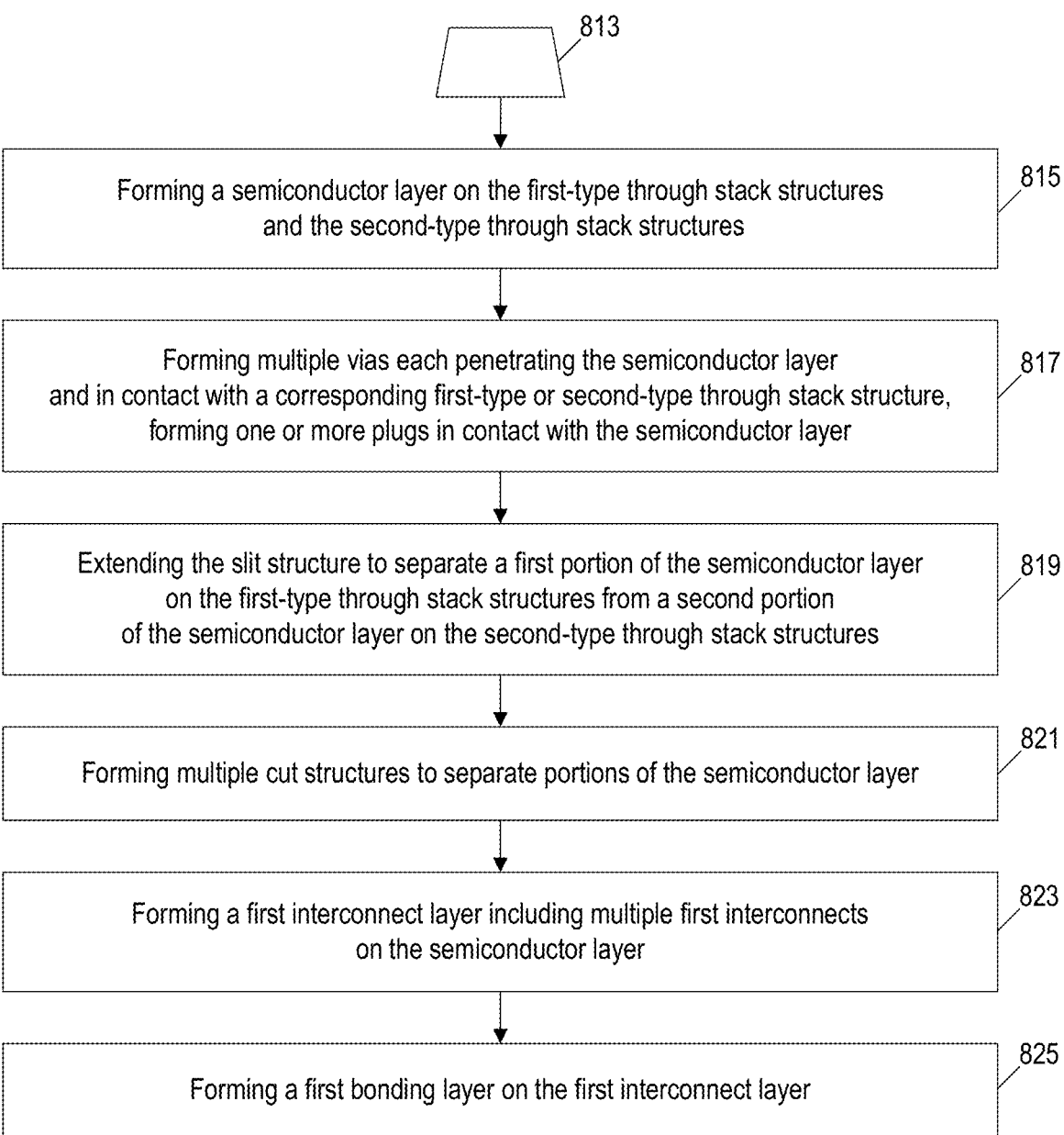

Forming a semiconductor layer on the first-type through stack structures
and the second-type through stack structures          815

Forming multiple vias each penetrating the semiconductor layer
and in contact with a corresponding first-type or second-type through stack structure,
forming one or more plugs in contact with the semiconductor layer          817

Extending the slit structure to separate a first portion of the semiconductor layer
on the first-type through stack structures from a second portion
of the semiconductor layer on the second-type through stack structures          819

Forming multiple cut structures to separate portions of the semiconductor layer          821

Forming a first interconnect layer including multiple first interconnects
on the semiconductor layer          823

Forming a first bonding layer on the first interconnect layer          825

FIG. 8B

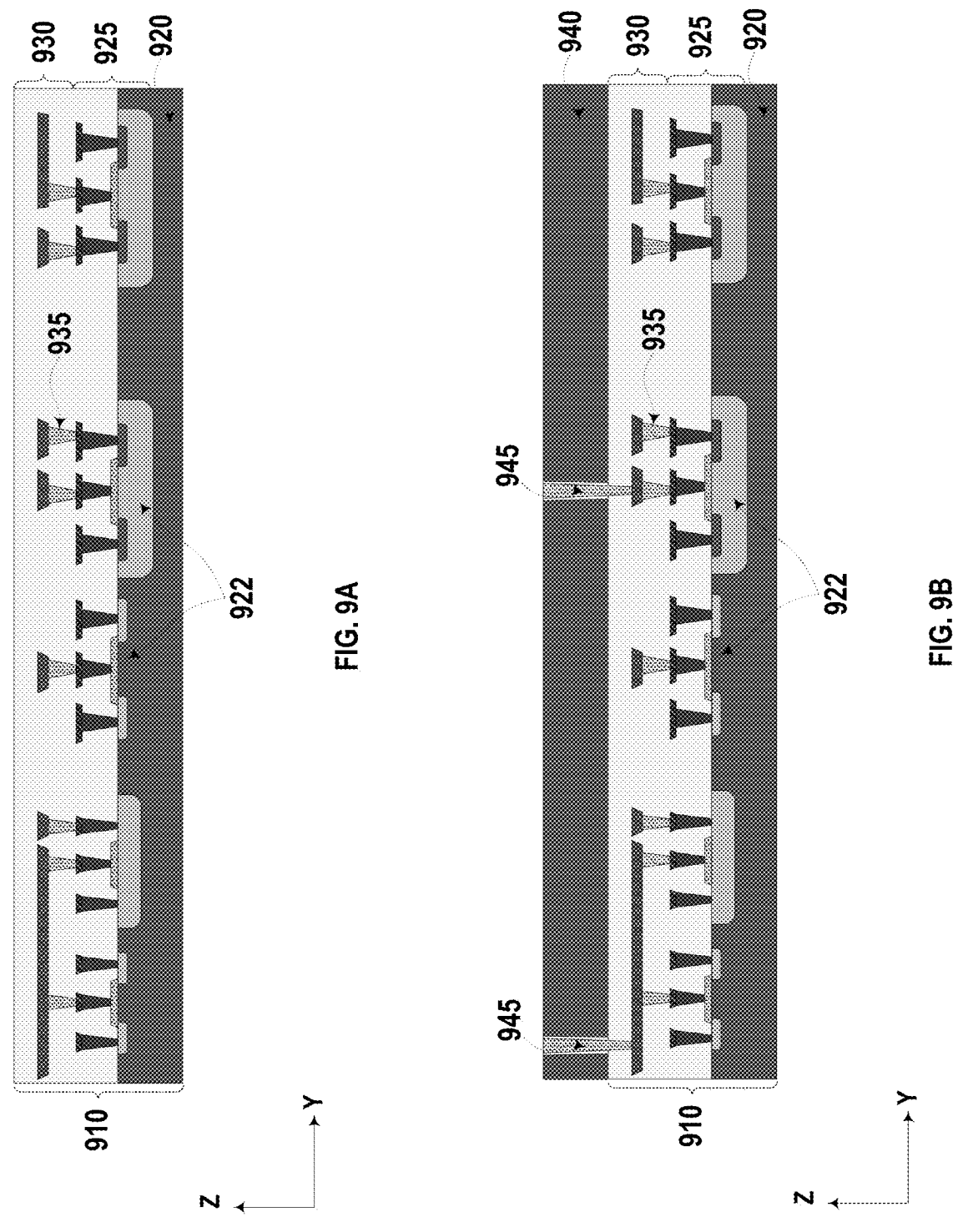

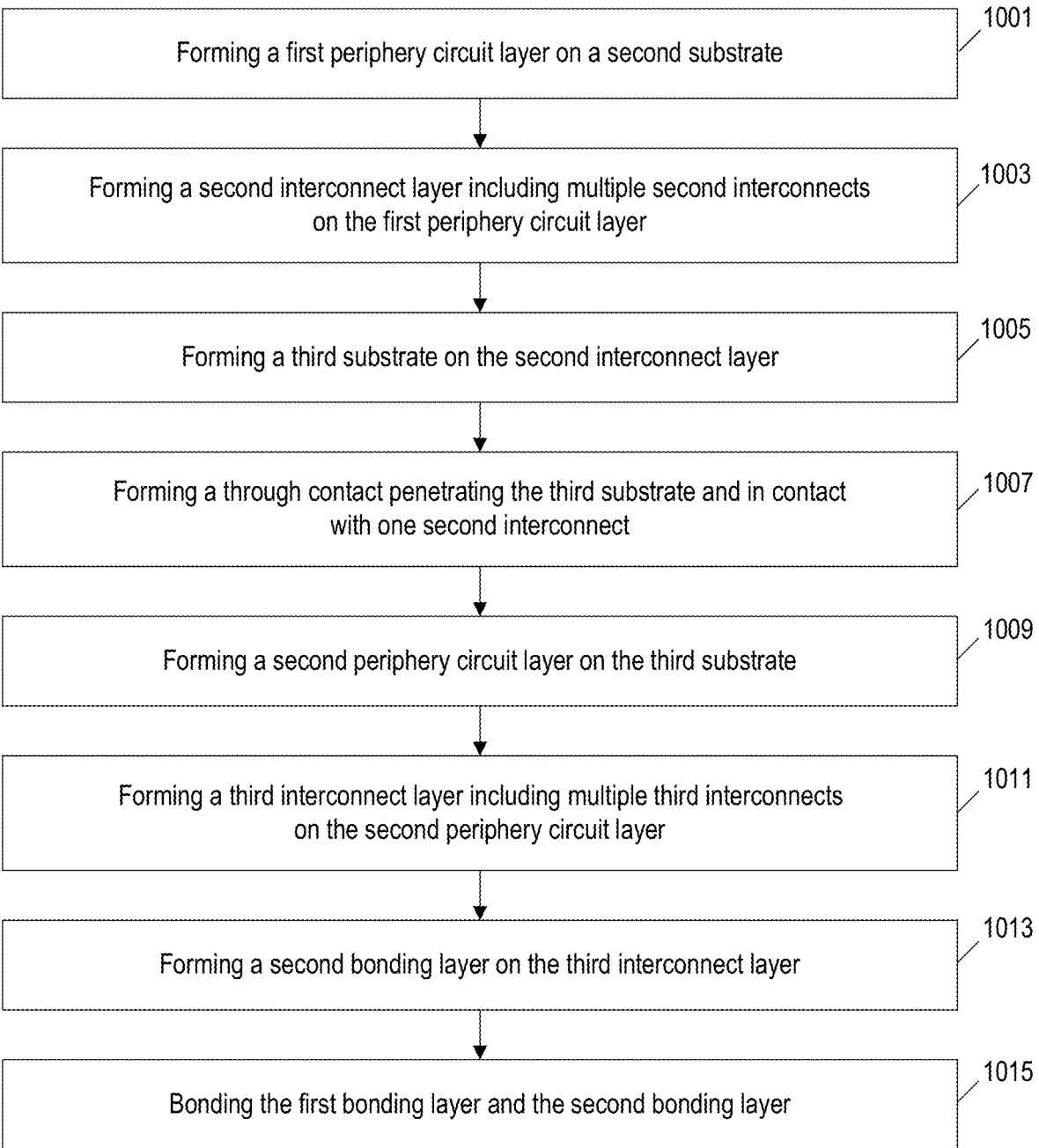

1000

Forming a first periphery circuit layer on a second substrate — 1001

Forming a second interconnect layer including multiple second interconnects on the first periphery circuit layer — 1003

Forming a third substrate on the second interconnect layer — 1005

Forming a through contact penetrating the third substrate and in contact with one second interconnect — 1007

Forming a second periphery circuit layer on the third substrate — 1009

Forming a third interconnect layer including multiple third interconnects on the second periphery circuit layer — 1011

Forming a second bonding layer on the third interconnect layer — 1013

Bonding the first bonding layer and the second bonding layer — 1015

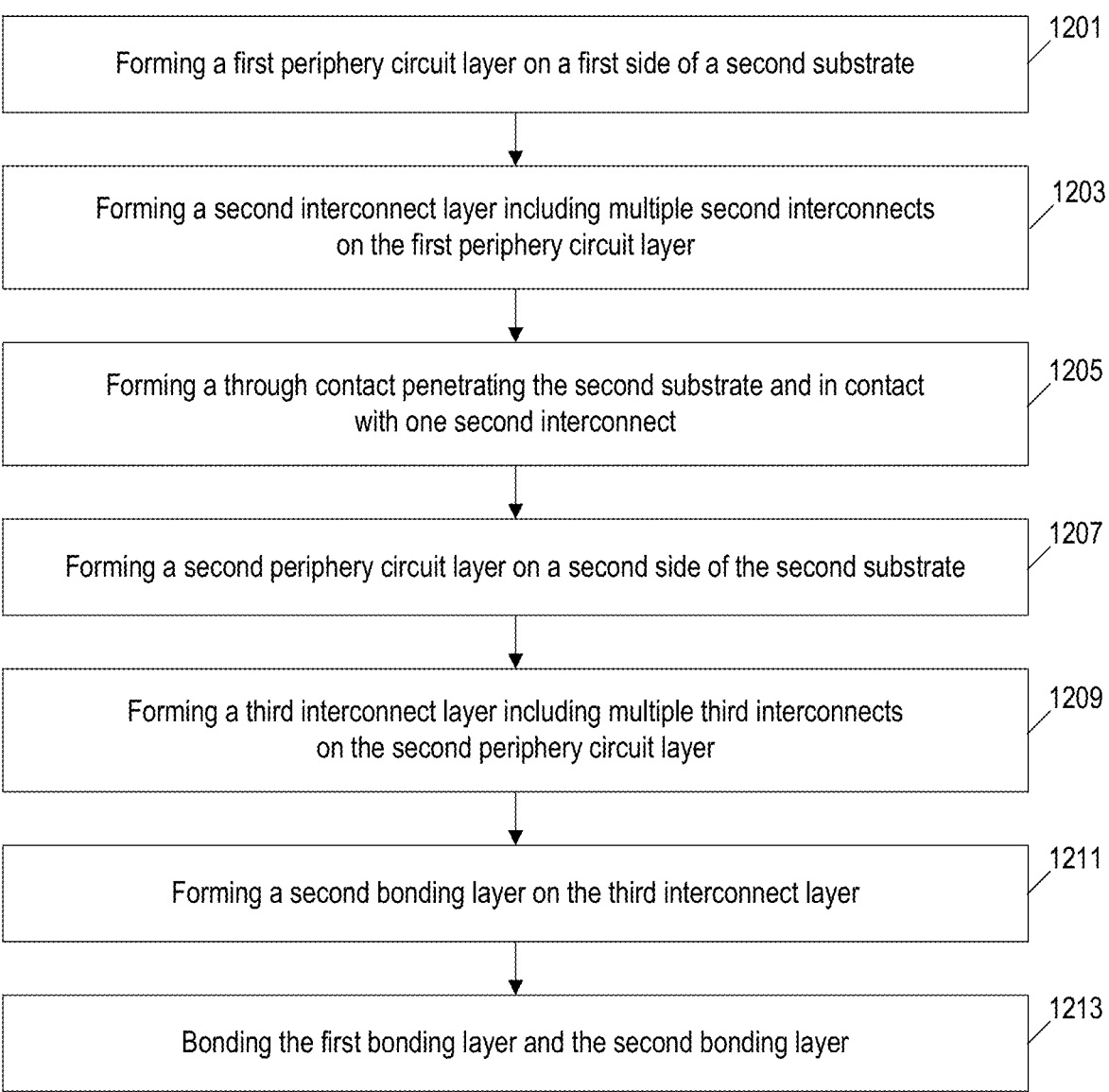

Forming a first periphery circuit layer on a first side of a second substrate — 1201

Forming a second interconnect layer including multiple second interconnects on the first periphery circuit layer — 1203

Forming a through contact penetrating the second substrate and in contact with one second interconnect — 1205

Forming a second periphery circuit layer on a second side of the second substrate — 1207

Forming a third interconnect layer including multiple third interconnects on the second periphery circuit layer — 1209

Forming a second bonding layer on the third interconnect layer — 1211

Bonding the first bonding layer and the second bonding layer — 1213

FIG. 12

THREE-DIMENSIONAL MEMORY DEVICES AND FABRICATING METHODS THEREOF

CROSS-REFERENCE TO RELATED APPLICATIONS

This application is a continuation of International Application No. PCT/CN2023/083667, filed on Mar. 24, 2023, which claims the benefit of priorities to Chinese Application No. 202210714042.6, filed on Jun. 22, 2022, and U.S. Provisional Application No. 63/433,131, filed on Dec. 16, 2022, all of which are hereby incorporated by reference in their entireties.

TECHNICAL FIELD

The present disclosure generally relates to the field of semiconductor technology, and more particularly, to a three-dimensional (3D) memory device and a fabricating method thereof.

BACKGROUND

With continuous rising and development of artificial intelligence (AI), big data, Internet of Things, mobile devices and communications, and cloud storage, etc., the demand for memory capacity is growing in an exponential way.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, the present disclosure provides a method for forming a three-dimensional (3D) memory device, comprising forming a first semiconductor structure, comprising: forming an array of first-type through stack structures in a first region and an array of second-type through stack structures in a second region, and forming a slit structure to separate the array of first-type through stack structures from the array of second-type through stack structures; forming a second semiconductor structure, comprising: forming a first periphery circuit and a second periphery circuit at different levels; and bonding the second semiconductor structure to the first semiconductor structure.

In some implementations, forming the first semiconductor structure further comprises forming a semiconductor layer including a first portion on the array of first-type through stack structures and a second portion on the array of second-type through stack structures, wherein the slit structure further separates the first portion of the semiconductor layer from the second portion of the semiconductor layer; and forming a plurality of vias each penetrating the semiconductor layer and in contact with a corresponding one of the first-type through stack structures or a corresponding one of the second-type through stack structures.

In some implementations, forming the first semiconductor structure further comprises forming a dielectric stack including a plurality of interleaved dielectric layers and sacrificial layers stacked on a first substrate; forming a slit vertically penetrating the dielectric stack and laterally separating the array of first-type through stack structures from the array of second-type through stack structures; and replacing the plurality of sacrificial layers with a plurality of conductive layers to transform the dielectric stack into a memory stack; wherein the slit structure is formed to fill the slit.

In some implementations, forming the first type and second-type through stack structures comprises forming a plurality of through stack holes each penetrating the dielectric stack; filing a first subset of through stack holes in the first region with a sacrificial material; forming the second-type through stack structures in a second subset of through stack holes in the second region; removing the sacrificial material in the first subset of through stack holes; and forming the first-type through stack structures in the first subset of through stack holes.

In some implementations, forming the first-type through stack structures comprises forming a FeFET through stack structure; and forming the second-type through stack structures comprises forming a NAND channel structure FeFET through stack structure.

In some implementations, forming the FeFET through stack structure comprises forming a ferroelectric layer on a sidewall of each of the first subset of through stack holes; forming a conductive layer to cover the ferroelectric layer; and forming a dielectric filling structure on the ferroelectric layer to fill the first subset of through stack holes.

In some implementations, forming the first-type through stack structures comprises forming a FeRAM through stack structure; and forming the second-type through stack structures comprises forming a NAND channel structure.

In some implementations, forming the FeRAM through stack structure comprises forming a ferroelectric layer on a sidewall of each of the first subset of through stack holes; and forming a conductive filling structure on the ferroelectric layer to fill the first subset of through stack holes.

In some implementations, forming the vias comprises forming a plurality of through holes each penetrating the semiconductor layer and exposing a corresponding first type or second-type through stack structure; filling the through holes with a dielectric material; and forming the vias each in a corresponding through hole and surrounded by the dielectric material.

In some implementations, the method further comprises forming a plurality of cut structures each laterally extending between the vias and vertically separating portions of the semiconductor layer.

In some implementations, the method further comprises forming a first interconnect layer comprising a plurality of first interconnects in contact with the vias; and forming a first bonding layer comprising a plurality of first bonding contacts in contact with the first interconnects.

In some implementations, forming the second semiconductor structure, comprising forming the first periphery circuit at a first side of a second substrate; and forming the second periphery circuit on a second semiconductor layer on the first periphery circuit, or at a second side of the second substrate.

In some implementations, forming the first periphery circuit comprises forming a main control circuit configured to control the array of first-type through stack structures and the array of second-type through stack structures; forming a second array periphery circuit configured to operating of the array of second-type through stack structures; forming a first portion of a first array periphery circuit having a first operating voltage range; and forming a second portion of the first array periphery circuit having a second operating voltage range higher than the first operating voltage range.

In some implementations, forming the second periphery circuit comprises forming a third portion of the first array periphery circuit having a third operating voltage range higher than the second operating voltage range; and forming a fourth portion of the first array periphery circuit having a fourth operating voltage range higher than the third operating voltage range.

In some implementations, forming the second semiconductor structure comprises forming a second interconnect layer comprising a plurality of second interconnects in contact with a plurality of transistors of the periphery circuit, and forming a second bonding layer comprising a plurality of second bonding contacts in contact with the second interconnects; and bonding the second semiconductor structure to the first semiconductor structure comprises hybrid bonding the first bonding layer to the second bonding layer, such that each first bonding contact is joined with one corresponding second bonding contact.

Another aspect of the present disclosure provides a three-dimensional (3D) memory device, comprising a first semiconductor structure, comprising: an array of first-type through stack structures in a first region and an array of second-type through stack structures in a second region, and a slit structure separating the array of first-type through stack structures from the array of second-type through stack structures; a second semiconductor structure comprising, a first periphery circuit and a second periphery circuit at different levels; wherein the second semiconductor structure and the first semiconductor structure are bonded together, such that the first periphery circuit is located between the second periphery circuit and the first semiconductor structure.

In some implementations, the memory device further comprises a semiconductor layer including a first portion on the array of first-type through stack structures and a second portion on the array of second-type through stack structures that are separated by the slit structure; and a plurality of vias each penetrating the semiconductor layer and in contact with a corresponding one of the first-type through stack structures or the array of second-type through stack structures.

In some implementations, the first-type through stack structures are FeFET through stack structures; and the second-type through stack structures are NAND channel structures.

In some implementations, each FeFET through stack structure comprises a ferroelectric layer; a conductive layer laterally surrounded by the ferroelectric layer; and a dielectric filling structure laterally surrounded by the conductive layer.

In some implementations, the first-type through stack structures are FeRAM through stack structures; and the second-type through stack structures are NAND channel structures.

In some implementations, each FeRAM through stack structure comprises a ferroelectric layer; and a conductive filling structure laterally surrounded by the ferroelectric layer.

In some implementations, the first semiconductor structure further comprises a dielectric layer on the semiconductor layer, wherein the vias each penetrating the dielectric layer and isolated from the semiconductor layer by a dielectric material.

In some implementations, the first semiconductor structure further comprises a plurality of cut structures each laterally extending between the vias and vertically separating portions of the semiconductor layer.

In some implementations, the first semiconductor structure further comprises a first interconnect layer comprising a plurality of first interconnects in contact with the vias; and a first bonding layer comprising a plurality of first bonding contacts in contact with the first interconnects.

In some implementations, the first periphery circuit is located on a second substrate; and the second periphery circuit is located on a second semiconductor layer on the first periphery circuit.

In some implementations, the first periphery circuit and the second periphery circuit are located at opposite sides of a second substrate.

In some implementations, the first periphery circuit comprises a main control circuit configured to control the array of first-type through stack structures in a first region and the array of second-type through stack structures; a second array periphery circuit configured to operating of the array of second-type through stack structures; a first portion of a first array periphery circuit having a first operating voltage range; and a second portion of the first array periphery circuit having a second operating voltage range higher than the first operating voltage range.

In some implementations, the second periphery circuit comprises a third portion of the first array periphery circuit having a third operating voltage range higher than the second operating voltage range; and a fourth portion of the first array periphery circuit having a fourth operating voltage range higher than the third operating voltage range.

In some implementations, the second semiconductor structure further comprises a second interconnect layer comprising a plurality of second interconnects in contact with a plurality of transistors of the periphery circuit, and a second bonding layer comprising a plurality of second bonding contacts in contact with the second interconnects.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIGS. 8A and 8B illustrate flowcharts of a method for forming an exemplary 3D memory device, according to some aspects of the present disclosure.

FIGS. 9A-9D illustrate a fabrication process for forming an exemplary 3D memory device according to some aspects of the present disclosure.

FIG. 10 illustrates a flowchart of a method for forming an exemplary 3D memory device, according to some aspects of the present disclosure.

FIG. 12 illustrates a flowchart of a method for forming an exemplary 3D memory device, according to some aspects of the present disclosure.

Figure 1:
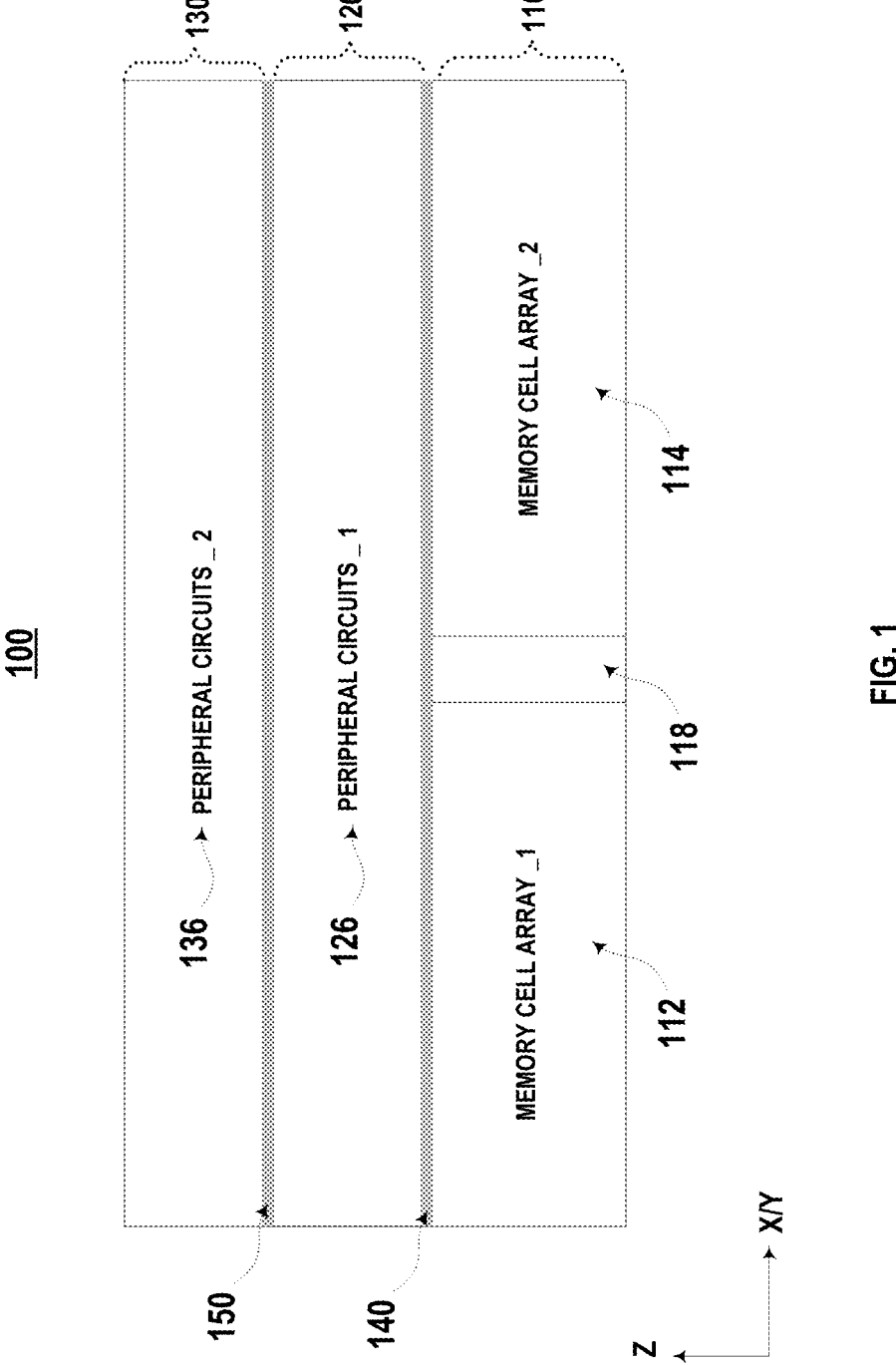
FIG. 1 illustrates a schematic diagram of a cross-sectional view of an exemplary 3D memory device, according to various aspects of the present disclosure.

The present disclosure will be described with reference to the accompanying drawings.

DETAILED DESCRIPTION

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

The term "dynamic random-access memory" or "DRAM" as used herein indicates a volatile memory that uses charge stored on a capacitor to represent information. DRAM stores each bit in a memory cell that includes a transistor and a capacitor (e.g., 1T1C). The 1T1C design can be based on metal-oxide-semiconductor (MOS) technology. Charge levels greater than a certain threshold can represent a first logic level (e.g., 1 state), and charge levels less than another threshold amount can represent a second logic level (e.g., 0 state). Leakage currents and various parasitic effects limit the length of time a capacitor can hold charge.

The term "NAND" as used herein indicates memory designs or architectures that resemble NAND logic gates (e.g., an inverted AND gate) and connect to memory cells in series (e.g., memory strings). In NAND flash, the relationship between a bit line and a word line resembles a NAND logic gate and can be used for fast writes and high-density arrays. NAND flash can access data sequentially since the transistors in the array are connected in series (e.g., memory strings). NAND flash can be read, programmed (written), and erased in blocks or pages. NAND flash can have a smaller cell size than DRAM but can require additional circuitry to implement.

The term "surrounding gate transistor" or "SGT" as used herein indicates a memory device that has a gate surrounding a channel region of a transistor on all sides.

The term "dynamic flash memory" or "DFM" as used herein indicates a volatile memory that uses a dual-gate SGT or a multi-gate SGT. The dual gates of the dual-gate SGT can include a word line (WL) gate and a plate line (PL) gate. The plurality of gates of the multi-gate SGT can include a word line (WL) gate and multiple plate line (PL) gates. DFM can be capacitor-free and can store charge on a channel region of a transistor. DFM can still require a refresh cycle but can offer longer retention times, faster operation speeds, and higher density than compared to DRAM or other types of volatile memory. Further, similar to flash, DFM can offer block refresh and block erase operations.

The term "bit line" or "BL" as used herein indicates an array connection to address a particular memory cell in a memory array. A bit line can be connected to a drain of a transistor. A bit line can be connected to two or more serially connected memory cells (e.g., memory strings). Different voltage combinations applied to the bit line can define read, program (write), and erase operations in the memory cell.

The term "source line" or "SL" as used herein indicates an array connection to address a particular memory cell in a memory array. A source line can be connected to a source of a transistor. A source line can be connected to two or more serially connected memory cells (e.g., memory strings). Different voltage combinations applied to the source line can define read, program (write), and erase operations in the memory cell.

The term "word line" or "WL" as used herein indicates an array connection to provide a voltage to a particular memory cell in a memory array to select which row of bits is to be read, programmed, or erased. A word line can act as a top select gate (TSG). A word line can be connected to a portion of a channel or a portion of a body of a transistor (e.g., DFM device). Different voltage combinations applied to the word line can define read, program (write), and erase operations in the memory cell. When the word line is activated, current flows only if charge is already on the memory cell. If there is charge on the channel or body of the memory cell, the read operation recharges the memory cell and is non-destructive. If there is no charge on the channel or body of the memory cell, no current flows, and the read is also non-destructive.

The term "plate line" or "PL" as used herein indicates an array connection to provide a voltage to a particular memory cell in a memory array to read, program, or erase charge on the memory cell. A plate line can be connected to a portion of a channel or a portion of a body of a transistor (e.g., DFM device). Different voltage combinations applied to the plate line can define read, program (write), and erase operations in the memory cell. When the plate line is activated, charge flows from the source line (source) to the bit line (drain). When the plate line is deactivated, any remaining charge is stored in the channel or body of the memory cell.

The term "dummy line" or "DMY" as used herein indicates an array connection, separate from a word line, to provide an additional voltage to a particular memory cell in a memory array to increase operating efficiency. A dummy line can be used for impact ionization programming to rapidly increase charge (e.g., holes) conduction generated at a word line contact to flow and increase charge (e.g., holes) in a channel of a memory cell. A dummy line can increase a program (write) rate of a memory cell.

The term "top select gate line" or "TSG" as used herein indicates an array connection to provide a voltage to a particular memory cell in a memory array to select which row of bits is to be read, programmed, or erased. The top select gate line can be used for gate-induced drain leakage (GIDL) programming to create a charge (e.g., hole) barrier to provide selective programming (writing) in a channel of a memory cell. A top select gate line can provide selective programming (writing) and increase a program (write) rate. A top select gate line can provide charge separation between a plate line and a bit line and thereby increasing charge retention times and decreasing refresh rates in a memory cell. A top select gate line can provide charge separation between a plate line and a bit line and thereby decrease junction leakage. A top select gate line can increase a depletion area of a memory cell.

The term "bottom select gate line" or "BSG" as used herein indicates an array connection to provide a voltage to a particular memory cell in a memory array to select which row of bits is to be read, programmed, or erased. The bottom select gate line can be used for gate-induced source leakage (GISL) programming to create a charge (e.g., hole) barrier to provide selective programming (writing) in a channel of a memory cell. A bottom select gate line can provide selective programming (writing) and increase a program (write) rate. A bottom select gate line can provide charge separation between a plate line and a source line and thereby increasing charge retention times and decreasing refresh rates in a memory cell. A bottom select gate line can provide charge separation between a plate line and a source line and thereby decrease junction leakage. A bottom select gate line can increase a depletion area of a memory cell.

The term "substrate" as used herein indicates a planar wafer on which subsequent layers can be deposited, formed, or grown. A substrate can be formed of a single element (e.g., Si) or a compound material (e.g., GaAs), and may be doped or undoped. For example, a substrate can include silicon (Si), germanium (Ge), silicon-germanium (SiGe), gallium arsenide (GaAs), gallium nitride (GaN), gallium phosphide (GaP+), gallium antimonide (GaSb), indium phosphide (InP+), indium antimonide (InSb), a Group IV semiconductor, a Group III-V semiconductor, a Group II-VI semiconductor, graphene, sapphire, and/or any other semiconductor material. A substrate can be a monocrystalline material (e.g., monocrystalline Si).

The term "Group III-V semiconductor" as used herein indicates comprising one or more materials from Group III of the periodic table (e.g., group 13 elements: boron (B), aluminum (Al), gallium (Ga), indium (In), thallium (Tl)) with one or more materials from Group V of the periodic table (e.g., group 15 elements: nitrogen (N), phosphorus (P+), arsenic (As), antimony (Sb), bismuth (Bi)). The compounds have a 1:1 combination of Group III and Group V regardless of the number of elements from each group. Subscripts in chemical symbols of compounds refer to the proportion of that element within that group. For example, $Al_{0.25}GaAs$ means the Group III part comprises 25% Al, and thus 75% Ga, while the Group V part comprises 100% As.

The term "Group IV semiconductor" as used herein indicates comprising two or more materials from Group IV of the periodic table (e.g., group 14 elements: carbon (C), silicon (Si), germanium (Ge), tin (Sn), lead (Pb)). Subscripts in chemical symbols of compounds refer to the proportion of that element. For example, $Si_{0.25}Ge_{0.75}$ means the Group IV part comprises 25% Si, and thus 75% Ge.

The term "Group II-VI semiconductor" as used herein indicates comprising one or more materials from Group II of the periodic table (e.g., group 12 elements: zinc (Zn), cadmium (Cd), mercury (Hg)) with one or more materials from Group VII of the periodic table (e.g., group 16 elements: oxygen (O), sulfur (S), selenium (Se), tellurium (Te)). The compounds have a 1:1 combination of Group II and Group VI regardless of the number of elements from each group. Subscripts in chemical symbols of compounds refer to the proportion of that element within that group.

The term "doping" or "doped" as used herein indicates that a layer or material contains a small impurity concentration of another element (dopant), which donates (donor) or extracts (acceptor) charge carriers from the parent material and therefore alters the conductivity. Charge carriers may be electrons or holes. A doped material with extra electrons is called n-type while a doped material with extra holes (fewer electrons) is called p-type.

The term "crystalline" as used herein indicates a material or layer with a single crystal orientation. In epitaxial growth or deposition, subsequent layers with the same or similar lattice constant follow the registry of the previous crystalline layer and therefore grow with the same crystal orientation or crystallinity.

The term "monocrystalline" as used herein indicates a material or layer having a continuous crystal lattice throughout the material or layer. Monocrystalline can indicate a single crystal or monocrystal (e.g., Si, Ge, GaAs, etc.).

The term "monolithic" as used herein indicates a layer, element, or substrate comprising bulk (e.g., single) material throughout. A monolithic element (e.g., a semiconductor body) can be formed from a single bulk material (e.g., Si).

The term "deposit" or "deposition" as used herein indicates the depositing or growth of a layer on another layer or substrate. Deposition can encompass vacuum deposition, thermal evaporation, arc vaporization, ion beam deposition, e-beam deposition, sputtering, laser ablation, pulsed laser deposition (PLD), physical vapor deposition (PVD), atomic layer deposition (ALD), chemical vapor deposition (CVD), plasma-enhanced CVD (PECVD), low pressure CVD (LPCVD), metal-organic chemical vapor deposition (MOCVD), liquid source misted chemical deposition, spin-coating, epitaxy, vapor-phase epitaxy (VPE), liquid-phase epitaxy (LPE), solid-phase epitaxy (SPE), MBE, atomic layer epitaxy (ALE), molecular-beam epitaxy (MBE), powder bed deposition, and/or other known techniques to deposit material in a layer.

The term "dielectric" as used herein indicates an electrically insulating layer. Dielectric can encompass oxide, nitride, oxynitride, ceramic, glass, spin-on-glass (SOG), polymer, plastic, thermoplastic, resin, laminate, high-k dielectric, and/or any other electrically insulating material.

The term "high-k dielectric" as used herein indicates a material with a high dielectric constant k or κ (kappa), for example, relative to the dielectric constant of silicon dioxide ($SiO_2$). High-k dielectrics can be used as a gate dielectric or another dielectric layer in an electronic device.

The term "high-k metal gate" or "high-k dielectric and conductive gate" or "HKMG" as used herein indicates a process of forming a high-k dielectric layer and a conductive (metal) layer stack in a memory device. HKMG technology can reduce gate leakage, increase transistor capacitance, and provide low power consumption for devices. Two process flows to pattern the HKMG stack are gate-first and gate-last.

The term "epitaxy" or "epitaxial" or "epitaxially" as used herein indicates crystalline growth of material, for example, via high temperature deposition.

The term "selective epitaxial growth" or "SEG" as used herein indicates local growth of an epitaxial layer through a pattern mask on a substrate or a layer. SEG provides epitaxial growth only on the exposed substrate or layer, and other regions are masked by a dielectric film or other material that is not reactive to epitaxy.

The term "dielectric stack" as used herein indicates a stack of different alternating dielectric layers in succession. For example, the first dielectric layer can be an oxide (e.g., silicon oxide), and the second dielectric layer can be a nitride (e.g., silicon nitride). The dielectric stack can be arranged in a staircase pattern.

The term "gate line trench" as used herein indicates a trench or hole extending through a dielectric stack of a memory device. The gate line trench can be used to form a gate line slit in the memory device.

The term "gate line slit" or "GLS" as used herein indicates a conductive pathway through a dielectric stack, for example, between adjacent memory blocks or adjacent memory cells. The GLS can provide a connection to an HKMG stack in a memory device. The GLS can extend vertically through the dielectric stack and extend horizontally between two adjacent arrays of memory blocks or memory cells.

Aspects of the disclosure may be implemented in hardware, firmware, software, or any combination thereof. Aspects of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; dynamic flash memory (DFM) devices, electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

In a 3D NAND flash memory, memory cells can be programmed for data storage based on charge-trapping technology. The storage information of a memory cell depends on the amount of charge trapped in a storage layer. Although 3D NAND memory can be high-density and cost-effective, it suffers from low write speed and high power consumption at system level due to the required periphery (e.g., charge pumps). Further, with the increasing number of 3D flash memory layers, the area of the NAND array is reduced by the reduction of the plane direction of the memory array. But the area reduction of the logical side has a mismatch with the NAND array side. Therefore, a need exists to resolve these issues while keeping the advantages of the 3D NAND technology.

On another side, a dynamic random access memory (DRAM) is a type of random access semiconductor memory that can store each bit of data in a memory cell. Certain types of memory cells include a capacitor and an array transistor. The capacitor can be set to either a charged or discharged state, representing the bit value of zero and one, respectively. Under the traditional von Neumann computing architecture, smaller the capacity of DRAM is, faster the read and write speed of DRAM is. There is a huge storage barrier between DRAM and NAND, and it is important to find a new memory device with a large storage capacity and fast read and write speed.

Ferroelectric Random Access Memory (FeRAM) is a high performance and low-power non-volatile memory that can combine the benefits of conventional non-volatile memories (e.g., Flash and EEPROM) and high-speed RAM (e.g., SRAM and DRAM). FeRAM can outperform existing memories like EEPROM and Flash with less power consumption, faster response, and greater endurance to multiple read-and-write operations. There are two types of FeRAMs: capacitor type, and field-effect transistor (FET) type. A capacitor-type FeRAM cell includes at least one ferroelectric capacitor and at least one MOSFET used for cell selection, also referred to as an nTnC FeRAM memory cell.

A FET-type FeRAM cell is capacitor-free and only includes a single ferroelectric-gate FET (FeFET). FET-type FeRAM can be integrated into high-density, because FeFET can be scaled down using the proportionality rule.

Ferroelectricity is a property observed in non-centrosymmetric dielectric crystals that show a spontaneous electric polarization, where the direction of polarization can be changed by an externally applied electric field. In a ferroelectric material, some atoms in the unit cell are misplaced to create a permanent electric dipole due to the distribution of electric charge. A macroscopic manifestation of the charge separation is the surface charge of the ferroelectric material, described by an electric polarization P. Typical ferroelectric materials, such as Lead Zirconate Titanate (PZT), Strontium Bismuth Tantalate ($SrBi_2Ta_2O_9$ or SBT), Barium Titanate ($BaTiO_3$), and $PbTiO_3$, have a perovskite-type crystal structure, where the cation in the center of the unit cell has two positions, both being stable low-energy states. The two low-energy states correspond to two opposite directions of the electric dipole. Under an external electric field, the cation can move in the direction of the electric field. Thus, by applying an external electric field across the crystal, cation in the unit cell can be moved from one low-energy position to another low-energy position, and the direction of the electric dipole can be flipped if the applied electric field is high enough. As a result, the electric polarization P in the ferroelectric material can be aligned with the direction of the external electric field.

Existing ferroelectric memory chips are generally two-dimensional architectures that are difficult to scale down. The signal margin of a FeRAM decreases with reduced cell area because it is challenging to increase the intrinsic polarization of ferroelectric material. That is, the memory array and the logic circuit are on the same plane, and the chip area will increase sharply as the memory capacity increases. That is, the storage density of FeRAM is not high enough compared to 3D NAND memory. Ferroelectric memory can learn from the 3D NAND architecture to achieve high-density storage, make full use of the advantage of capacitor height reduction, and realize a multi-capacitor stacking structure.

Various implementations in accordance with the present disclosure provide structures and fabricating methods for an integrated 3D memory device including both 3D ferroelectric memory cell array and 3D NAND memory cell array. The 3D ferroelectric memory cell array can be either capacitor type (e.g., 1TnC structure) or FET-type (e.g., capacitor-free multi-gate vertical 1T structure). By integrating the 3D ferroelectric memory cell array and the 3D NAND memory cell array on a same chip, larger storage capacity can be achieved while high operating speed requirements are also met.

Further, the present disclosure also introduces various solutions in which the peripheral circuits, the 3D ferroelectric memory cell array, and the 3D NAND memory cell array of the integrated 3D memory device are disposed in different planes (levels, tiers) in the vertical direction, i.e., stacked over one another, to reduce the planar chip size of the peripheral circuits, as well as the total chip size of the memory device. In some implementations, the ferroelectric memory cell array, the NAND memory cell array, and the memory peripheral circuits provided with a relatively high voltage (e.g., above 5 V), and the memory peripheral circuits provided with a relatively low voltage (e.g., below 1.3 V) are disposed in different planes in the vertical direction, i.e., stacked over one another, to further reduce the chip size. The integrated 3D memory device architectures and fabrication processes disclosed in the present disclosure can be easily scaled up vertically to stack more peripheral circuits in different planes to further reduce the chip size.

The peripheral circuits can be separated into different planes in the vertical direction based on different functions or different performance requirements, for example, the control functions applied to the ferroelectric memory cell array and/or the NAND memory cell array, the voltages applied to the transistors thereof, which affect the dimensions of the transistors (e.g., gate dielectric thickness), dimensions of the substrates in which the transistors are formed (e.g., substrate thickness), and thermal budgets (e.g., the interconnect material). Thus, peripheral circuits with different dimension requirements (e.g., gate dielectric thickness and substrate thickness) and thermal budgets can be fabricated in different processes to reduce the design and process constraints from each other, thereby improving the device performance and fabrication complexity.

According to some aspects of the present disclosure, the ferroelectric memory cell array, the NAND memory cell array, and various peripheral circuits with different performance and dimension requirements can be fabricated in parallel on different substrates and then stacked over one another using various joining technologies, such as hybrid bonding, transfer bonding, etc. As a result, the fabrication cycle of the integrated 3D memory device can be further reduced. Moreover, since the thermal budgets of the different devices become independent of each other, interconnect materials with a desirable electric performance, but a low thermal budget, such as copper, can be used in interconnecting the memory cells and transistors of the peripheral circuits, thereby further improving the device performance. Bonding technologies can introduce additional benefits as well. In some implementations, hybrid bonding in a face-to-face manner achieves millions of parallel short interconnects between the bonded semiconductor structures to increase the throughput and input/output (I/O) speed of the integrated 3D memory devices. In some implementations, transfer bonding re-uses a single wafer to transfer thin semiconductor layers thereof onto different memory devices for forming transistors thereon, which can reduce the cost of the integrated 3D memory devices.

FIG. 1 illustrates a schematic view of a cross-section of a 3D memory device 100, according to some aspects of the present disclosure. 3D memory device 100 represents an example of a bonded chip. In some implementations, at least some of the components of 3D memory device 100 (e.g., memory cell arrays and peripheral circuits) are formed separately on different substrates in parallel and then jointed to form a bonded chip (a process referred to herein as a "parallel process"). In some implementations, at least one semiconductor layer is attached onto another semiconductor structure using transferring bonding, then some of the components of 3D memory device 100 (e.g., memory cell arrays and peripheral circuits) are formed on the attached semiconductor layer (a process referred to herein as a "series process"). It is understood that in some examples, the components of 3D memory device 100 (e.g., memory cell arrays and peripheral circuits) may be formed by a hybrid process that combines the parallel process and the series process.

It is noted that z- and x/y-axes are added in FIG. 1 to further illustrate the spatial relationships of the components of a semiconductor device. A substrate of a semiconductor device, e.g., 3D memory device 100, includes two lateral surfaces (e.g., a top surface and a bottom surface) extending laterally in the x/y-direction (the lateral direction). As used herein, x-direction represents a word line direction (WL direction), and y-direction represents a bit line direction (BL direction). As used herein, whether one component (e.g., a layer or a device) is "on," "above," or "below" another component (e.g., a layer or a device) of a semiconductor device is determined relative to the substrate of the semiconductor device in the z-direction (the vertical direction or thickness direction) when the substrate is positioned in the lowest plane of the semiconductor device in the z-direction. The same notion for describing the spatial relationships is applied throughout the present disclosure.

3D memory device 100 can include a first semiconductor structure 110 including a first array of memory cells (also referred to herein as a "first memory cell array 112"), and a second array of memory cells (also referred to herein as a "second memory cell array 114"). The first memory cell array 112 and the second memory cell array 114 can be separated by a spacer 118. In some implementations, the first memory cell array 112 can include an array of NAND Flash memory cells, and the second memory cell array 114 can include an array of ferroelectric memory cells. In some other implementations, the first memory cell array can include an array of ferroelectric memory cells, and the second memory cell array can include an array of NAND Flash memory cells. It is noted that, the ferroelectric memory cells can be either cells or FET-type ferroelectric memory cells.

In some implementations, the array of NAND memory cells is an array of 3D NAND memory strings, each of which extends vertically above a substrate in a 3D manner through a stack structure, e.g., a NAND memory stack. Depending on the 3D NAND technology (e.g., the number of layers/tiers in the memory stack), a 3D NAND memory string typically includes a certain number of NAND memory cells, each of which includes a floating-gate transistor or a charge-trap transistor.

In some implementations, the array of ferroelectric memory cells is an array of 3D ferroelectric memory strings, each of which extends vertically above the substrate in a 3D manner through a stack structure, e.g., a ferroelectric memory stack. Depending on the 3D ferroelectric memory technology (e.g., the number of layers/tiers in the memory stack), a 3D ferroelectric memory string typically includes a 1TnC FeRAM cell which includes a gate transistor and multiple ferroelectric capacitors in a capacitor type ferroelectric memory cell array, or a certain number of FeFET cells each including a ferroelectric FET in a FET-type ferroelectric memory cell array.

As shown in FIG. 1, 3D memory device 100 can further include a second semiconductor structure 120 and a third semiconductor structure 130 each including some of the peripheral circuits of the first memory cell array 112 and/or the second memory cell array 114 in first semiconductor structure 110. The peripheral circuits (a.k.a. control and sensing circuits) can include any suitable digital, analog, and/or mixed-signal circuits used for facilitating the operations of the memory cell array. For example, the peripheral circuits can include one or more of a page buffer, a decoder (e.g., a row decoder and a column decoder), a sense amplifier, a driver (e.g., a word line driver), an I/O circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits in second and third semiconductor structures 120 and 130 can use CMOS technology, e.g., which can be implemented with logic processes in any suitable technology nodes.

As shown in FIG. 1, first, second, and third semiconductor structures 110, 120, and 130 are stacked over one another in different planes, according to some implementations. As a result, the first memory cell array 112 and the second memory cell array 114 in the first semiconductor structure 110, the first peripheral circuit 126 in the second semiconductor structure 120, and the second peripheral circuit 136 in the third semiconductor structure 130 can be stacked over one another in different planes to reduce the planar size of 3D memory device 100, compared with memory devices in which all the peripheral circuits are disposed in a same plane.

As shown in FIG. 1, in some implementations, 3D memory device 100 further includes a first bonding interface 140 between first semiconductor structure 110 and second semiconductor structure 120, and a second bonding interface 150 between second semiconductor structure 120 and third semiconductor structure 130. Each of the first and second bonding interfaces 140 and 150 can be an interface between two semiconductor structures formed by any suitable bonding technologies as described below in detail, such as hybrid bonding, anodic bonding, fusion bonding, transfer bonding, adhesive bonding, eutectic bonding, to name a few. In some other implementations, first peripheral circuit 126 and second peripheral circuit 136 can be formed on opposite sizes of a single substrate. In such implementations, item 150 shown in FIG. 1 can be referred to as a substrate rather than a bonding interface.

As described below in detail, some or all of first, second, and third semiconductor structures 110, 120, and 130 can be fabricated separately (and in parallel in some implementations) by the parallel process, such that the thermal budget of fabricating one of first, second and third semiconductor structures 110, 120 and 130 does not limit the processes of fabricating another one of first, second and third semiconductor structures 110, 120 and 130. Moreover, a large number of interconnects (e.g., bonding contacts and/or interlayer vias (ILVs)/through substrate vias (TSVs)) can be formed across bonding interfaces 140 and/or 150 to make direct, short-distance (e.g., micron- or submicron-level) electrical connections between adjacent semiconductor structures 110, 120 and 130 as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer among the different memory cell arrays and the different peripheral circuits in different semiconductor structures 110, 120, and 130 can be performed through the interconnects (e.g., bonding contacts and/or ILVs/TSVs) across bonding interfaces 140 and/or 150. By vertically integrating first, second, and third semiconductor structures 110, 120 and 130, the chip size can be reduced, and the memory cell density can be increased.

Figure 2:
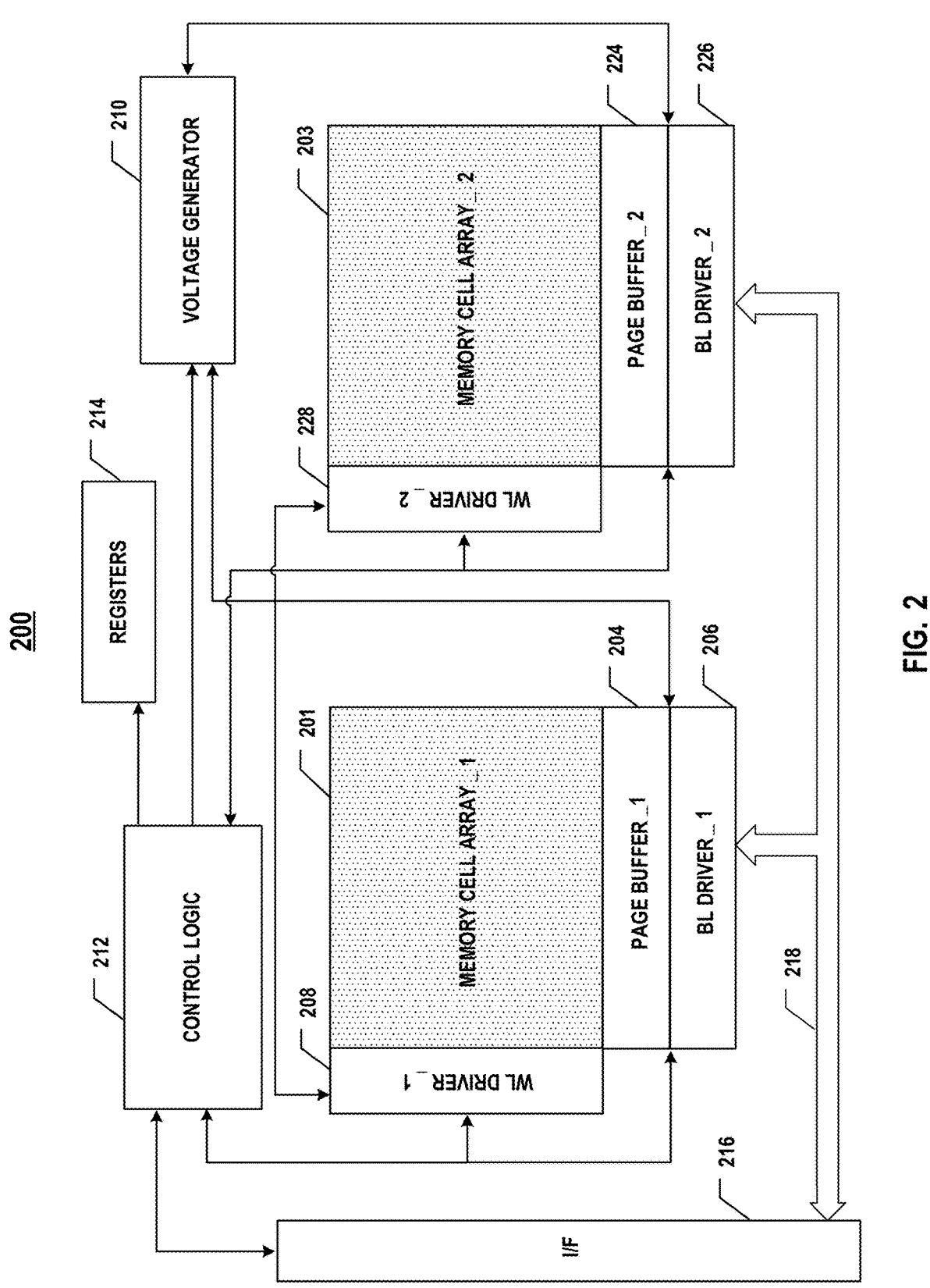
FIG. 2 illustrates a schematic circuit diagram of an exemplary 3D memory device, according to some aspects of the present disclosure.

Referring to FIG. 2, a schematic circuit diagram of an exemplary memory device 200 including periphery circuits is illustrated according to some aspects of the present disclosure. As described above, the periphery circuits can be coupled to at least two memory cell arrays (e.g., 3D NAND memory cell array and 3D ferroelectric memory cell array) and can include any suitable circuits for facilitating the operations of the at least two memory cell arrays by applying and sensing voltage signals and/or current signals to and from each target memory cell of the at least two memory cell arrays. The periphery circuits can include various types of periphery circuits formed using CMOS technologies. For example, FIG. 2 illustrates memory device 200 including a first memory cell array 201 and a second memory cell array 203, and various exemplary periphery circuits including a voltage generator 210, control logic 212, registers 214, an interface (I/F) 216, a data bus 218, a first page buffer 204 and a second page buffer 224, a first BL driver 206 and a second BL driver 226 (also referred as column decoders), a first WL driver 208 and a second WL driver 228 (also referred as row decoders). It is understood that in some examples, additional periphery circuits may be included as well.

First page buffer 204 and second page buffer 224 can be configured to buffer data read from or programmed to first memory cell array 201 and second memory cell array 203, respectively, according to the control signals of control logic 212. In one example, first page buffer 204 and/or second page buffer 224 may store one page of program data (write data) to be programmed into one page of first memory cell array 201 and/or second memory cell array 203. In another example, first page buffer 204 and/or second page buffer 224 also performs program verify operations to ensure that the data has been properly programmed into NAND and/or Ferroelectric memory cells of first memory cell array 201 and/or second memory cell array 203 coupled to selected word lines.

First WL driver 208 and second WL driver 228 can be configured to be controlled by control logic 212 and select block of first memory cell array 201 and/or second memory cell array 203 and a word line of the selected block. First WL driver 208 and second WL driver 228 can be further configured to drive first memory cell array 201 and/or second memory cell array 203, respectively. For example, first WL driver 208 and second WL driver 228 may drive NAND memory cells and/or DFM cells of first memory cell array 201 and/or second memory cell array 203 coupled to the selected word line using a word line voltage generated from voltage generator 210.

First BL driver 206 and second BL driver 226 can be configured to be controlled by control logic 212 and select one or more 3D NAND memory strings and/or one or more 3D DFM cells of first memory cell array 201 and/or second memory cell array 203 by applying bit line voltages generated from voltage generator 210. For example, first BL driver 206 and second BL driver 226 may apply column signals for selecting a set of N bits of data from page buffer 204 to be outputted in a read operation.

Control logic 212 can be coupled to each of the plurality of peripheral circuits and configured to control operations of the plurality of peripheral circuits. Registers 214 can be coupled to control logic 212 and include status registers, command registers, and address registers for storing status information, command operation codes (OP codes), and command addresses for controlling the operations of each of peripheral circuits.

Interface 216 can be coupled to control logic 212 and configured to interface first memory cell array 201 and second memory cell array 203 with one or more memory controllers (not shown). In some implementations, interface 216 acts as a control buffer to buffer and relay control commands received from the one or more memory controllers and/or a host (not shown) to control logic 212 and status information received from control logic 212 to the memory controller and/or the host. Interface 216 can also be coupled to first and second page buffers 204, 224, and first and second BL drivers 206, 226 via data bus 218 and act as an I/O interface and a data buffer to buffer and relay the program data received from the one or more memory controllers and/or the host to first and second page buffers 204, 224, and the read data from first and second page buffers 204, 224 to the one or more memory controllers and/or the host. In some implementations, interface 216 and data bus 218 are parts of an I/O circuit of the peripheral circuits.

Voltage generator 210 can be configured to be controlled by control logic 212 and generate the word line voltages (e.g., read voltage, program voltage, pass voltage, local voltage, and verification voltage) and the bit line voltages to be supplied to first memory cell array 201 and second memory cell array 203. In some implementations, voltage generator 210 is part of a voltage source that provides voltages at various levels of different peripheral circuits as described below in detail. Consistent with the scope of the present disclosure, in some implementations, the voltages provided by voltage generator 210, for example, to first WL driver 208 and second WL driver 228, first BL driver 206 and second BL driver 226, first page buffer 204 and second page buffer 224, are above certain levels that are sufficient to perform the memory operations. For example, the voltages provided to the page buffer circuits in first page buffer 204 and second page buffer 224, and/or the logic circuits in control logic 212 may be between 1.3 V and 5 V, such as 3.3 V, and the voltages provided to the driving circuits in first WL driver 208 and second WL driver 228, first BL driver 206 and second BL driver 226 may be between 5 V and 30 V.

Figure 3:
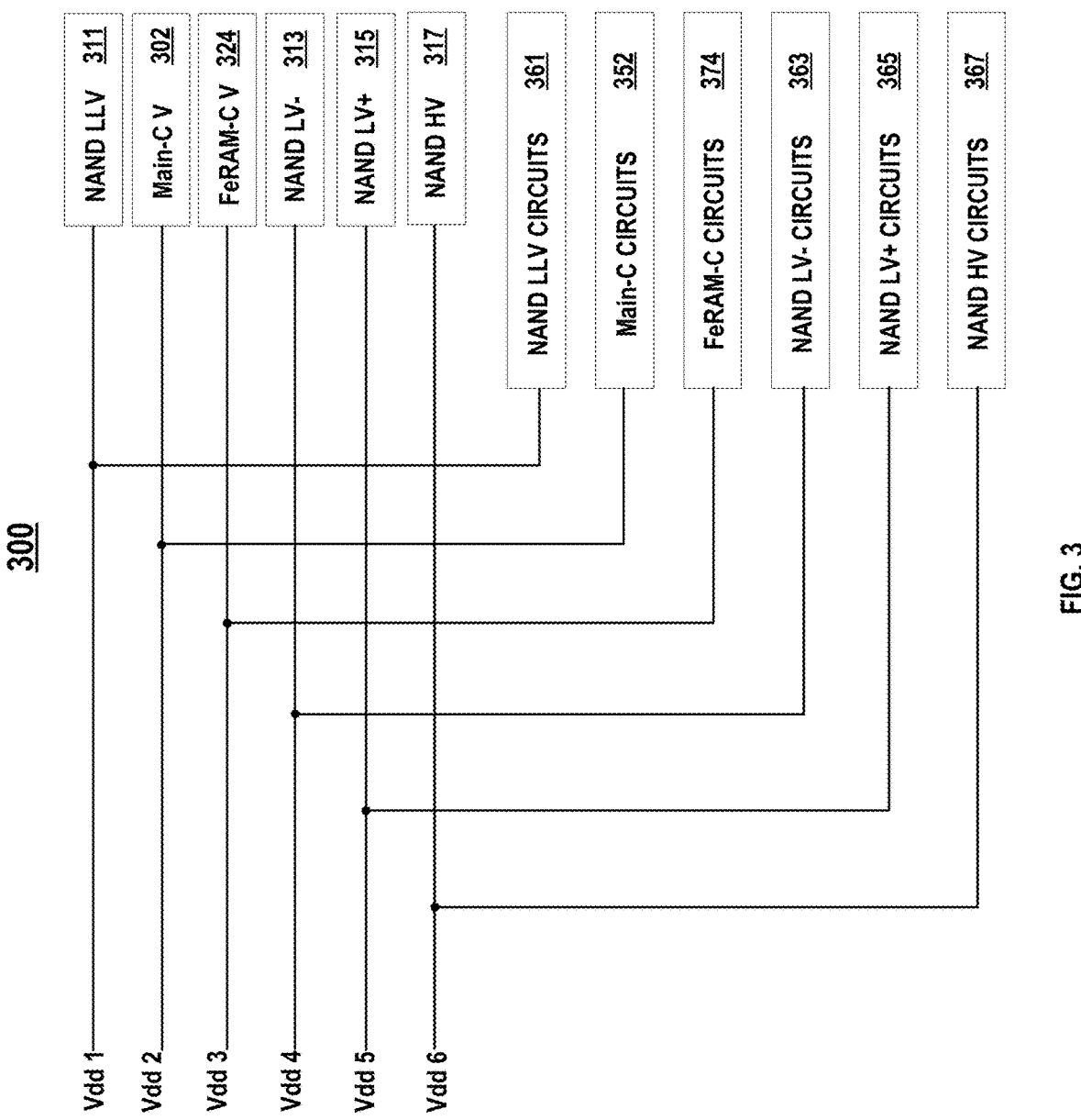
FIG. 3 illustrates a schematic circuit diagram of an exemplary 3D memory device, according to some aspects of the present disclosure.

Different from logic devices (e.g., microprocessors), memory devices, such as 3D NAND Flash memory and/or 3D ferroelectric memory, require a wide range of voltages to be supplied to different memory peripheral circuits. For example, FIG. 3 illustrates a block diagram 300 of peripheral circuits provided with various voltages, according to some aspects of the present disclosure. In some implementations, a memory device (e.g., memory device) includes a main control voltage (Main-C V) source 302, a NAND low low voltage (NAND LLV) source 311, a NAND low minus voltage (NAND LV−) source 313, a NAND low plus voltage (NAND LV+) source 315, a NAND high voltage (NAND HV) source 317, and a ferroelectric memory control voltage (FeRAM-C V) source 324, each of which is configured to provide a voltage at a respective level (Vdd1, Vdd2, Vdd3, Vdd4, Vdd5, and Vdd6). Each voltage source 302, 311, 313, 315, 317, or 324 can receive a voltage input at a suitable level from an external power source (e.g., a battery). Each voltage source 302, 311, 313, 315, 317, or 324 can also include voltage converters and/or voltage regulators to convert the external voltage input to the respective level (Vdd1, Vdd2, Vdd3, Vdd4, Vdd5, and Vdd6) and maintain and output the voltage at the respective level (Vdd1, Vdd2, Vdd3, Vdd4, Vdd5, and Vdd6) through a corresponding power rail. In some implementations, voltage generator 210 of memory device 200 is part of voltage sources 302, 311, 313, 315, 317, or 324.

In some implementations, Vdd6>Vdd5>Vdd4>Vdd1. For example, NAND LLV source 311 is configured to provide a voltage below about 2 V, such as between about 0.5 V and about 2 V. In some implementations, NAND LV− source 313 is configured to provide a voltage between about 5 V and about 6 V. In some implementations, NAND LV+ source 315 is configured to provide a voltage between about 6 V and about 10 V. In some implementations, NAND HV source 317 is configured to provide a voltage greater than about 20 V, such as between about 20 V and about 26 V. In some implementations, Main-C V source 302 is configured to provide a voltage range below between about 1 V and about 4 V. In some implementations, FeRAM-C V source 324 is configured to provide a voltage range below between about 3 V and about 5 V. It is understood that the voltage ranges described above with respect to NAND HV source 317, NAND LV+ source 315, NAND LV– source 313, NAND LLV source 311, Main-C V source 302, and FeRAM-C V source 324 are for illustrative purposes and non-limiting, and any other suitable voltage ranges may be provided by NAND HV source 317, NAND LV+ source 315, NAND LV– source 313, NAND LLV source 311, Main-C V source 302, and FeRAM-C V source 324.

Based on their suitable voltage levels (Vdd1, Vdd2, Vdd3, Vdd4, Vdd5, and Vdd6), the memory peripheral circuits can be categories into NAND LLV circuits 361, NAND LV– circuits 363, NAND LV+ circuits 365, NAND HV circuits 367, main control (Main-C) circuits 352, and ferroelectric memory control (FeRAM-C) circuits 374, which can be coupled to NAND HV source 317, NAND LV+ source 315, NAND LV– source 313, NAND LLV source 311, Main-C V source 302, and FeRAM-C V source 324, respectively. In some implementations, NAND HV circuits 367 includes one or more driving circuits that are coupled to the 3D NAND memory cell array through word lines, bit lines, SSG lines, DSG lines, source lines, etc., and configured to drive the 3D NAND memory cell array by applying a voltage at a suitable level to the word lines, bit lines, SSG lines, DSG lines, source lines, etc., when performing memory operations (e.g., read, program, or erase). In one example, NAND HV circuits 367 may include word line driving circuits that are coupled to word lines and apply a program voltage (Vprog) or a pass voltage (Vpass) to the word lines during program operations. In another example, NAND HV circuits 367 may include bit line driving circuits that are coupled to bit lines and apply an erase voltage (Veras) to bit lines during erase operations. In some implementations, NAND LV+ circuits 365 include page buffer 204 and are configured to buffer the data read from or programmed to the 3D NAND memory cell array. In some implementations, NAND LV– circuits 363 include logic circuits. In some implementations, NAND LLV circuits 361 include an I/O circuit. In some implementations, NAND LV+ circuits 365 include page buffer 204 and are configured to buffer the data read from or programmed to the 3D NAND memory cell array. In some implementations, main control (Main-C) circuit 352 includes any suitable circuit configured to commonly control both of the 3D NAND memory cell array and the 3D ferroelectric memory cell array. In some implementations, FeRAM-C circuits 374 include any suitable circuit configured to control the 3D ferroelectric memory cell array.

Figure 4:
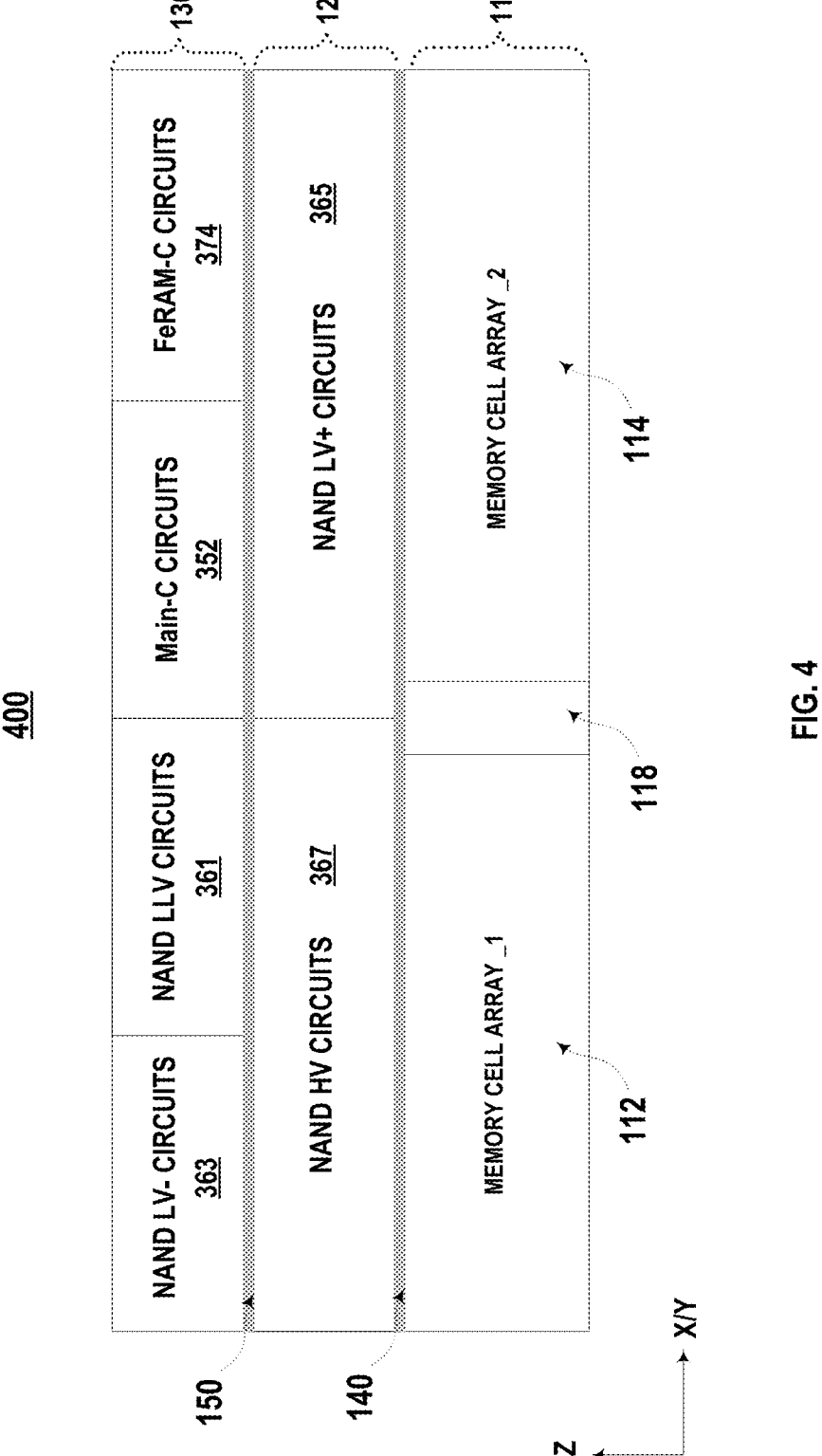
FIG. 4 illustrates a schematic diagram of a cross-sectional view of an exemplary 3D memory device, according to various aspects of the present disclosure.

As described above, to reduce the total area occupied by the memory peripheral circuits, the peripheral circuits of the first and/or second memory cell arrays can be separately formed in different planes based on different performance requirements, such as the applied voltages. For example, FIG. 4 illustrates a schematic diagram of peripheral circuits provided with various voltages and/or functions arranged in separate semiconductor structures, according to some aspects of the present disclosure. In some implementations, first semiconductor structure 120 can include NAND LV+ circuits 365 and NAND HV circuits 367, while second semiconductor structure 130 can include NAND LLV circuits 361, NAND LV– circuits 363, main control (Main-C) circuits 352, and ferroelectric memory control (FeRAM-C) circuits 374. Due to the significant difference in voltages of NAND LLV circuits 361, NAND LV– circuits 363, NAND LV+ circuits 365, NAND HV circuits 367, main control (Main-C) circuits 352, and ferroelectric memory control (FeRAM-C) circuits 374, the different peripheral circuits may require different device dimensions, such as different semiconductor layer (e.g., substrate or thinned substrate) thicknesses and different gate dielectric thicknesses. In one example, the thickness of the semiconductor layer (e.g., a substrate or a thinned substrate) in which NAND LV+ circuits 365 and NAND HV circuits 367 are formed in semiconductor structure 120 may be larger than the thickness of the semiconductor layer (e.g., a substrate or a thinned substrate) in which NAND LLV circuits 361, NAND LV– circuits 363, main control (Main-C) circuits 352, and ferroelectric memory control (FeRAM-C) circuits 374 are formed in semiconductor structure 130. In another example, the thickness of the gate dielectric of transistors forming NAND HV circuits 367 may be larger than the thickness of the gate dielectric of transistors forming NAND LLV circuits 361. It is understood that stacked peripheral circuits in different planes may be formed in two semiconductor structures 120 and 130 separated by a bonding interface 150 or on opposite sides of a semiconductor layer.

Based on the different performance requirements (e.g., associated with different applied voltages) and/or different functions, the peripheral circuits can be separated into at least two stacked semiconductor structures 120 and 130 in two or more different planes. It is noted that, the arrangement of the peripheral circuits shown in FIG. 4 is merely an illustrative example but does not limit the scope of the present disclosure.

Figure 5A:
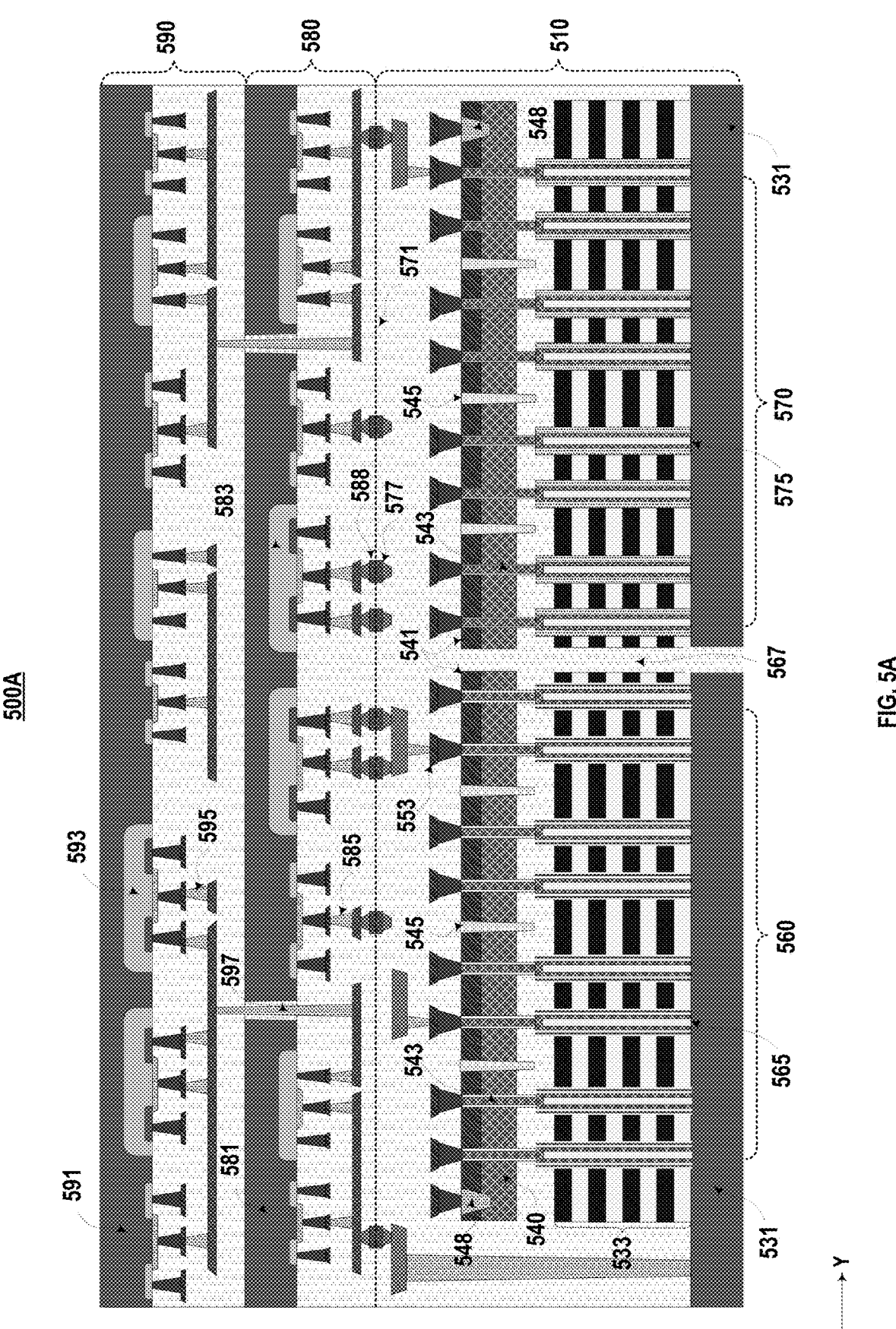
FIG. 5A is a schematic cross-sectional illustration of an exemplary 3D memory device, according to some aspects of the present disclosure.

FIG. 5A illustrates a schematic diagram of a cross-sectional side view of an exemplary 3D memory device 500A having three stacked semiconductor structures, according to some aspects of the present disclosure. 3D memory device 500A may be an example of 3D memory device 100 in FIG. 1 or 3D memory device 400 in FIG. 4. 3D memory device 500A is a bonded chip including first semiconductor structure 510, second semiconductor structure 580, and third semiconductor structure 590, which are stacked over one another in different planes in the vertical direction (e.g., the z-direction in FIG. 5A), according to some implementations.

As shown in FIG. 5A, the first semiconductor structure 510 can include a first memory array (e.g., 3D NAND Flash memory cell array) 560 and a second memory array (e.g., 3D ferroelectric memory cell array) 570 on a first semiconductor layer 531. The first memory array (e.g., 3D NAND Flash memory cell array) 560 and the second memory array (e.g., 3D ferroelectric memory cell array) 570 are separated by a spacer 567.

In some implementations, first semiconductor layer 531 can have any suitable semiconductor materials, such as silicon (e.g., single crystalline silicon, c-silicon, or polycrystalline silicon), silicon germanium (SiGe), gallium arsenide (GaAs), germanium (Ge), silicon on insulator (SOI), germanium on insulator (GOI), or any other suitable semiconductor materials. In some implementations, first semiconductor layer 531 includes single crystalline silicon and/or polycrystalline silicon. First memory array 560 and second memory array 570 can be formed on different regions of the first semiconductor layer 531.

In some implementations, first memory array 560 can include a 3D NAND Flash memory cell array, such as an array of NAND memory strings 565 on first semiconductor layer 531. The sources of NAND memory strings 565 can be in contact with first semiconductor layer 531. In some implementations, NAND memory strings 565 are disposed vertically on first semiconductor layer 531. Each NAND memory string 565 extends vertically through a plurality of pairs each including a conductive layer and a dielectric layer, according to some implementations. The stacked and interleaved conductive layers and dielectric layers are also referred to herein as a stack structure, e.g., a memory stack 533.

Figure 6A:
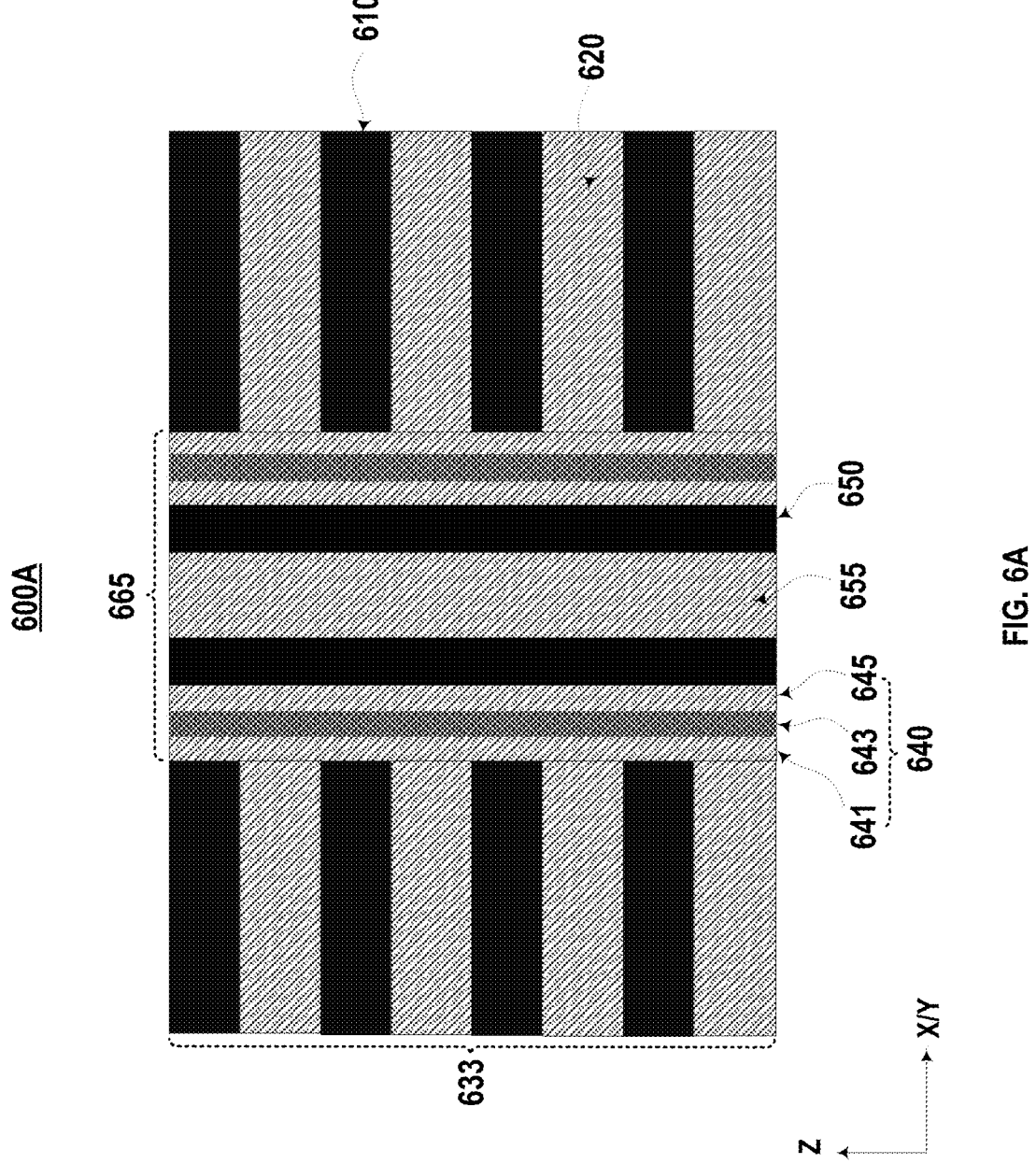
FIG. 6A is a schematic cross-sectional illustration of a portion of an exemplary 3D memory device, according to some aspects of the present disclosure.

FIG. 6A illustrates an enlarged schematic diagram 600A of a cross-sectional side view of a portion of an exemplary NAND memory string 565, according to some aspects of the present disclosure. Memory stack 633 may be an example of a portion of memory stack 533 in FIG. 5A. The conductive layers and dielectric layers in memory stack 533 may be examples of conductive layers 610 and dielectric layers 620, respectively, in memory stack 633. The interleaved conductive layers 610 and dielectric layers 620 in memory stack 633 alternate in the vertical direction, according to some implementations. Each conductive layer 610 can include a gate electrode (gate line) surrounded by an adhesive layer and a gate dielectric layer. The gate electrode of the conductive layer 610 can extend laterally as a word line, ending at one or more staircase structures (not shown) of memory stack 633.

The number of the pairs of conductive layers 610 and dielectric layers 620 in memory stack 633 can determine the number of NAND memory cells in 3D NAND Flash memory cell array 560. Conductive layer 610 can include conductive materials including, but not limited to, tungsten (W), cobalt (Co), copper (Cu), aluminum (Al), titanium nitride (TiN), platinum (Pt), ruthenium (Ru), tantalum nitride (TaN), polysilicon, doped silicon, silicides, or any combination thereof. In some implementations, each conductive layer 610 includes a metal layer, such as a tungsten layer. In some implementations, each conductive layer 610 includes a doped polysilicon layer. Each conductive layer 610 can include control gates surrounding the memory cells, and can extend laterally as a word line.

As shown in FIG. 6A, NAND memory string 565 includes a NAND memory channel structure 665 extending vertically through memory stack 633. In some implementations, NAND memory channel structure 665 includes a through stack hole filled with semiconductor material(s) (e.g., as a semiconductor channel 650) and dielectric material(s) (e.g., as a memory film 640). In some implementations, semiconductor channel 650 includes silicon, such as polysilicon. In some implementations, memory film 640 is a composite dielectric layer including a tunneling layer 641, a storage layer 643 (also known as a "charge trap/storage layer"), and a blocking layer 645. NAND memory channel structure 665 can have a cylinder shape (e.g., a pillar shape). Semiconductor channel 650, tunneling layer 641, storage layer 643, blocking layer 645 are arranged radially from the center toward the outer surface of the pillar in this order, according to some implementations. Tunneling layer 641 can include silicon oxide, silicon oxynitride, or any combination thereof. Storage layer 643 can include silicon nitride, silicon oxynitride, silicon, or any combination thereof. Blocking layer 645 can include silicon oxide, silicon oxynitride, high dielectric constant (high-k) dielectrics, or any combination thereof. In one example, memory film 640 may include a composite layer of silicon oxide/silicon oxynitride/silicon oxide (ONO). A dielectric filling structure 655 can be arranged between semiconductor channel 650. In some implementations, dielectric filling structure 655 can include one or more air gaps (now shown).

Referring back to FIG. 5A, NAND memory string 565 can extend vertically through memory stack 533 above first semiconductor layer 531. In some implementations, each NAND memory string 565 is a "charge trap" type of NAND memory string including any suitable channel structures, such as bottom plug channel structure, sidewall plug channel structure, or bottom open channel structure. It is understood that NAND memory strings 565 are not limited to the "charge trap" type of NAND memory strings and may be "floating gate" type of NAND memory strings in other examples. It is also understood that in some examples, trench isolations and doped regions (not shown) may be formed in first semiconductor layer 531 as well.

As shown in FIG. 5A, first semiconductor structure 510 further comprise an isolation layer 540 above the 3D NAND Flash memory cell array 560, and a semiconductor layer 541 on the isolation layer 540. In some implementations, isolation layer 540 can include any suitable dielectric materials including, but not limited to, silicon oxide, silicon nitride, silicon oxynitride, low dielectric constant (low-k) dielectrics, or any combination thereof, that can have an electrical isolation function. Semiconductor layer 541 can have any suitable semiconductor materials, such as silicon (e.g., single crystalline silicon, c-silicon, or polycrystalline silicon), silicon germanium (SiGe), gallium arsenide (GaAs), germanium (Ge), or any other suitable semiconductor materials. In some implementations, semiconductor layer 541 includes single crystalline silicon and/or polycrystalline silicon.

As shown in FIG. 5A, first semiconductor structure 510 further includes a plurality of through contacts 543 each vertically penetrating semiconductor layer 541 and isolation layer 540 and in contact with the drain end of a corresponding NAND memory string 565. It is noted that, each through contact 543 can be surrounded by a spacer to be isolated from semiconductor layer 541. A plurality of top select gate contacts 548 can be embedded in the semiconductor layer 541. A plurality of top select gate cuts 545 can penetrate semiconductor layer 541 and extend into isolation layer 540 to separate semiconductor layer 541 into a plurality of segments. As such, the plurality of through contacts 543, the plurality of top select gate contacts 548, and the plurality of segments of semiconductor layer 541 can form a plurality of top select transistors separated from each other by the plurality of top select gate cuts 545. The plurality of top select gate contacts 548 can function as top select gates of the plurality of top select transistors.

It is noted that, each NAND memory string 565 can further include a semiconductor plug (not shown) on the source end thereof, which is in contact with semiconductor channel 650 and the first semiconductor layer 531. The semiconductor plug (also known as selective epitaxial growth (SEG)) can be selectively grown from first semiconductor layer 531 and thus, has the same material as first semiconductor layer 531, such as single crystalline silicon or polycrystalline silicon.

As shown in FIG. 5A, first semiconductor structure 510 can further include an interconnect layer comprising a plurality of interconnects 553 in contacting with the plurality of top select gate contacts 548 and through contacts 543 to transfer electrical signals to and from the top select transistors and the NAND memory strings 565. The interconnects 553 can include lateral lines and vertical vias. As used herein, the term "interconnects" can broadly include any suitable types of interconnects, such as middle-end-of-line (MEOL) interconnects and back-end-of-line (BEOL) interconnects. In some implementations, the interconnects 553 also include local interconnects, such as bit line contacts and word line contacts. It is noted that, the interconnect layer can further include one or more interlayer dielectric (ILD) layers (also known as "intermetal dielectric (IMD) layers") in which the lateral lines and vias can form. The interconnects 553 can include conductive materials including, but not limited to W, Co, Cu, Al, silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof. In some implementations, the interconnects 553 include W, which has a relatively high thermal budget (compatible with high-temperature processes) and good quality (fewer defects, e.g., voids) among conductive metal materials.

In some implementations, second memory array 570 can include a 3D ferroelectric memory cell array, such as a capacitor-type ferroelectric memory cell array, or a FET-type ferroelectric memory cell array. The 3D ferroelectric memory cell array 570 can have similar structures compared to the 3D NAND Flash memory cell array 560, but with different through stack structures in each ferroelectric memory cell string.

Figure 6B:
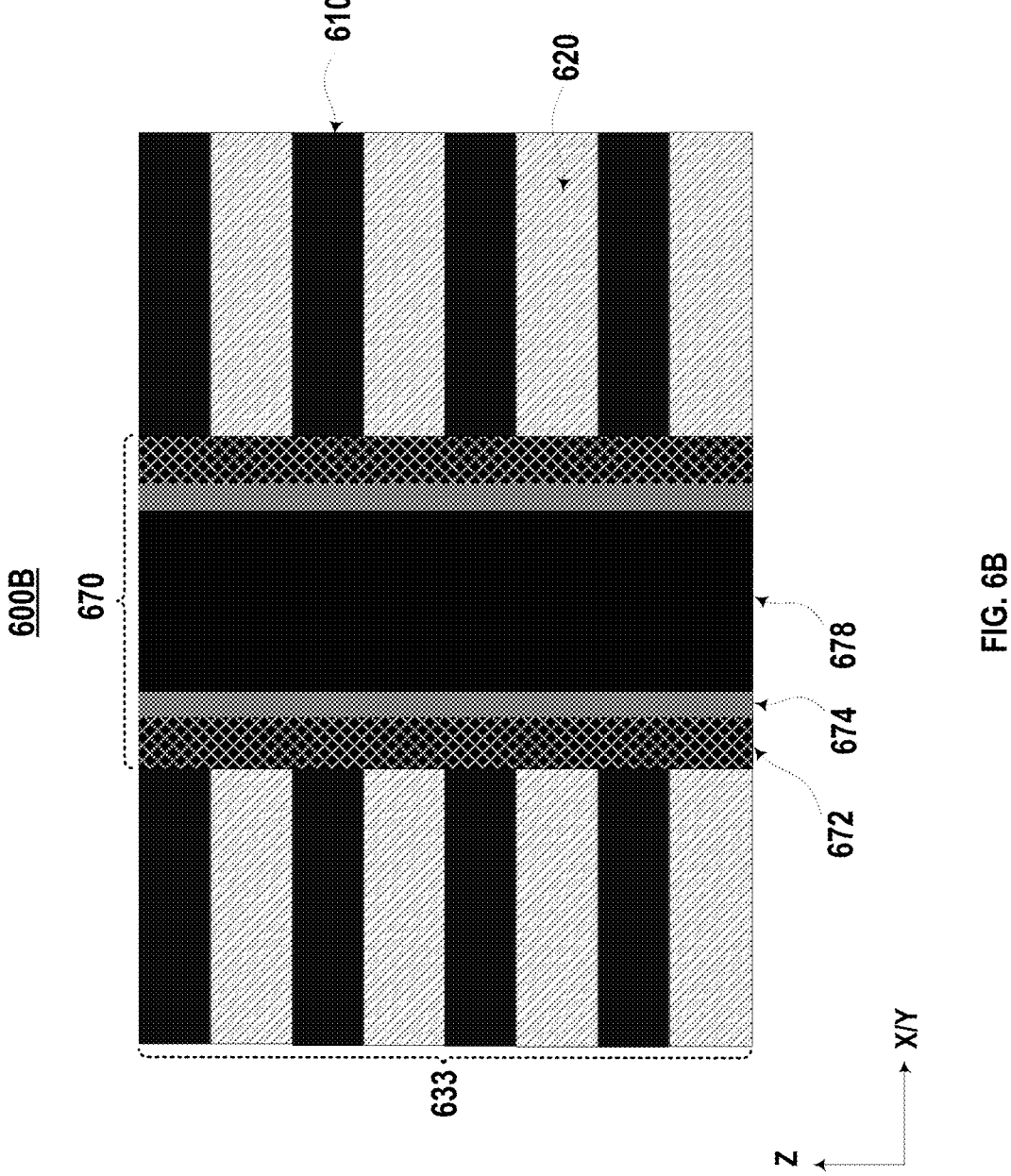
FIG. 6B is a schematic cross-sectional illustration of another portion of an exemplary 3D memory device, according to some aspects of the present disclosure.

In the capacitor-type ferroelectric memory cell array, each transistor formed in semiconductor layer 541 can function as the transistor of one 1TnC capacitor-type ferroelectric memory string 575. FIG. 6B illustrates an enlarged schematic diagram 600B of a cross-sectional side view of a portion of an exemplary capacitor-type ferroelectric memory string 575, according to some aspects of the present disclosure. As shown in FIG. 6B, capacitor-type ferroelectric memory string 575 includes a FeRAM through stack structure 670 extending vertically through memory stack 633. In some implementations, FeRAM through stack structure 670 includes a through stack hole filled with ferroelectric or antiferroelectric material(s) (e.g., as a ferroelectric layer 672) and conductive material(s) (e.g., as a conductive structure 678).

In some embodiments, the ferroelectric layer 672 can include a high-k (i.e., high dielectric constant) dielectric material, which can include transitional metal oxides such as hafnium-zirconium oxide (HfZrO), hafnium oxide (HfO$_2$), aluminum oxide (Al$_2$O$_3$), Zirconium oxide (ZrO$_2$), titanium oxide (TiO$_2$), niobium oxide (Nb$_2$O$_5$), tantalum oxide (Ta$_2$O$_5$), tungsten oxide (WO$_3$), molybdenum oxide (MO$_3$), vanadium oxide (V$_2$O$_3$), lanthanum oxide (La$_2$O$_3$), and/or any combination thereof. In some embodiments, to improve ferroelectric property, the high-k dielectric material can be doped. For example, the ferroelectric layer 672 can be HZO or HfO$_2$ doped with silicon (Si), (Yttrium) Y, Gadolinium (Gd), Lanthanum (La), Zirconium (Zr) or Aluminum (Al), or any combination thereof. In some embodiments, the ferroelectric layer 672 can include Zirconate Titanate (PZT), Strontium Bismuth Tantalate (SrBi$_2$Ta$_2$O$_9$), Barium Titanate (BaTiO$_3$), PbTiO$_3$, and BLT ((Bi,La)4Ti$_3$O$_{12}$), or any combination thereof.

In some embodiments, the ferroelectric layer 672 can be disposed by chemical vapor deposition (CVD), for example, metal organic chemical vapor deposition (MOCVD), low pressure chemical vapor deposition (LPCVD), plasma enhanced chemical vapor deposition (PECVD), high-density plasma chemical vapor deposition (HDP-CVD), etc. The ferroelectric layer 672 can also be disposed by atomic layer deposition (ALD), sputtering, evaporating, or any combination thereof. In some embodiments, the ferroelectric layer 672 can have a thickness in a range between 5 nm and 100 nm.

In some embodiments, the conductive structure 678 can include conductive materials including, but not limited to, tungsten (W), cobalt (Co), copper (Cu), aluminum (Al), titanium nitride (TiN), platinum (Pt), ruthenium (Ru), tantalum nitride (TaN), polysilicon, doped silicon, silicides, or any combination thereof. A dielectric film 674 can be sandwiched between the ferroelectric layer 672 and the conductive structure 678. In some implementations, the dielectric film 674 can include any suitable dielectric material, such as TiN. As shown in FIG. 6B, the ferroelectric layer 672, the dielectric film 674, and the conductive structure 678, are arranged radially from the center toward the outer surface of the pillar in this order, according to some implementations.

As shown in FIG. 6B, the plurality of conductive layers 610 and the conductive structure 678 separated by the ferroelectric layer 672 and the dielectric film 674 can form a plurality of multiple parallel-connected capacitors of the 1TnC Capacitor-type ferroelectric memory string 575 as shown in FIG. 5A. Each conductive layer 610 can function as a plate line of the 1TnC Capacitor-type ferroelectric memory string 575. In some embodiments, the number n of the multiple parallel-connected capacitors of the 1TnC Capacitor-type ferroelectric memory string 575 can be adjusted by connecting a certain number of the plate lines through staircase contacts in the staircase region (not shown). The conductive structure 678 together with the corresponding through contact 543 can function as the channel of the 1TnC Capacitor-type ferroelectric memory string 575. The top select gate contact 548 can function as the word line of the 1TnC Capacitor-type ferroelectric memory string 575, and the interconnect 553 in contact with the through contact 543 can function as the bit line of the 1TnC Capacitor-type ferroelectric memory string 575.

Figure 6C:
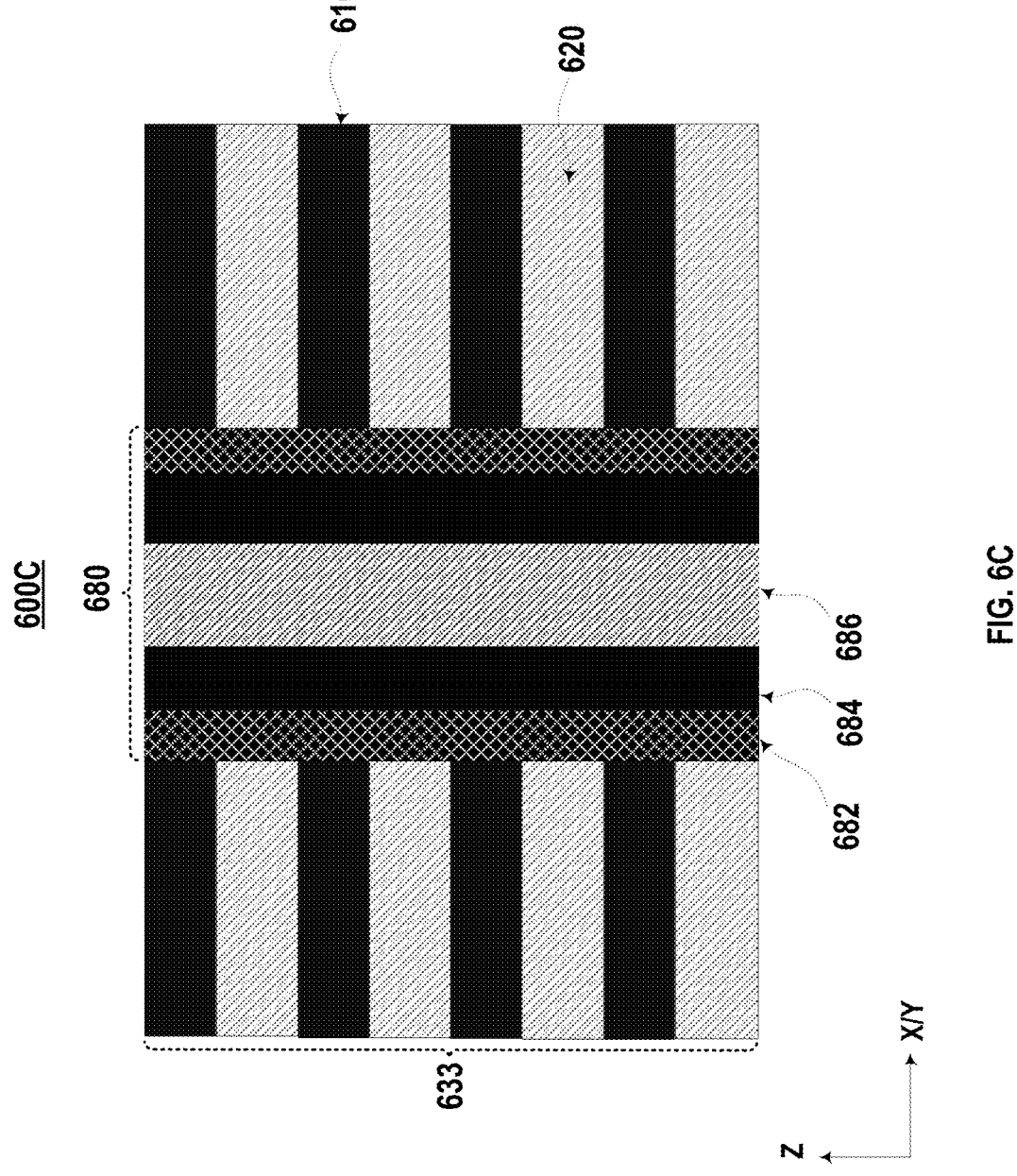
FIG. 6C is a schematic cross-sectional illustration of a portion of an exemplary 3D memory device, according to some aspects of the present disclosure.

In the FET-type ferroelectric memory cell array, each transistor formed in the semiconductor layer 541 can function as a top select transistor of one capacitor-free FeFET cell string 575' (not shown, but replacing the 1TnC Capacitor-type ferroelectric memory string 575 in FIG. 5A). FIG. 6C illustrates an enlarged schematic diagram 600C of a cross-sectional side view of a portion of an exemplary FeFET cell string 575', according to some aspects of the present disclosure. As shown in FIG. 6C, FeFET cell string 575' includes a FeFET through stack structure 680 extending vertically through memory stack 633. Each of the plurality of conductive layers 610 can function as a word line of a corresponding FeFET cell. In some implementations, FeFET through stack structure 680 includes a through stack hole filled with ferroelectric or antiferroelectric material(s) (e.g., as a ferroelectric layer 672) and conductive material(s) (e.g., as a conductive structure 688).

In some embodiments, the ferroelectric layer 682 can include a high-k (i.e., high dielectric constant) dielectric material, which can include transitional metal oxides such as hafnium-zirconium oxide (HfZrO), hafnium oxide (HfO$_2$), aluminum oxide (Al$_2$O$_3$), Zirconium oxide (ZrO$_2$), titanium oxide (TiO$_2$), niobium oxide (Nb$_2$O$_5$), tantalum oxide (Ta$_2$O$_5$), tungsten oxide (WO$_3$), molybdenum oxide (MO$_3$), vanadium oxide (V$_2$O$_3$), lanthanum oxide (La$_2$O$_3$), and/or any combination thereof. In some embodiments, to improve ferroelectric property, the high-k dielectric material can be doped. For example, the ferroelectric layer 682 can be HZO or HfO$_2$ doped with silicon (Si), (Yttrium) Y, Gadolinium (Gd), Lanthanum (La), Zirconium (Zr) or Aluminum (Al), or any combination thereof. In some embodiments, the ferroelectric layer 682 can include Zirconate Titanate (PZT), Strontium Bismuth Tantalate (SrBi$_2$Ta$_2$O$_9$), Barium Titanate (BaTiO$_3$), PbTiO$_3$, and BLT ((Bi,La)4Ti$_3$O$_{12}$), or any combination thereof.

In some embodiments, the ferroelectric layer 682 can be disposed by chemical vapor deposition (CVD), for example, metal organic chemical vapor deposition (MOCVD), low pressure chemical vapor deposition (LPCVD), plasma enhanced chemical vapor deposition (PECVD), high-density plasma chemical vapor deposition (HDP-CVD), etc. The ferroelectric layer 682 can also be disposed by atomic layer deposition (ALD), sputtering, evaporating, or any combination thereof. In some embodiments, the ferroelectric layer 682 can have a thickness in a range between 5 nm and 100 nm.

In some embodiments, the conductive structure 684 can include conductive materials including, but not limited to, tungsten (W), cobalt (Co), copper (Cu), aluminum (Al), titanium nitride (TiN), platinum (Pt), ruthenium (Ru), tantalum nitride (TaN), polysilicon, doped silicon, silicides, or any combination thereof. A dielectric filling structure 686 can be enclosed by conductive structure 684. In some implementations, dielectric filling structure 686 can include one or more air gaps (now shown). As shown in FIG. 6C, the ferroelectric layer 682, the conductive structure 684, and the dielectric filling structure 686 are arranged radially from the center toward the outer surface of the pillar in this order, according to some implementations.

Referring back to FIG. 5A, first semiconductor structure 510 can further include a first bonding layer comprising conductive bonding contacts 577 and dielectrics electrically isolating the conductive bonding contacts 577, which can be used, for example, for hybrid bonding as described below in detail. Conductive bonding contacts 577 can be MEOL/BEOL interconnects and/or contact pads including any suitable conductive materials including, but not limited to W, Co, Cu, Al, silicides, or any combination thereof.

As shown in FIG. 5A, second semiconductor structure 580 can be bonded on top of first semiconductor structure 510 in a face-to-face manner at bonding interface 571. Second semiconductor structure 580 can include second semiconductor layer 581 having semiconductor materials. In some implementations, second semiconductor layer 581 is a layer of single crystalline silicon or polycrystalline silicon transferred from a silicon substrate or an SOI substrate and attached to the third semiconductor structure 590 by transfer bonding.

As shown in FIG. 5A, second semiconductor structure 580 can include a device layer on and in contact with second semiconductor layer 581. In some implementations, the device layer includes one or more first peripheral circuits, such as NAND HV circuits 367 and NAND LV+ circuits 365, as shown in FIG. 4. In some implementations, a plurality of transistors 583 having operating voltages in the range in compliance with the NAND HV circuits 367 and NAND LV+ circuits 365 can be formed in contact with second semiconductor layer 581. In some implementations, trench isolations (e.g., STIs, now shown) and doped regions (e.g., wells, sources, and drains of transistors 583, not shown) can be formed on or in second semiconductor layer 581 as well.

In some implementations, second semiconductor structure 580 further includes an interconnect layer comprising a plurality of interconnects 585, such as MEOL interconnects and BEOL interconnects, to transfer electrical signals to and from the one or more first peripheral circuits. As shown in FIG. 5A, the interconnects 585 can be coupled to the transistors 583 of the one or more first peripheral circuits in the device layer. The interconnect layer can further include one or more ILD layers in which the lateral lines and vias can form. In some implementations, the transistors 583 in the device layer are coupled to one another through the interconnects 585 in the interconnect layer. The interconnects 585 can include conductive materials including, but not limited to, W, Co, Cu, Al, silicides, or any combination thereof. The ILD layers in interconnect layer can include dielectric materials including, but not limited to, silicon oxide, silicon nitride, silicon oxynitride, low-k dielectrics, or any combination thereof. In some implementations, the interconnects 585 include W, which has a relatively high thermal budget (compatible with high-temperature processes) and good quality (fewer defects, e.g., voids) among conductive metal materials.

As shown in FIG. 5A, second semiconductor structure 580 can further include one or more through contacts 597 extending vertically through second semiconductor layer 581. In some implementations, through contact 597 couples the interconnects 585 to the interconnects in the third semiconductor structure 590 to make an electrical connection between third and second semiconductor structures 590 and 580. Through contact 597 can include conductive materials including, but not limited to, W, Co, Cu, Al, silicides, or any combination thereof. In some implementations, through contact 597 includes W. In some implementations, through contact 597 includes a via surrounded by a dielectric spacer (e.g., having silicon oxide) to electrically separate the via from second semiconductor layer 581. Depending on the thickness of second semiconductor layer 581, through contact 597 can be an ILV having a depth in the submicron-level (e.g., between 10 nm and 1 μm), or a TSV having a depth in the micron- or tens micron-level (e.g., between 1 μm and 100 μm).

In some implementations, second semiconductor structure 580 can further include a second bonding layer comprising conductive bonding contacts 588 and dielectrics electrically isolating the bonding contacts 588, which can be used, for example, for hybrid bonding as described below in detail. Conductive bonding contacts 588 can be MEOL/BEOL interconnects and/or contact pads including any suitable conductive materials including, but not limited to W, Co, Cu, Al, silicides, or any combination thereof.

In some implementations, bonding interface 571 is disposed vertically between the first bonding layer of the first semiconductor structure 510 and the second bonding layer of the second semiconductor layer 581 as a result of hybrid bonding. That is, conductive bonding contacts 577 of the first bonding layer can be in contact with the bonding contacts 588 of the second bonding layer at bonding interface 571. As a result, a plurality of bonding contacts across bonding interface 571 can make direct, short-distance (e.g., micron-level) electrical connections between adjacent semiconductor structures 510 and 580. In some implementations, dielectric layer(s) (e.g., silicon oxide layer) are formed vertically between bonding interface 571. Thus, it is understood that bonding interface 571 may include the surfaces of the dielectric layer(s) in some examples.

As shown in FIG. 5A, the third semiconductor structure 590 can be bonded on top of second semiconductor structure 580 in a face-to-back manner. Third semiconductor structure 590 can include a third semiconductor layer 591 having semiconductor materials. In some implementations, the third semiconductor layer 591 is a layer of single crystalline silicon or polycrystalline silicon. The third semiconductor structure 590 can include a device layer on and in contact with third semiconductor layer 591. In some implementations, the device layer of the third semiconductor structure 590 includes one or more third peripheral circuits, such as NAND LV− circuits 363, NAND LLV circuits 361, Main-C circuits 352, and FeRAM-C circuits 374, as shown in FIG. 4. In some implementations, the one or more third peripheral circuits include a plurality of transistors 593. In some implementations, trench isolations (e.g., STIs, now shown)

and doped regions (e.g., wells, sources, and drains of transistors 593, not shown) can be formed on or in third semiconductor layer 591 as well.

In some implementations, third semiconductor structure 590 further includes an interconnect layer comprising a plurality of interconnects 595, such as MEOL interconnects and BEOL interconnects, to transfer electrical signals to and from the one or more first peripheral circuits. As shown in FIG. 5A, interconnects 595 can be coupled to the transistors 593 of the one or more second peripheral circuits in the device layer. The interconnect layer can further include one or more ILD layers in which the lateral lines and vias can form. In some implementations, the transistors 593 in the device layer are coupled to one another through the interconnects 595 in the interconnect layer. The interconnects 595 can include conductive materials including, but not limited to, W, Co, Cu, Al, silicides, or any combination thereof. The ILD layers in interconnect layer can include dielectric materials including, but not limited to, silicon oxide, silicon nitride, silicon oxynitride, low-k dielectrics, or any combination thereof. In some implementations, the interconnects 595 include W, which has a relatively high thermal budget (compatible with high-temperature processes) and good quality (fewer defects, e.g., voids) among conductive metal materials.

In some implementations, the third semiconductor structure 590 can further include a pad-out interconnect layer (not shown) for pad-out purposes, i.e., interconnecting with external devices using contact pads on which bonding wires can be soldered. In one example, the pad-out interconnect layer can be located on the third semiconductor layer 591, and can include one or more contact pads in one or more ILD layers and in contact with one or more through contacts extending vertically through the third semiconductor layer 591. That is, 3D memory device 500A may be pad-out from the peripheral circuit side to reduce the interconnect distance between contact pads and the peripheral circuits, thereby decreasing the parasitic capacitance from the interconnects and improving the electrical performance of 3D memory device 500A. In another example, first semiconductor structure 510 including the first memory cell array on another side of 3D memory device 500A may include the pad-out interconnect layer, such that 3D memory device 500A may be pad-out from the memory cell array side. In yet another example not shown in the figures, third semiconductor structure 590 on one side of 3D memory device 500A may include a first pad-out interconnect layer, and first semiconductor structure 510 on another side of 3D memory device 500A may include a second pad-out interconnect layer, such that 3D memory device may be pad-out from both the peripheral circuit side and the memory cell array side.

Based on the structure illustrated in FIG. A, the various peripheral circuits (e.g., NAND LLV circuits 361, NAND LV– circuits 363, NAND LV+ circuits 365, NAND HV circuits 367, main control (Main-C) circuits 352, and ferroelectric memory control (FeRAM-C) circuits 374 shown in FIG. 5) in the second and third semiconductor structures 580 and 590 can be coupled to NAND memory strings 565 and ferroelectric memory strings 575 in the first semiconductor structure 510 through various interconnection structures described above. Moreover, the various peripheral circuits, as well as NAND memory strings 565 and ferroelectric memory strings 575 in 3D memory device 500A can be further coupled to external devices through one or more pad-out interconnect layers.

Figure 5B:
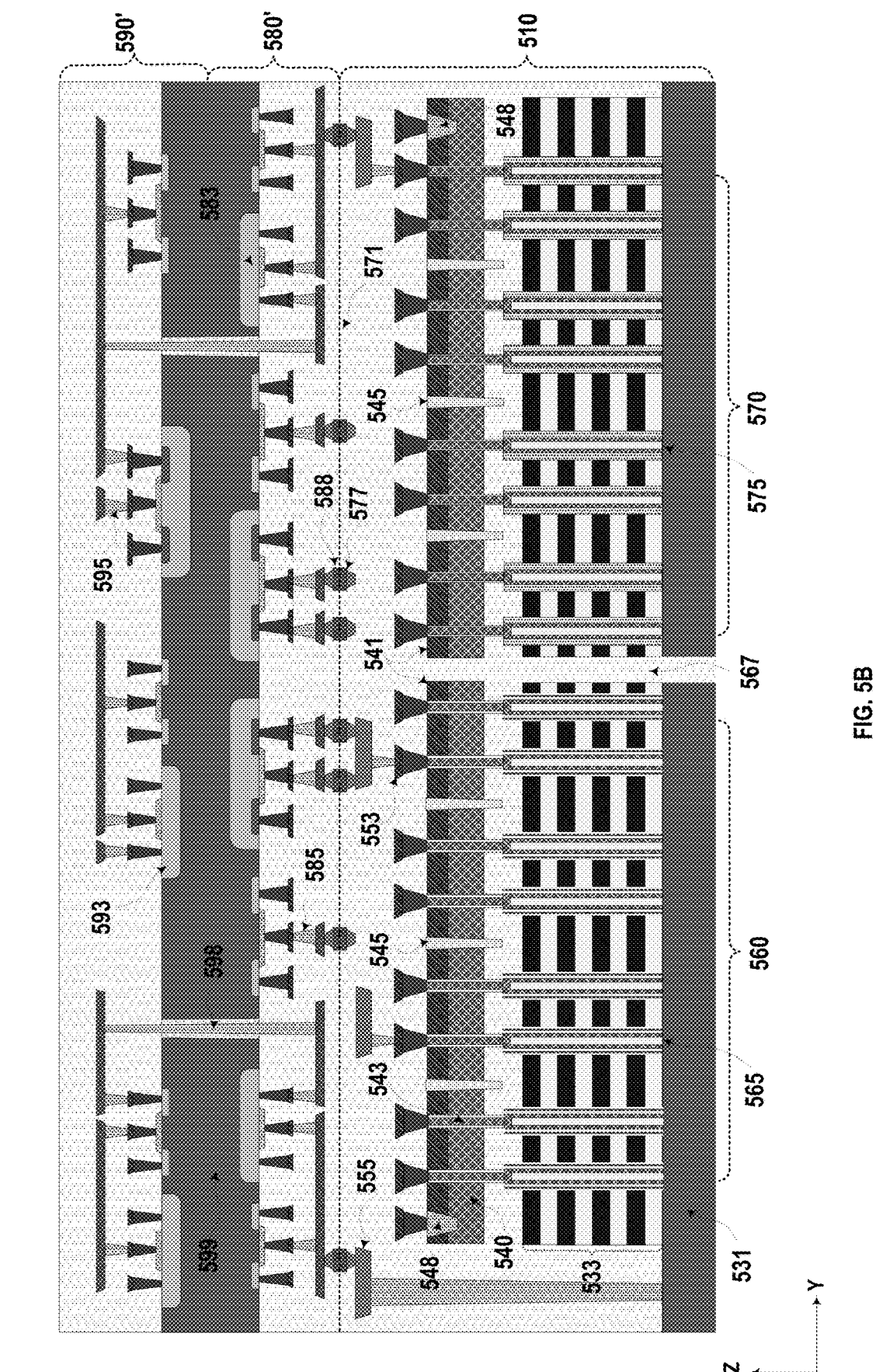
FIG. 5B is a schematic cross-sectional illustration of another exemplary 3D memory device, according to some aspects of the present disclosure.

Referring to FIG. 5B, a schematic diagram of a cross-sectional side view of another exemplary 3D memory device

500B is illustrated according to some aspects of the present disclosure. 3D memory device 500B may be another example of 3D memory device 100 in FIG. 1 or 3D memory device 400 in FIG. 4. Compared with 3D memory device 500A shown in FIG. 5A, the second semiconductor structure 580' and third semiconductor structure 590' in 3D memory device 500B can be formed on opposite sides of a single semiconductor layer 599. The second semiconductor structure 580' including the one or more second peripheral circuits which require higher thermal budgets during the fabricating process, such as NAND HV circuits 367 and NAND LV+ circuits 365 described above in connection with FIG. 4, can be bonded to the first semiconductor layer 510 in a face-to-face manner.

In some implementations, one or more through contacts 598 extending vertically through the semiconductor layer 599 can be used to couple the interconnects 585 of the second semiconductor structure 580 to the interconnects 595 of the third semiconductor structure 590 to make an electrical connection between third and second semiconductor structures 590 and 580. Through contact 598 can include conductive materials including, but not limited to, W, Co, Cu, Al, silicides, or any combination thereof. In some implementations, through contact 598 includes W. In some implementations, through contact 598 includes a via surrounded by a dielectric spacer (e.g., having silicon oxide) to electrically separate the via from the semiconductor layer 599. Depending on the thickness of the semiconductor layer 599, through contact 598 can be an ILV having a depth in the submicron-level (e.g., between 10 nm and 1 μm), or a TSV having a depth in the micron- or tens micron-level (e.g., between 1 μm and 100 μm).

Figure 5C:
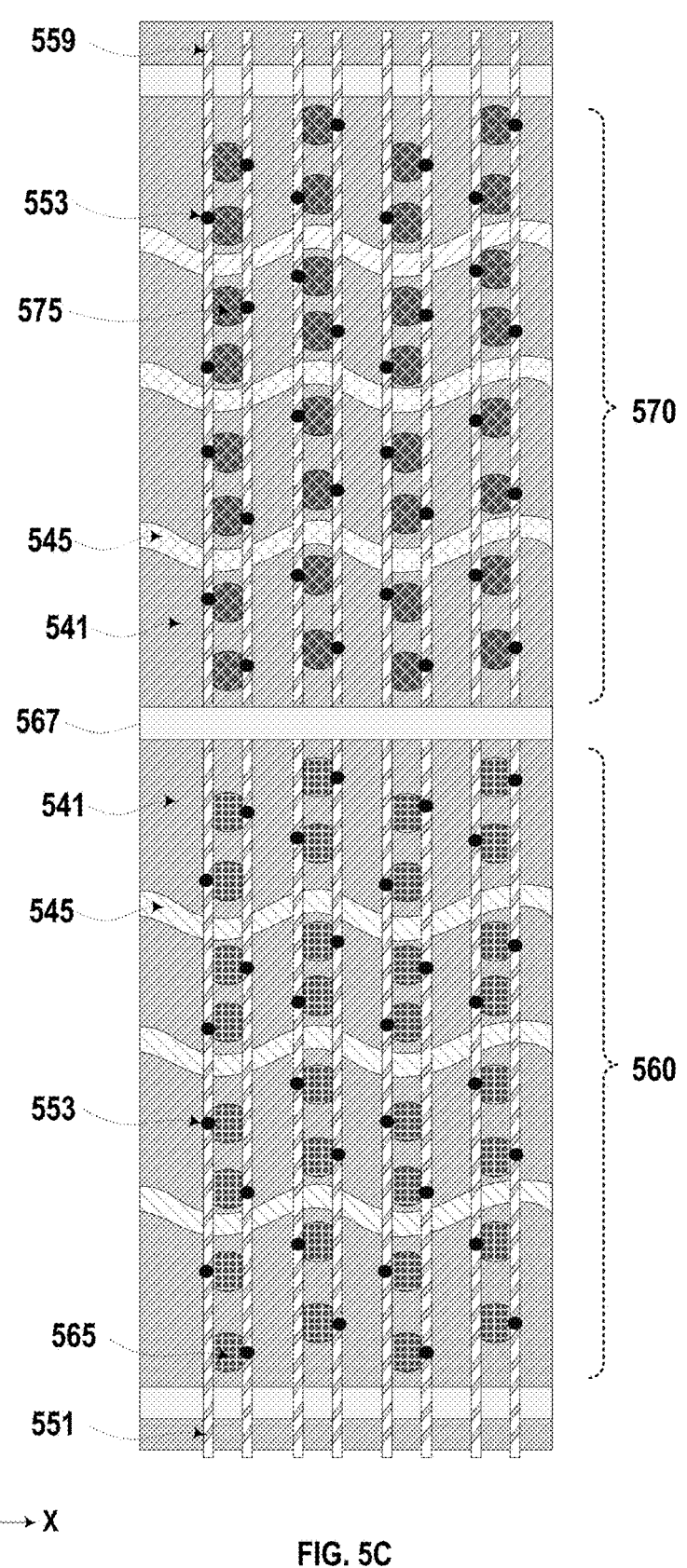
FIG. 5C is a schematic top-down illustration of an exemplary 3D memory device, according to some aspects of the present disclosure.

Referring to FIG. 5C, a schematic diagram of a top view of a portion of an exemplary 3D memory device 500C is illustrated according to some aspects of the present disclosure. It is noted that FIG. 5C illustrated a top view of the first semiconductor structure 510 shown in FIG. 5A or FIG. 5B. First memory array 560 (e.g., 3D NAND Flash memory cell array) and second memory array 570 (e.g., ferroelectric memory cell array) can be separated by spacer 567. Top select gate cut 545 can extend between NAND memory strings 565 or ferroelectric memory strings 575 along the x-direction (i.e., WL direction) to separate the semiconductor layer 541 into a plurality of segments. The through contacts 543 connected with the NAND memory strings 565 are coupled with a plurality of bit lines 551. In some implementations, the through contacts 543 connected with the capacitor-type ferroelectric memory strings 575 are coupled with a plurality of bit lines 559. In some other implementations, the through contacts 543 connected with the FET-type ferroelectric memory strings 575' are coupled with a plurality of bit lines 559.

Referring to FIGS. 8A and 8B, a flow diagram of an exemplary method for forming a first semiconductor structure is illustrated in accordance with some implementations of the present disclosure. It should be understood that the operations shown in FIGS. 8A and 8B are not exhaustive and that other operations can be performed as well before, after, or between any of the illustrated operations. Further, some of the operations may be performed simultaneously, or in a different order than shown in FIGS. 8A and 8B. FIGS. 7A-7J illustrate schematic cross-sectional views of an exemplary first semiconductor structure at certain fabricating stages of the method shown in FIGS. 8A and 8B according to some implementations of the present disclosure.

Referring to FIG. 8A, method 800A can start at operation 801, in which a dielectric stack can be formed on a first substrate, and multiple through stack holes can be formed to penetrate the dielectric stack.

Figure 7A:
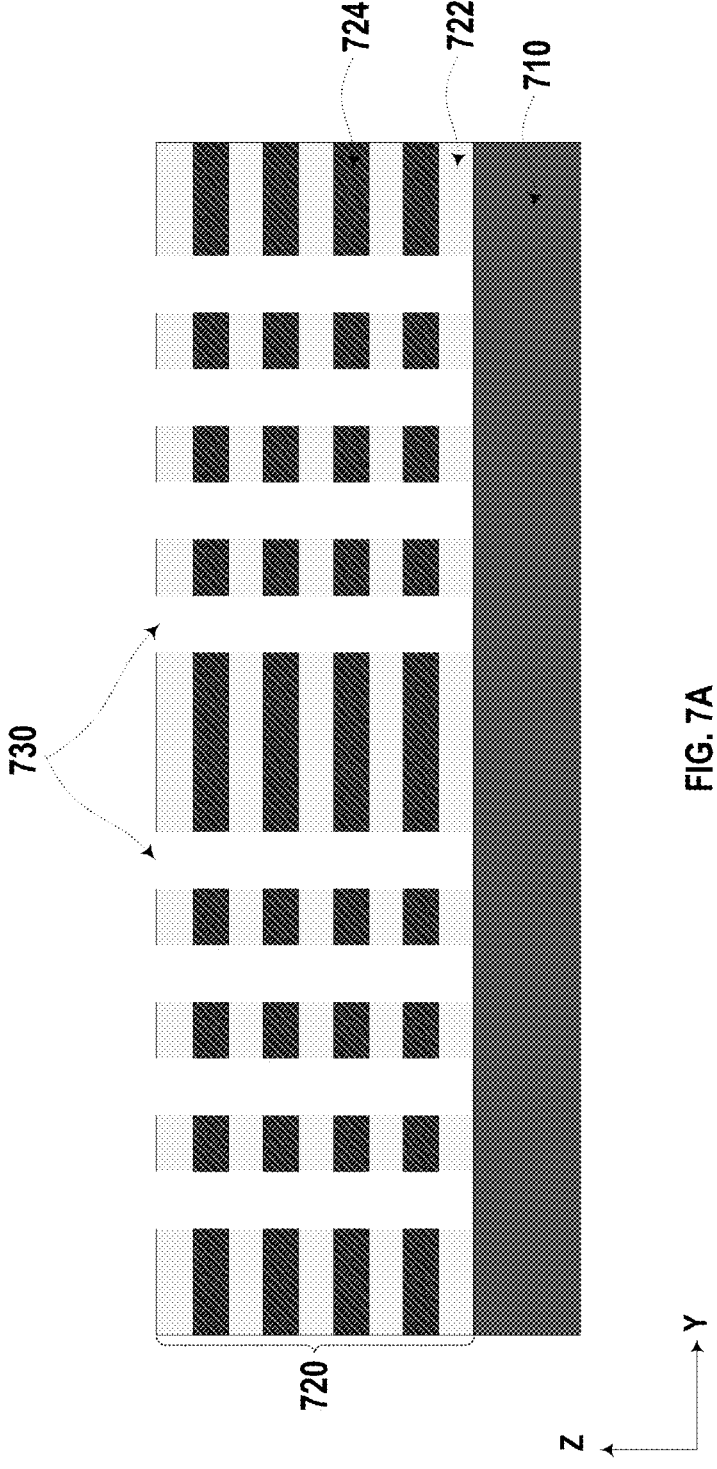
FIGS. 7A-7J illustrate a fabrication process for forming an exemplary 3D memory device according to some aspects of the present disclosure.

As shown in FIG. 7A, in some implementations, first substrate 710 can be any suitable semiconductor substrate having any suitable structure, such as a monocrystalline single-layer substrate, a polycrystalline silicon (polysilicon) single-layer substrate, a polysilicon and metal multi-layer substrate, etc. In some implementations, dielectric stack 720 including interleaved stack dielectric layers 722 and stack sacrificial layers 724 can be formed on first substrate 710. Dielectric stack 720 can include a plurality pairs of a first dielectric layer 724 (referred to herein as "stack sacrificial layer" 724) and a second dielectric layer 722 (referred to herein as "stack dielectric layer" 722, together referred to herein as "dielectric layer pairs"). Stack dielectric layers 722 and stack sacrificial layers 724 can be alternatingly deposited on first substrate 710 to form dielectric stack 720. In some implementations, each stack dielectric layer 722 includes a layer of silicon oxide, and each stack sacrificial layer 724 includes a layer of silicon nitride. Dielectric stack 720 can be formed by one or more thin film deposition processes including, but not limited to, CVD, PVD, ALD, or any combination thereof.

As shown in FIG. 7A, in some implementations, a plurality of through stack holes 730 can be formed in the dielectric stack 720. Each through stack hole 730 can vertically penetrate through the dielectric stack 720, and exposes or extends into the first substrate 710. In some implementations, the plurality of through stack holes 730 can be arranged in one or more arrays in a core region. In some implementations, fabrication processes for forming the through stack holes 730 include wet etching and/or dry etching.

In some implementations not shown in FIG. 7A, one or more staircase structures can be formed on one or more sides of dielectric stack 720. The staircase structures can be formed by performing a plurality of so-called "trim-etch" cycles to the dielectric layer pairs of dielectric stack 720 toward first substrate 710. Due to the repeated trim-etch cycles applied to the dielectric layer pairs of dielectric stack 720, dielectric stack 720 can have one or more tilted edges and a top dielectric layer pair shorter than the bottom one.

Referring back to FIG. 8A, a second subset of the through stack holes can be filled with a sacrificial material at operation 803, and a plurality of first-type memory through stack structures can be formed in a first subset of the through stack holes at operation 805.

Figure 7B:
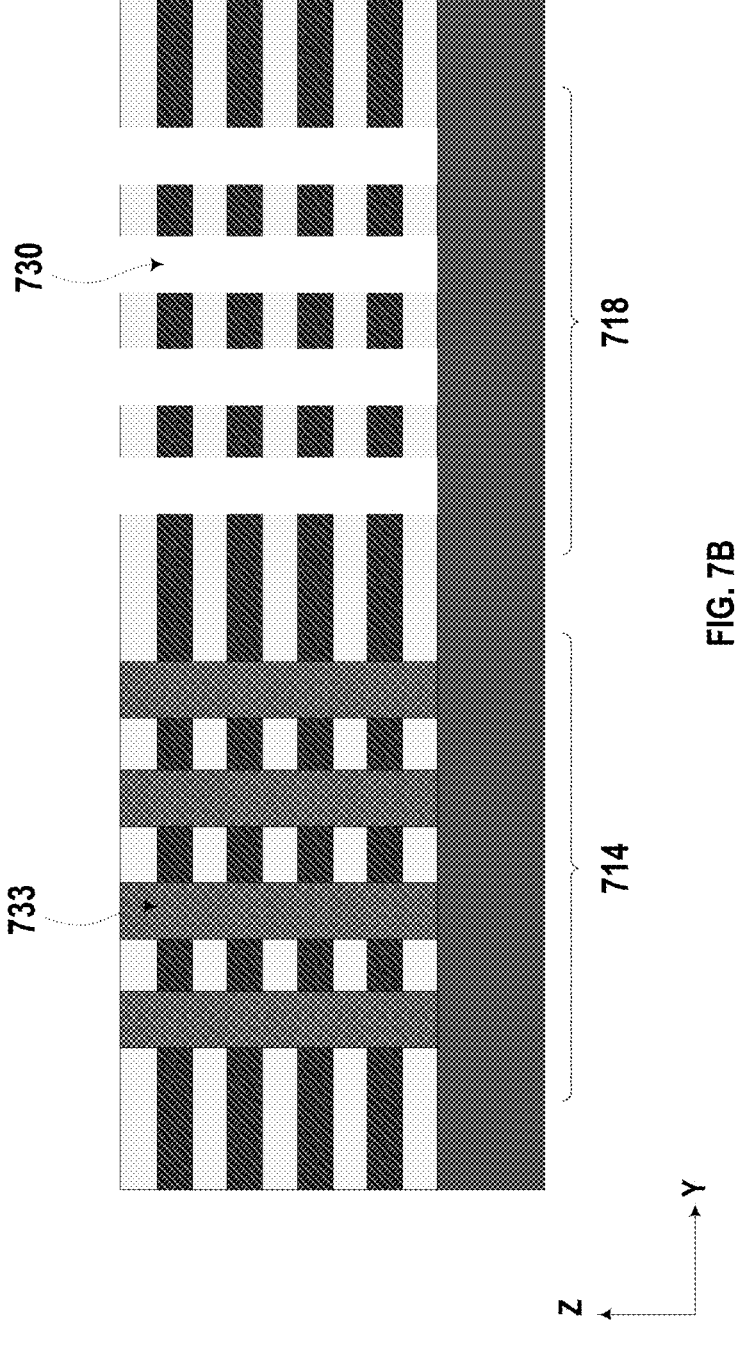

As shown in FIG. 7B, a first subset of the through stack holes in a first region 718 can be covered by a mask, while a second subset of the through stack holes in a second region 714 can be filled with a sacrificial material 733. In some implementations, the first subset of the through stack holes in a first region 718 are used to form a first-type memory cell array in the subsequent processes, and the second subset of the through stack holes in the second region 714 are used to form a second type memory cell array in the subsequent processes. The sacrificial material 733 can be different from the materials of the stack dielectric layers 722 and stack sacrificial layers 724. An etching process in the subsequent processes can have sufficiently high etching selectivity of the sacrificial material 733 over the stack dielectric layers 722 and stack sacrificial layers 724, such that the etching process can have minimal impact on the dielectric stack 720.

Figure 7C:
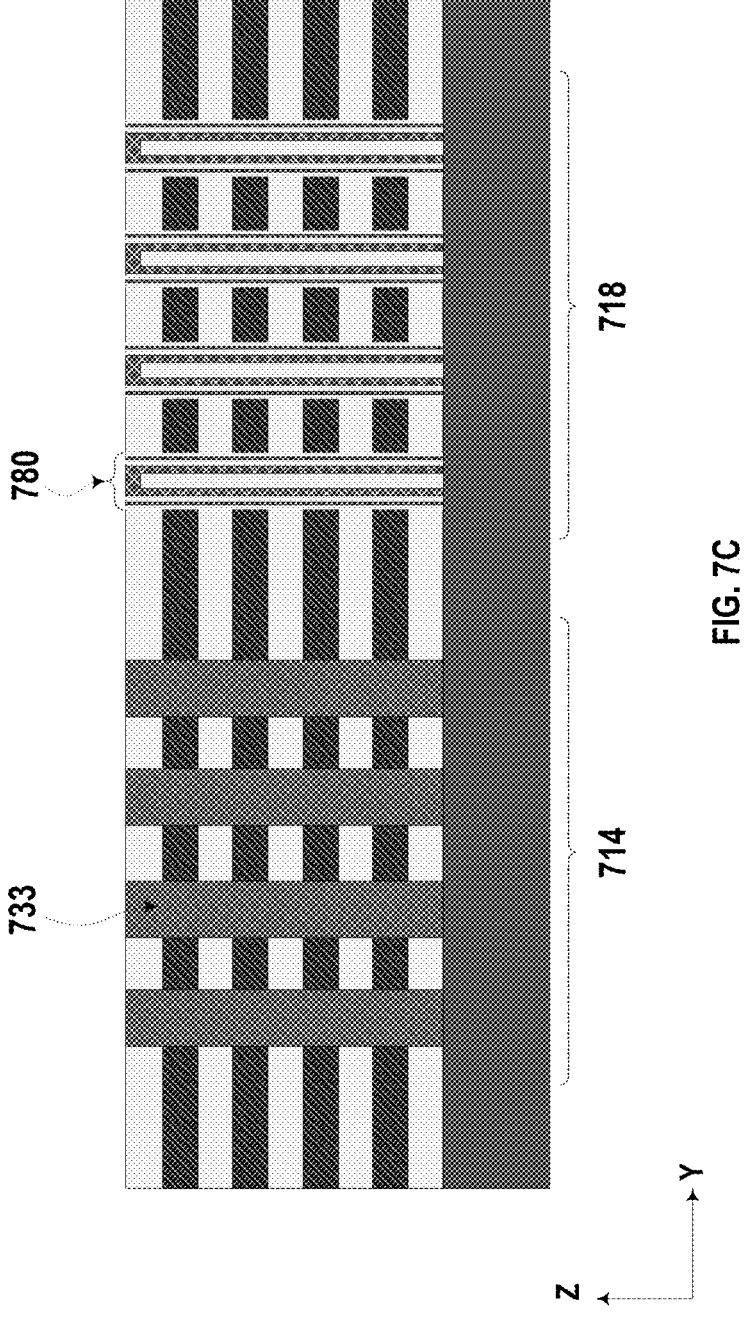

As shown in FIG. 7C, a plurality of NAND memory channel structures 780 are formed in the first subset of the through stack holes in the first region 718 to penetrate the dielectric stack 720. In the following descriptions, NAND memory channel structures 780 are used as an example of the first type memory through stack structures. It is noted that other type memory through stack structures, such as capacitor-type ferroelectric memory channel structures or FET-type ferroelectric memory channel structures can also be formed in the first subset of the through stack holes in the first region 718 as examples of the first-type memory through stack structures.

In some implementations, the structure of the NAND memory channel structure 780 can be referred to in the descriptions above in connection with FIG. 6A. The blocking layer, storage layer, tunneling layer, and semiconductor channel can be sequentially formed in this order along sidewalls and the bottom surface of each through stack hole. In some implementations, blocking layer, storage layer, and tunneling layer are first deposited along the sidewalls and bottom surface of the through stack hole in this order using one or more thin film deposition processes, such as ALD, CVD, PVD, any other suitable processes, or any combination thereof, to form the memory film. Semiconductor channel then can be formed by depositing a semiconductor material, such as polysilicon (e.g., undoped polysilicon), using one or more thin film deposition processes, such as ALD, CVD, PVD, any other suitable processes, or any combination thereof. In some implementations, a first silicon oxide layer, a silicon nitride layer, a second silicon oxide layer, and a polysilicon layer (an "ONOS" structure) are sequentially deposited to form the blocking layer, storage layer, tunneling layer, and semiconductor channel.

Referring back to FIG. 8A, the sacrificial material can be removed from the second subset of the through stack holes at operation 807, and a plurality of second-type memory through stack structures can be formed in the second subset of the through stack holes at operation 809.

Figure 7D:
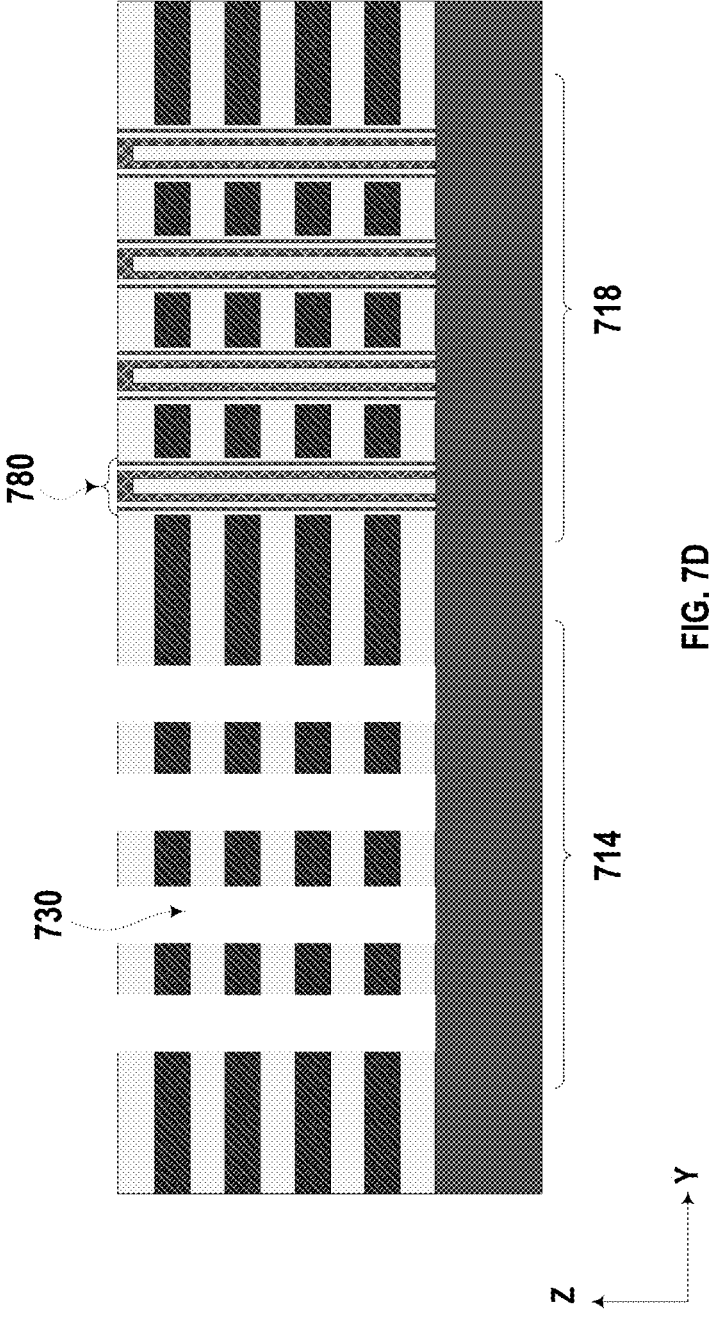
Figure 7E:
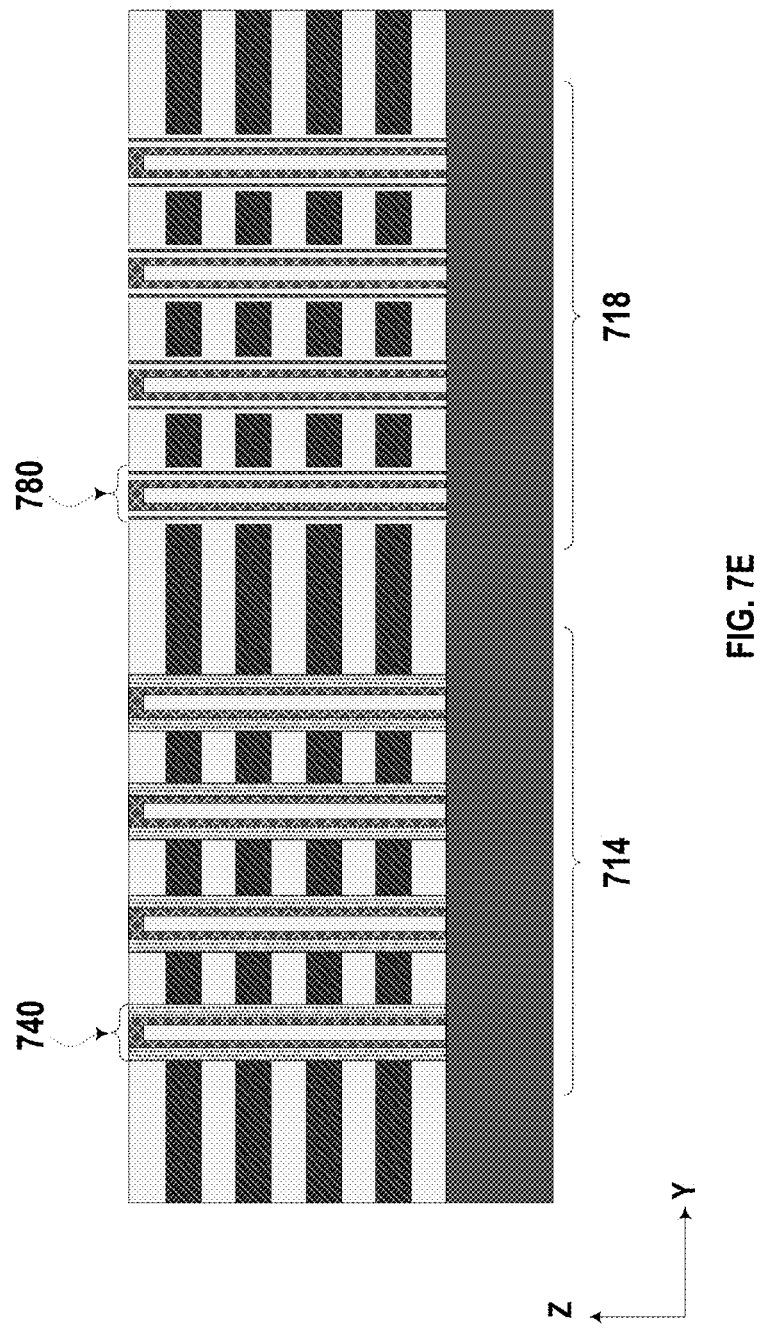

As shown in FIG. 7D, the sacrificial material 733 can be removed from the second subset of the through stack holes by using any suitable etching process to expose the second subset of the through stack holes 730 in the second region 714. As shown in FIG. 7E, a plurality of second-type memory through stack structures 740 can be formed in the second subset of the through stack holes 730 in the second region 714 to penetrate the dielectric stack 720. In some implementations, the second-type memory through stack structures 740 can be capacitor-type ferroelectric memory through stack structures described above in connection with FIG. 6B. In some other implementations, the second-type memory through stack structures 740 can be FET-type ferroelectric memory through stack structures described above in connection with FIG. 6C.

Referring back to FIG. 8A, method 800A proceed to operation 811, in which a slit can be formed between the first-type memory through stack structures and the second-type memory through stack structures, and the dielectric stack can be converted into a memory stack, and a slit structure can be formed in the slit to isolate the first-type memory through stack structures from the second-type memory through stack structures at operation 813.

Figure 7F:
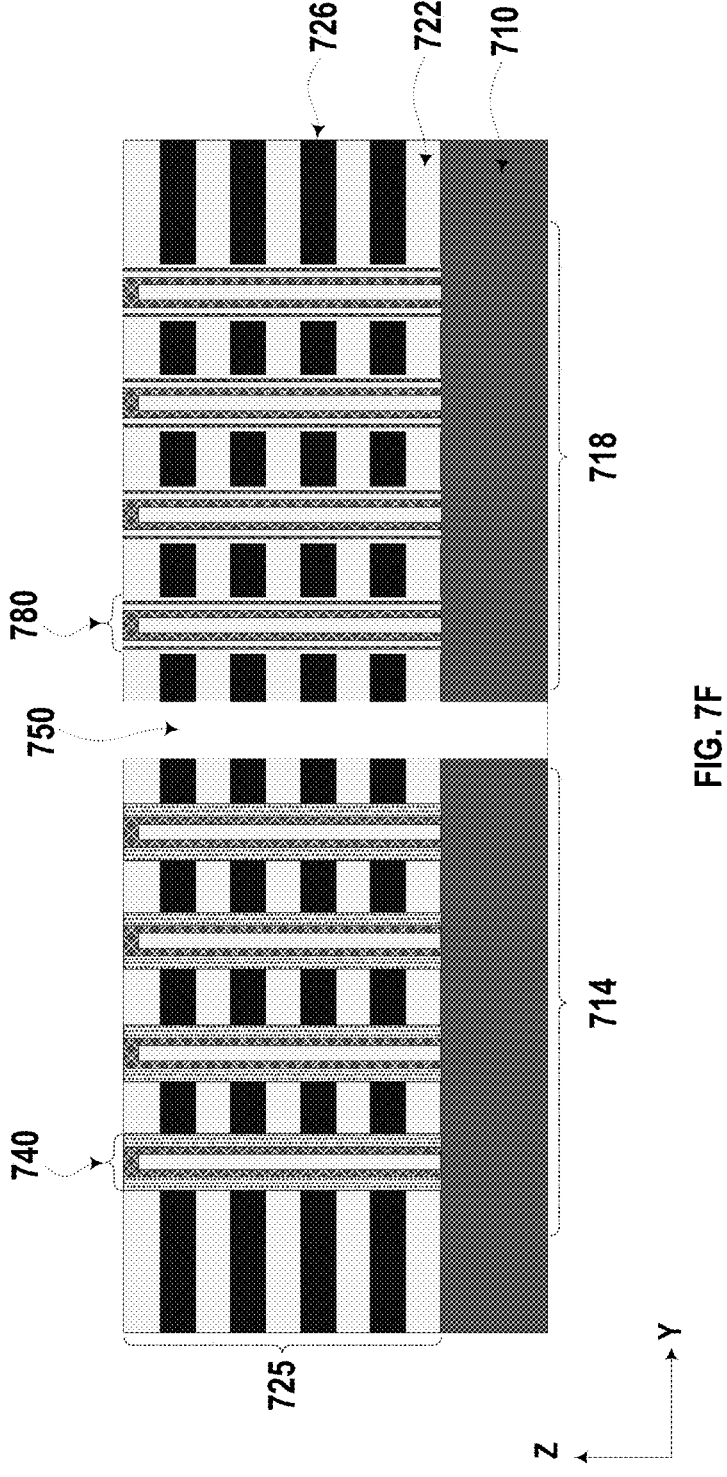

As shown in FIG. 7F, a slit 750 can be formed between the first region 718 and the second region 714 to separate the first-type memory through stack structures 780 in the first region 718 from the second-type memory through stack structures 740 in the second region 714. The slit can vertically penetrate through dielectric stack 720 and the first substrate 710, and can extend laterally in a straight line along the x-direction (i.e., WL direction) between two arrays of different types of memory through stack structures 740 and 780. The slit 750 can be formed by forming a mask layer (not shown) over dielectric stack 720 and patterning the mask using, e.g., photolithography, to form openings corresponding to the multiple slits in the patterned mask layer. A suitable etching process, e.g., dry etch and/or wet etch, can be performed to remove portions of dielectric stack 720 and first substrate 710 exposed by the openings. The mask layer can be removed after the formation of the slit 750.

A gate replacement can then be performed through the slit 750 to replace the stack sacrificial layers 724 in the dielectric stack 720 by multiple gate structures 726. After the gate replacement, dielectric stack 720 can become a memory stack 725, as shown in FIG. 7F. In some implementations, the stack sacrificial layers 724 in the dielectric stack 720 can be removed by applying etchants through the slit 750. Any suitable etching process, e.g., an isotropic dry etch or a wet etch, can be used to remove the stack sacrificial layers 724. The etching process can have sufficiently high etching selectivity of the material of stack sacrificial layers 724 over the materials of the stack dielectric layers 722, such that the etching process can have minimal impact on the stack dielectric layers 722. The isotropic dry etch and/or the wet etch can remove the stack sacrificial layers 724 in various directions to expose the top and bottom surfaces of each stack dielectric layer 722. As such, multiple horizontal trenches can then be formed interleaved between stack dielectric layers 722. Each horizontal trench can extend in a horizontal direction, and can be used as a space for a gate structure 726 to be formed in the subsequent processes. It is noted that, the term "horizontal/horizontally" used herein means nominally parallel to a lateral surface of first substrate 710.

In some implementations, stack sacrificial layers 724 include silicon nitride, and the etchant of the isotropic dry etch includes one or more of $CF_4$, $CHF_3$, $C_4F_8$, $C_4F_6$, and $CH_2F_2$. In some implementations, the stack sacrificial layers 724 include silicon nitride, and the etchant of the wet etch includes phosphoric acid. After stack sacrificial layers 724 are removed, the slit 750 and the multiple horizontal trenches can be cleaned by using any suitable cleaning process. For example, a phosphoric acid rinsing process can be performed to remove the impurities on the inner wall of the horizontal trenches.

In some implementations, stack gate structures 726 can be formed in horizontal trenches, as shown in FIG. 7F. In some implementations, each stack gate structure 726 can include a gate electrode (also referred to as stack conductive layer) wrapped by an insulating film (not shown) and a high-k dielectric layer (not shown). The insulating film and the high-k dielectric layer can be used as one or more gate dielectric layers for insulating the respective gate electrodes. In some implementations, the insulating film and the high-k dielectric layer can be formed to cover the exposed surfaces of the horizontal trenches with one or more suitable insulating materials. For example, one or more suitable deposition processes, such as CVD, PVD, and/or ALD, can be utilized to deposit the one or more insulating materials into the horizontal trenches. In some implementations, a recess etching process and/or a CMP process can be used to remove excessive insulating material(s). The one or more insulating materials can include any suitable materials that provide an electrical insulating function.

In some implementations, the gate electrodes can be formed in horizontal trenches respectively. The gate electrodes can be formed by filling the horizontal trenches with a suitable gate electrode metal material. The gate electrode metal material can include any suitable conductive material, e.g., tungsten, aluminum, copper, cobalt, or any combination thereof, for forming the word lines. The gate electrode material can be deposited into horizontal trenches using a suitable deposition method such as CVD, PVD, plasma-enhanced CVD (PECVD), sputtering, metal-organic chemical vapor deposition (MOCVD), and/or ALD.

Figure 7G:
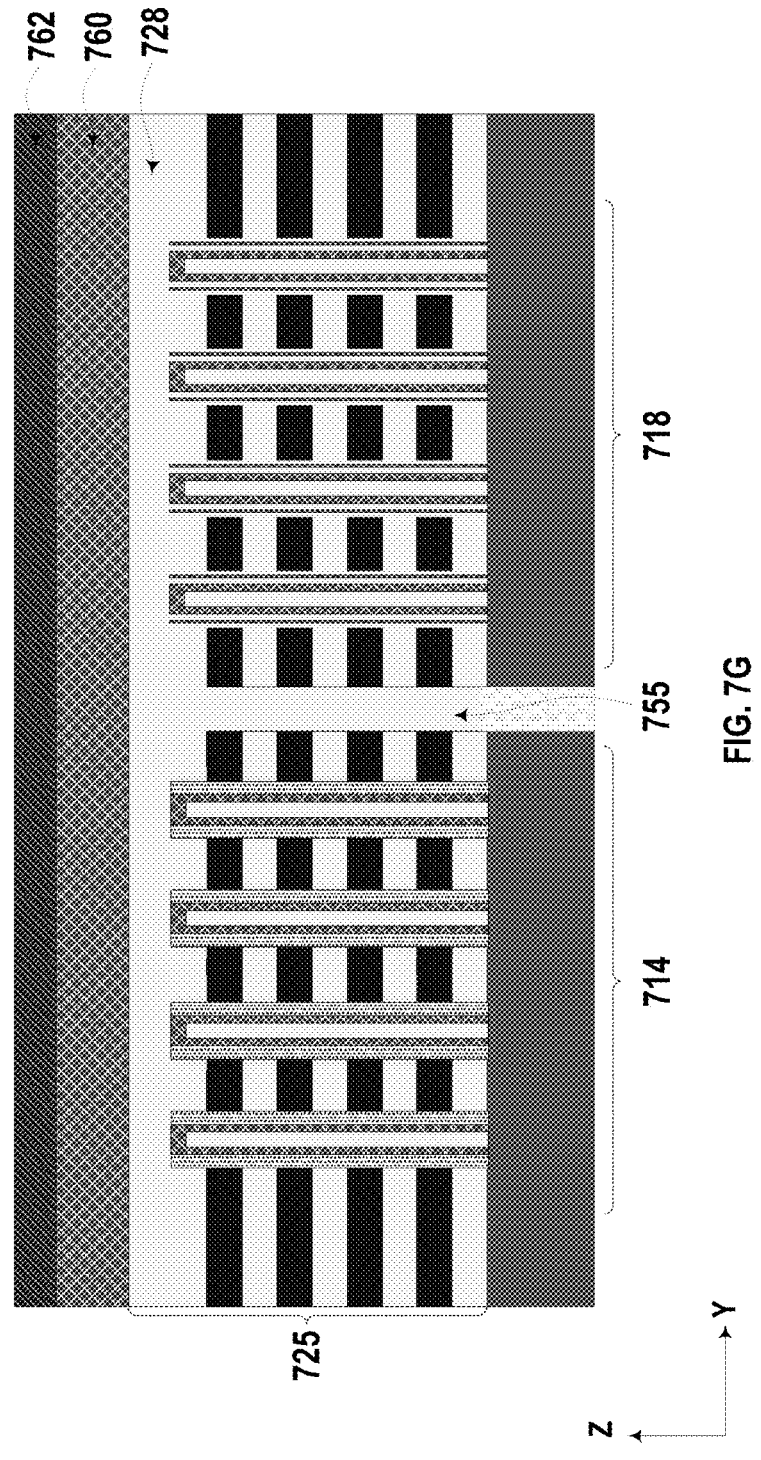
Figure 7H:
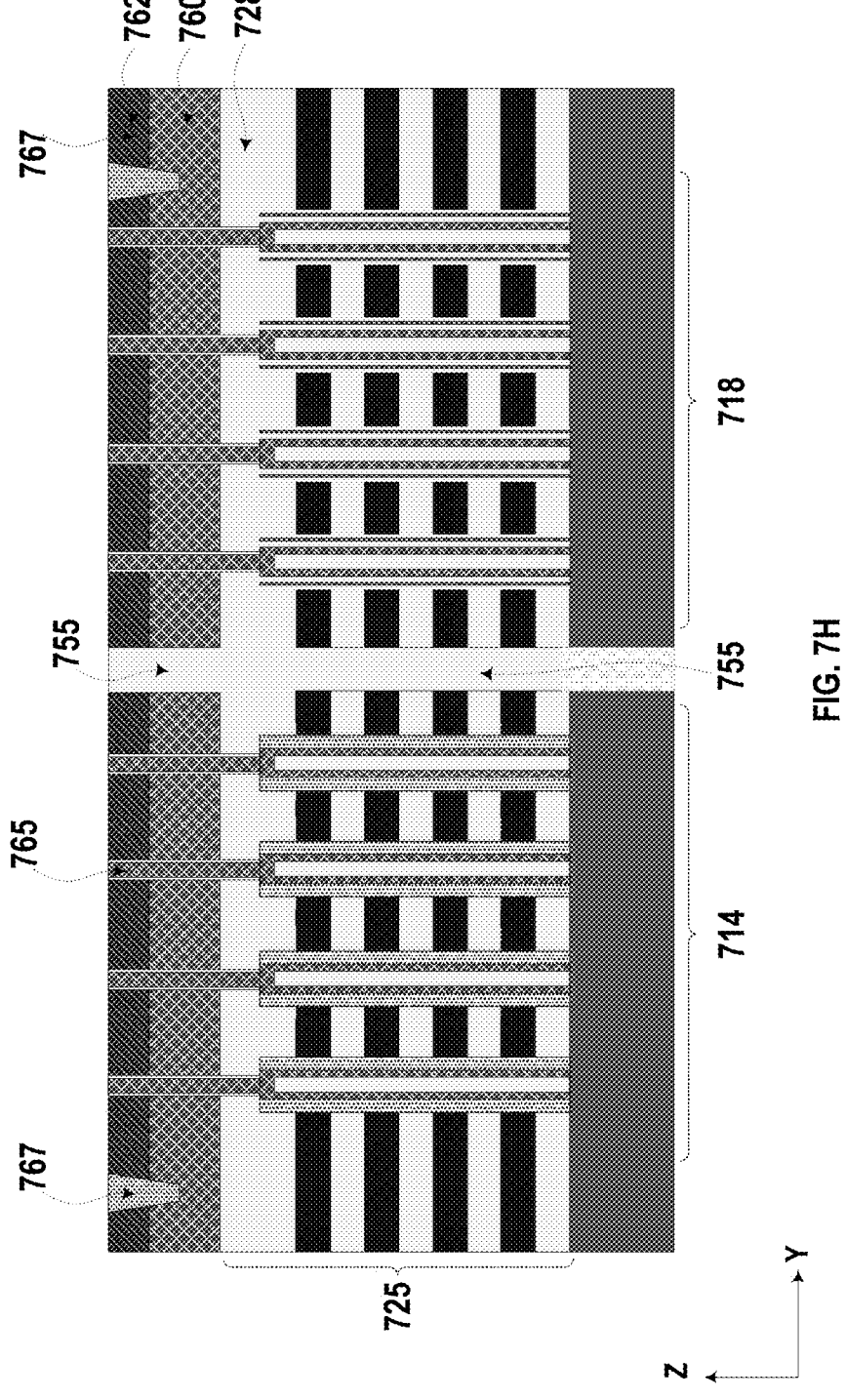

In some implementations, as shown in FIG. 7G, a dielectric material can be filled into the slit 750 by performing a deposition process to form a slit structure 755 (also referred to as a spacer 755). Slit structure 755 can be used to provide electrical insulation between the array of first-type memory through stack structures in the first region 718 from the array of second-type memory through stack structures in the second region 714. In some implementations, the dielectric material also covers the memory stack 725, as well as the array of first-type memory through stack structures in the first region 718 and the array of second-type memory through stack structures in the second region 714 to form an insulating layer 728.

Referring to FIG. 8B, a semiconductor layer can be formed on the first-type memory through stack structures and the second-type memory through stack structures at operation 815, one or more plugs can be formed in contact with the semiconductor layer, and multiple vias can be formed to penetrate the semiconductor layer and in contact with the first or second-type memory through stack structure at operation 817.

As shown in FIG. 7G, an isolation layer 760 can be formed on the insulating layer 728, and a semiconductor layer 762 can be formed on the isolation layer 760. The isolation layer 760 can include any suitable dielectric materials including, but not limited to, silicon oxide, silicon nitride, silicon oxynitride, low dielectric constant (low-k) dielectrics, or any combination thereof, that can have an electrical isolation function. The semiconductor layer 762 can have any suitable semiconductor materials, such as silicon (e.g., single crystalline silicon, c-silicon, or polycrystalline silicon), silicon germanium (SiGe), gallium arsenide (GaAs), germanium (Ge), or any other suitable semiconductor materials. In some implementations, the isolation layer 760 and the semiconductor layer 762 can be formed by any suitable deposition processes, such as CVD, PVD, plasma-enhanced CVD (PECVD), sputtering, metal-organic chemical vapor deposition (MOCVD), and/or ALD.

Figure 7I:
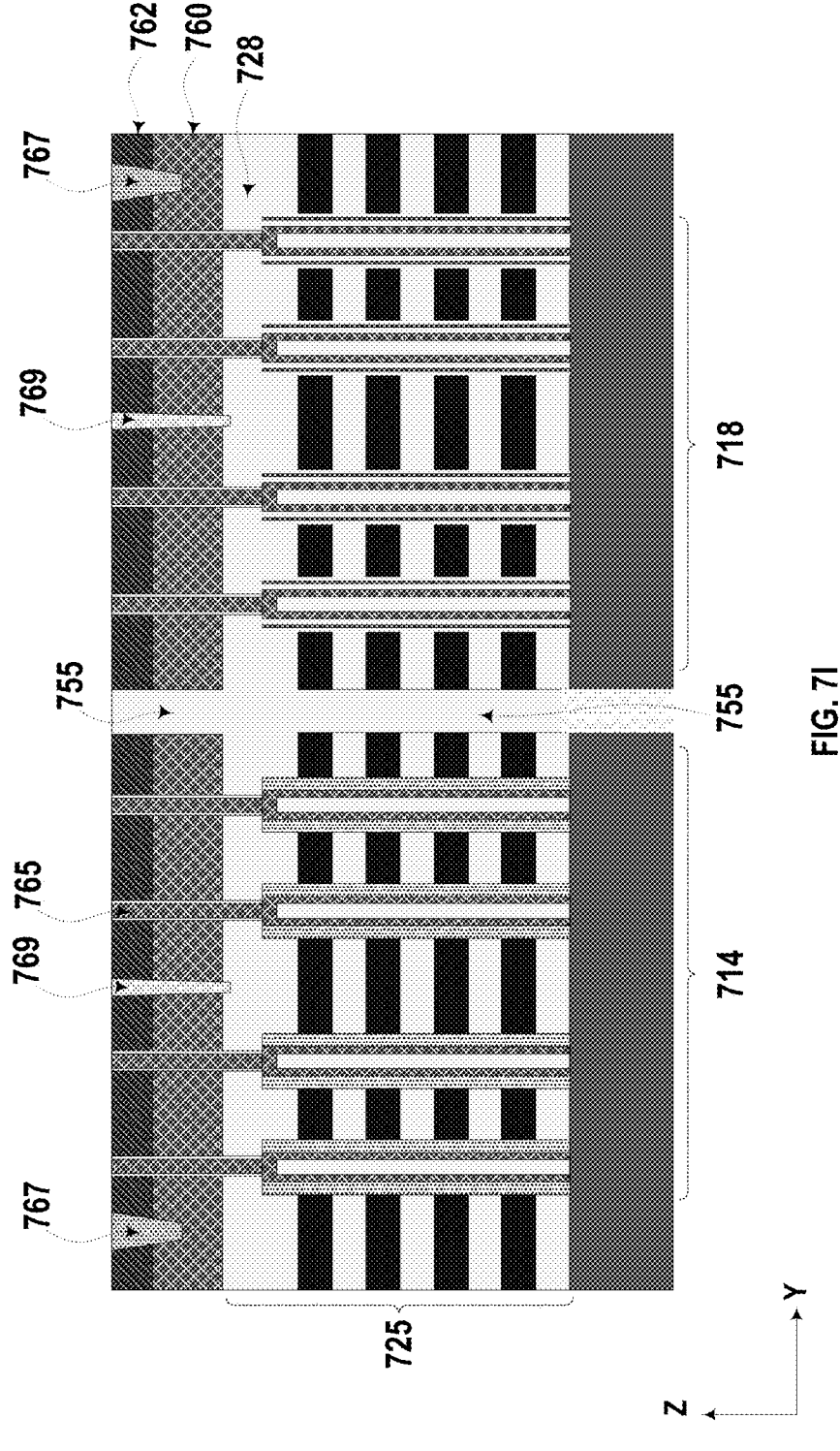

As shown in FIG. 7I, one or more plugs 767 can be formed in the semiconductor layer 762. A plurality of vias 765 can be formed to penetrate the semiconductor layer 762, the isolation layer 760, and the insulating layer 728. Each via 765 can be in contact with a corresponding first-type memory through stack structure or a corresponding second-type memory through stack structure. In some implementations, the plug 767 can function as a top select gate contact, and the via 765 can function as a through contact. It is noted that, each through contact 543 can be surrounded by a spacer to be isolated from semiconductor layer 541. In some implementations, one or more plugs 767 and the plurality of vias 765 can be formed by any suitable patterning process. For example, a mask layer (not shown) can be used in one or more etching processes to form openings at the positions for forming the one or more plugs 767 and the plurality of vias 765, and a followed deposition process can fill a conductive material into the openings to form the one or more plugs 767 and the plurality of vias 765.

Referring to FIG. 8B, method 800B can proceed to operation 819, in which the slit structure can be extended to separate a first portion of the semiconductor layer in the first region and a second portion of the semiconductor layer in the second region. Method 800B can then proceed to operation 821, in which a plurality of cut structures can further be formed to separate the first portion and the second portion of the semiconductor layer into multiple segments.

As shown in FIG. 7I, slit structure 755 can be extended in the vertical direction to further separate a first portion of the semiconductor layer 762 on the array of the first-type memory through stack structures in the first region 718 and a second portion of the semiconductor layer 762 on the array of the second-type memory through stack structures in the second region 714. A plurality of cut structures 769 can be formed to penetrate the semiconductor layer 762 and extend into the isolation layer 760 to further separate the first portion and the second portion of the semiconductor layer 762 into multiple segments. In some implementations, the extended slit structure 755 and the plurality of cut structures 769 can be formed by any suitable patterning process. For example, a mask layer (not shown) can be used in one or more etching processes to form trenches laterally extending along the x-direction (WL direction) and vertically penetrating the semiconductor layer 762, and a followed deposition process can fill a dielectric material into the trenches to form the extended slit structure 755 and the plurality of cut structures 769. A CMP process can then be performed to planarize the top surfaces of the one or more plugs 767, the plurality of vias 765, the slit structure 755, the plurality of cut structures 769, and the top surface of the semiconductor layer 762.

Referring to FIG. 8B, method 800B can proceed to operation 823, in which a first interconnect layer including a plurality of first interconnects can be formed on the semiconductor layer. Method 800B can then proceed to operation 825, in which a first bonding layer can be formed on the first interconnect layer.

Figure 7J:
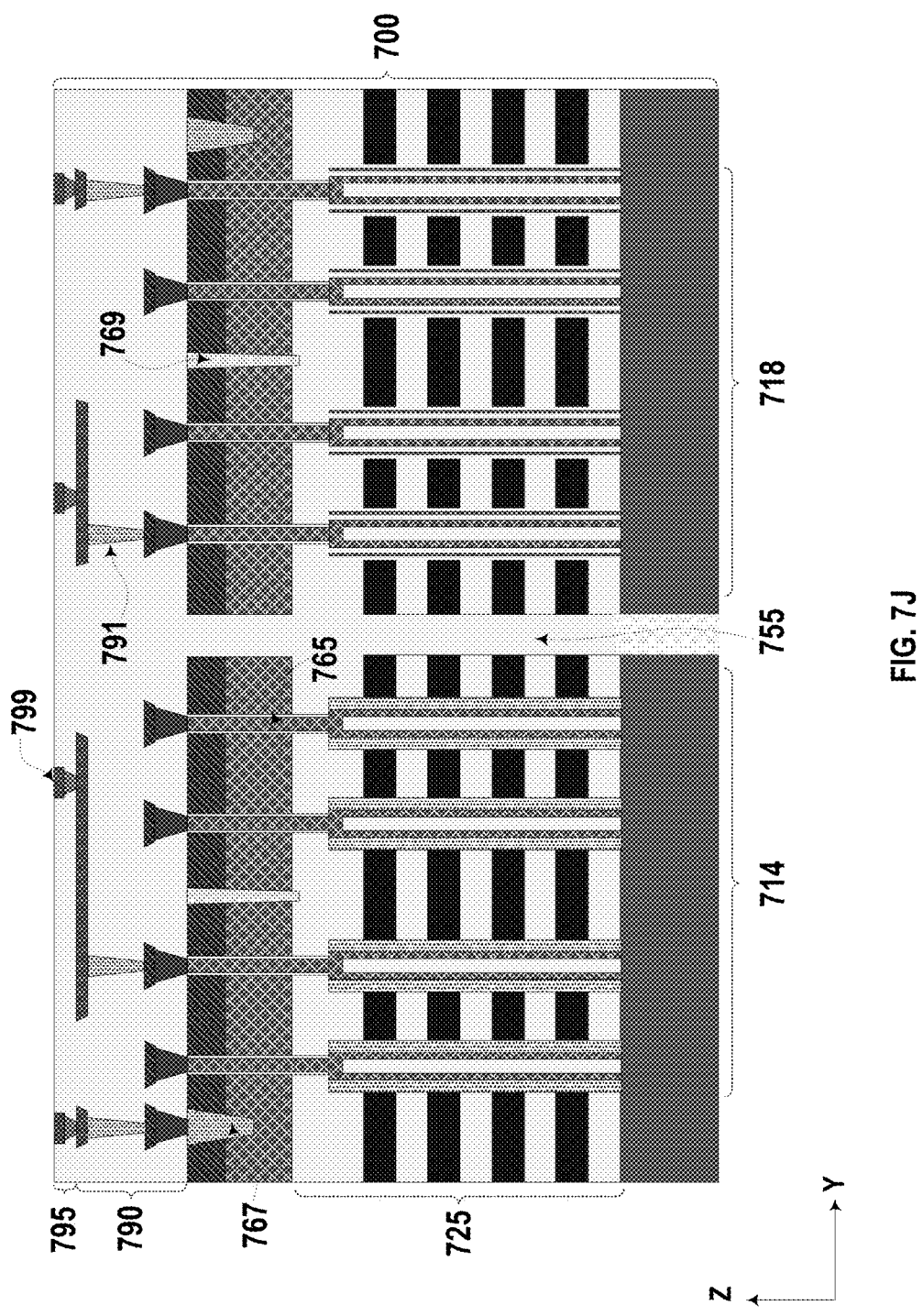

As shown in FIG. 7J, a first interconnect layer 790 is formed above the semiconductor layer 762. First interconnect layer 790 can include first interconnects 791 of MEOL and/or BEOL in a plurality of ILD layers to make electrical connections with the top select gate contacts 767 and/or vias 765. In some implementations, first interconnect layer 790 includes multiple ILD layers and first interconnects 791 therein formed in multiple processes. For example, the first interconnects 791 in first interconnect layer 790 can include conductive materials deposited by one or more thin film deposition processes including, but not limited to, CVD, PVD, ALD, electroplating, electroless plating, or any combination thereof. Fabrication processes to form first interconnects 791 can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 7J can be collectively referred to as first interconnect layer 790.

A first bonding layer 795 can be formed on the first interconnect layer 790. First bonding layer 795 can include first bonding contacts 799 and dielectrics electrically isolating the first bonding contacts 799, which can be used, for example, for hybrid bonding as described below in detail. First bonding contacts 799 can be MEOL/BEOL interconnects and/or contact pads including any suitable conductive materials including, but not limited to W, Co, Cu, Al, silicides, or any combination thereof. As such, the first semiconductor structure can be formed.

Referring to FIG. 10, a flow diagram of an exemplary method for forming a 3D memory device is illustrated in accordance with some implementations of the present disclosure. It should be understood that the operations shown in FIG. 10 are not exhaustive and that other operations can be performed as well before, after, or between any of the illustrated operations. Further, some of the operations may be performed simultaneously, or in a different order than shown in FIG. 10. FIGS. 9A-9D illustrate schematic cross-sectional views of an exemplary 3D memory device at certain fabricating stages of the method shown in FIG. 10 according to some implementations of the present disclosure.

Method 1000 starts at operation 1001, as illustrated in FIG. 10, in which a first periphery circuit layer can be formed on a second substrate. Method 1000 then proceeds to operation 1003, in which a second interconnect layer including multiple second interconnects can be formed on the first periphery circuit layer.

As illustrated in FIG. 9A, in some implementations, the second substrate 920 can be any suitable semiconductor substrate having any suitable structure, such as a monocrystalline single-layer substrate, a polycrystalline silicon (polysilicon) single-layer substrate, a polysilicon and metal multi-layer substrate, etc. The first periphery circuit layer 925 is formed on the second substrate 920. The first periphery circuit layer 925 can include a plurality of transistors 922. In some implementations, transistors 922 can form a NAND HV circuit 367 and a NAND LV+ circuit 365. Transistors 922 can be formed by a plurality of processes including, but not limited to, photolithography, dry/wet etch, thin film deposition, thermal growth, implantation, CMP, and any other suitable processes. In some implementations, doped regions are formed in the second substrate 920 by ion implantation and/or thermal diffusion, which function, for example, as wells and source/drain regions of transistors 922. In some implementations, isolation regions (e.g., STIs, now shown) are also formed in the second substrate 920 by wet/dry etch and thin film deposition. It is understood that the details of fabricating different transistors 922 may vary depending on the types of the transistors 922 (e.g., planar transistors or 3D transistors) and thus, are not elaborated for ease of description.

In some implementations, a second interconnect layer 930 is formed above the transistors 922. The second interconnect layer 930 can include a plurality of second interconnects 935 of MEOL and/or BEOL in one or more ILD layers to make electrical connections with transistors 922. In some implementations, the second interconnect layer 930 includes multiple ILD layers and second interconnects 935 therein formed in multiple processes. For example, the second interconnects 935 in the second interconnect layer 930 can include conductive materials deposited by one or more thin film deposition processes including, but not limited to, CVD, PVD, ALD, electroplating, electroless plating, or any combination thereof. Fabrication processes to form the second interconnects 935 can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and second interconnects 935 illustrated in FIG. 9A can be collectively referred to as the second interconnect layer 930. As such, the second semiconductor structure 910 is formed.

Method 1000 proceeded to operation 1005, as illustrated in FIG. 10, in which a third substrate can be formed on the second interconnect layer. Method 1000 then proceeds to operation 1007, in which one or more through contacts can be formed to penetrate the third substrate and be in contact with the second interconnects.

As shown in FIG. 9B, a third substrate 940, such as a single crystalline silicon layer or a polycrystalline silicon layer, is formed above the second interconnect layer 930. The third substrate 940 can be attached above the second interconnect layer 930 to form a bonding interface (not shown) between the third substrate 940 and the second interconnect layer 930. In some implementations, to form the third substrate 940, a semiconductor layer is bonded to the second semiconductor structure 910 in a face-to-face manner using transfer bonding. The semiconductor layer can then be thinned using any suitable processes to leave the third substrate 940 attached above the second interconnect layer 930.

In some implementations, one or more through contacts 945 penetrating the third substrate 940 can be formed. As illustrated in FIG. 9B, one or more through contacts 945 each extending vertically through the third substrate 940 can be formed to couple the second interconnects 935 in the second interconnect layers 930. Through contacts 945 can be formed by first patterning contact holes through the third substrate 940 using a patterning process (e.g., photolithography and dry/wet etch processes). The contact holes can be filled with a conductor (e.g., W or Cu). In some implementations, filling the contact holes includes depositing a spacer (e.g., a silicon oxide layer) before depositing the conductor.

Referring to FIG. 10, method 1000 proceeds to operation 1009, in which a second periphery circuit layer is formed on the third substrate. Method 1000 then proceeds to operation 1011, in which a third interconnect layer including multiple third interconnects can be formed on the second periphery circuit layer.

Figure 9C:
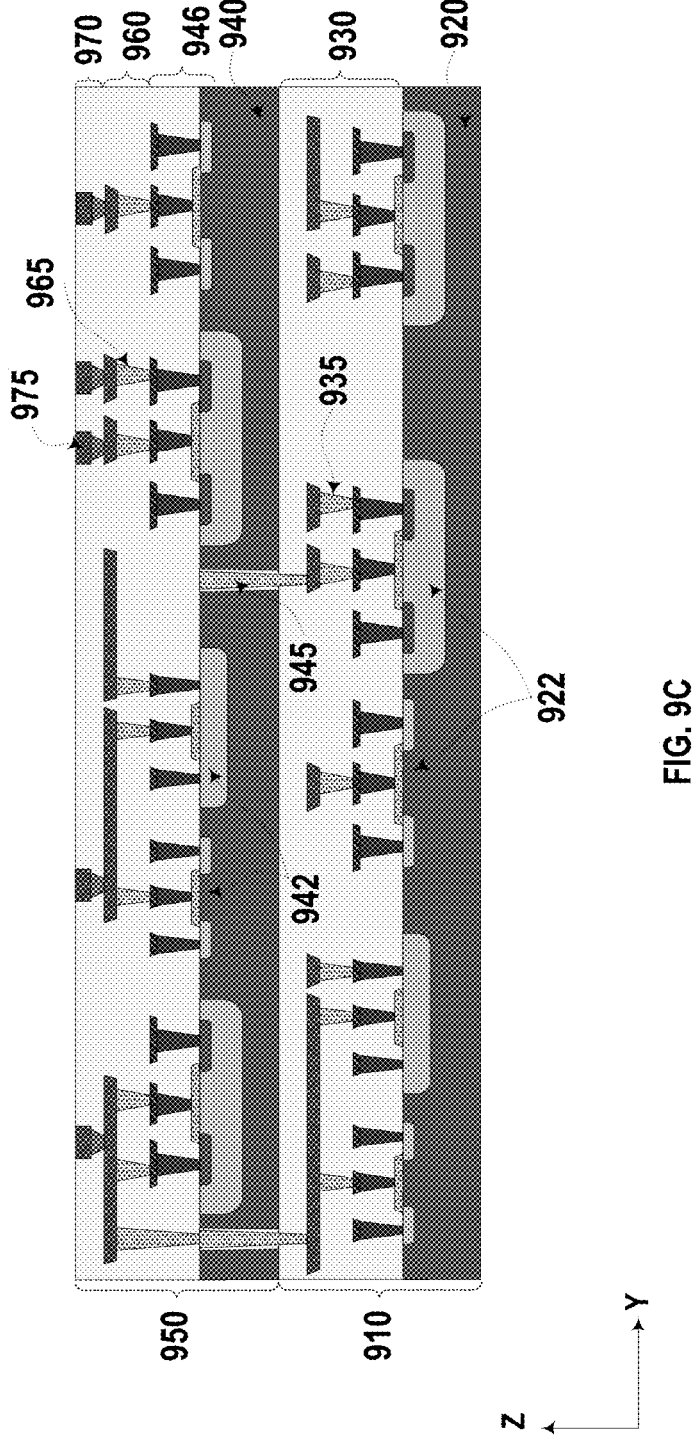

As illustrated in FIG. 9C, the second periphery circuit layer 946 is formed on the third substrate 940. The second periphery circuit layer 946 can include a plurality of transistors 942. In some implementations, transistors 942 can form a NAND LV– circuit 363, a NAND LLV circuit 361, a Main-C circuit 352, and a FeRAM-C circuit 374. Transistors 942 can be formed by a plurality of processes including, but not limited to, photolithography, dry/wet etch, thin film deposition, thermal growth, implantation, CMP, and any other suitable processes. In some implementations, doped regions are formed in the third substrate 940 by ion implantation and/or thermal diffusion, which function, for example, as wells and source/drain regions of transistors 942. In some implementations, isolation regions (e.g., STIs, now shown) are also formed in the third substrate 940 by wet/dry etch and thin film deposition. It is understood that the details of fabricating different transistors 942 may vary depending on the types of the transistors 942 (e.g., planar transistors or 3D transistors) and thus, are not elaborated for ease of description.

In some implementations, a third interconnect layer 960 is formed above the transistors 942. The third interconnect layer 960 can include a plurality of third interconnects 965 of MEOL and/or BEOL in one or more ILD layers to make electrical connections with transistors 942. In some implementations, the third interconnect layer 960 includes multiple ILD layers and third interconnects 965 therein formed in multiple processes. For example, the third interconnects 965 in the third interconnect layer 960 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and the third interconnects 965 illustrated in FIG. 9C can be collectively referred to as the third interconnect layer 960.

Referring back to FIG. 10, method 1000 proceeds to operation 1013, in which a second bonding layer can be formed on the third interconnect layer of the third semiconductor structure. Method 1000 then proceeds to operation 1015, in which the second bonding layer of the third semiconductor structure can be bonded to the first bonding layer of the first semiconductor structure. The bonding can include hybrid bonding.

In some implementations, as shown in FIG. 9C, a second bonding layer 970 can be formed on the third interconnect layer 960. Second bonding layer 970 can include second bonding contacts 975 and dielectrics electrically isolating the second bonding contacts 975, which can be used, for example, for hybrid bonding as described below in detail. Second bonding contacts 975 can be MEOL/BEOL interconnects and/or contact pads including any suitable conductive materials including, but not limited to W, Co, Cu, Al, silicides, or any combination thereof. As such, the first semiconductor structure can be formed. As such, the third semiconductor structure 950 can be formed.

Figure 9D:
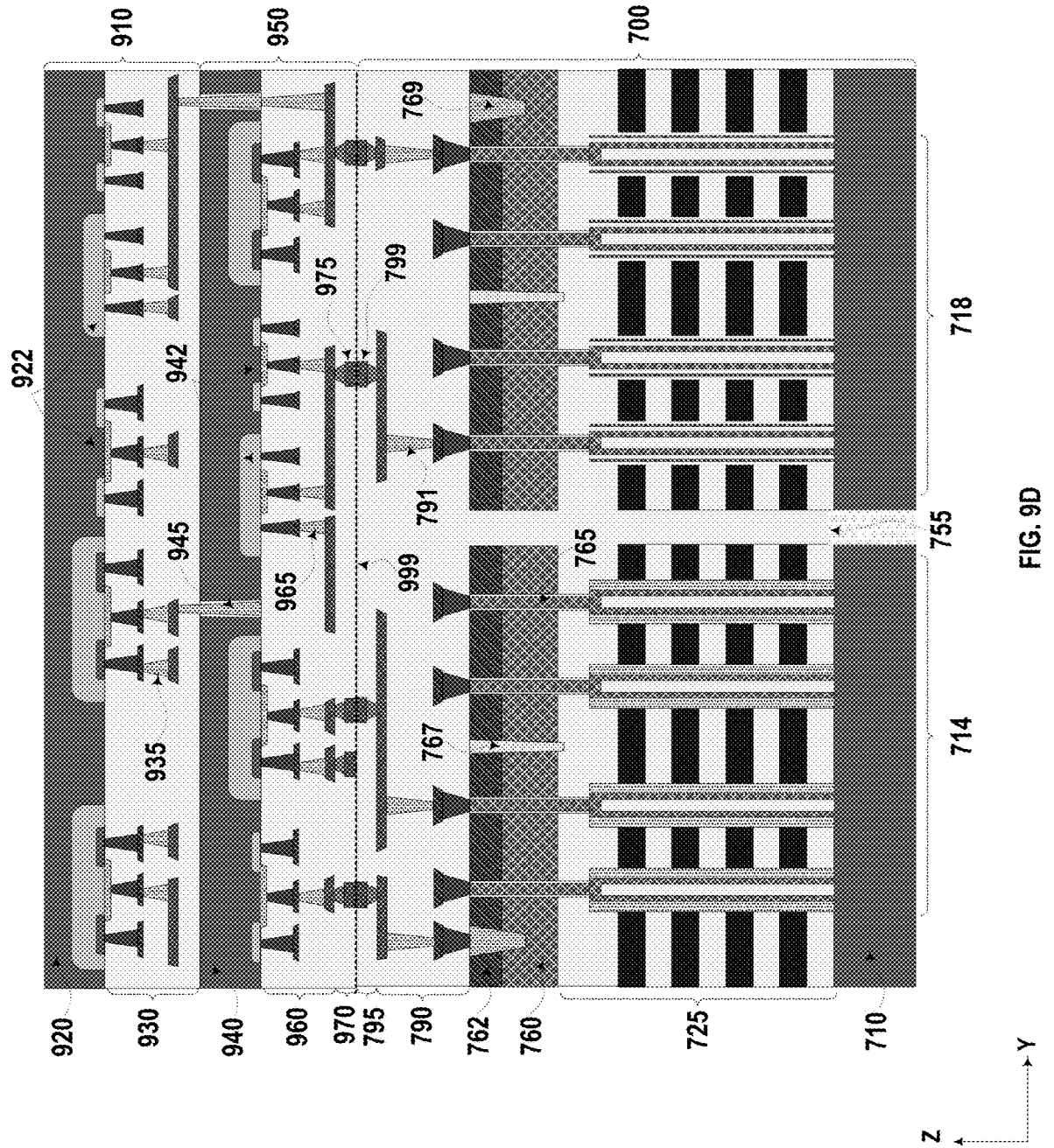

As illustrated in FIG. 9D, the bonded structure including the second semiconductor structure 910 and the third semiconductor structure 950 can be flipped upside down. The second bonding layer 970 in the third semiconductor structure 950 facing down is bonded with the first bonding layer 795 in the first semiconductor structure 700 facing up, i.e., in a face-to-face manner, thereby forming a bonding interface 999. The first bonding contacts 799 in the first bonding layer 795 are in contact with the second bonding contacts 975 in the second bonding layer 970 at the bonding interface 999. In some implementations, a treatment process, e.g., plasma treatment, wet treatment and/or thermal treatment, is applied to bonding surfaces prior to bonding.

As a result of the bonding, e.g., hybrid bonding, the first and second bonding contacts 799 and 975 on opposite sides of bonding interface 999 can be inter-mixed. After the bonding, the first bonding contacts 799 in the first bonding layer 795 are in contact with the second bonding contacts 975 in the second bonding layer 970 are aligned and in contact with one another, such that memory stack 725, as well as the NAND memory cell array and the ferroelectric memory cell array formed therethrough can be coupled to transistors 922 and 942 through the bonded bonding contacts 799 and 975 across the bonding interface 999, according to some implementations. Accordingly, the 3D memory structure is formed.

Referring to FIG. 12, a flow diagram of another exemplary method for forming a 3D memory device is illustrated in accordance with some implementations of the present disclosure. It should be understood that the operations shown in FIG. 12 are not exhaustive and that other operations can be performed as well before, after, or between any of the illustrated operations. Further, some of the operations may be performed simultaneously, or in a different order than shown in FIG. 12. FIGS. 11A-11D illustrate schematic cross-sectional views of the other exemplary 3D memory device at certain fabricating stages of the method shown in FIG. 12 according to some implementations of the present disclosure.

Method 1200 starts at operation 1201, as illustrated in FIG. 12, in which a first periphery circuit layer can be formed on a first side of a second substrate. Method 1200 then proceeds to operation 1203, in which a second interconnect layer including multiple second interconnects can be formed on the first periphery circuit layer.

Figures 11A, 11B:
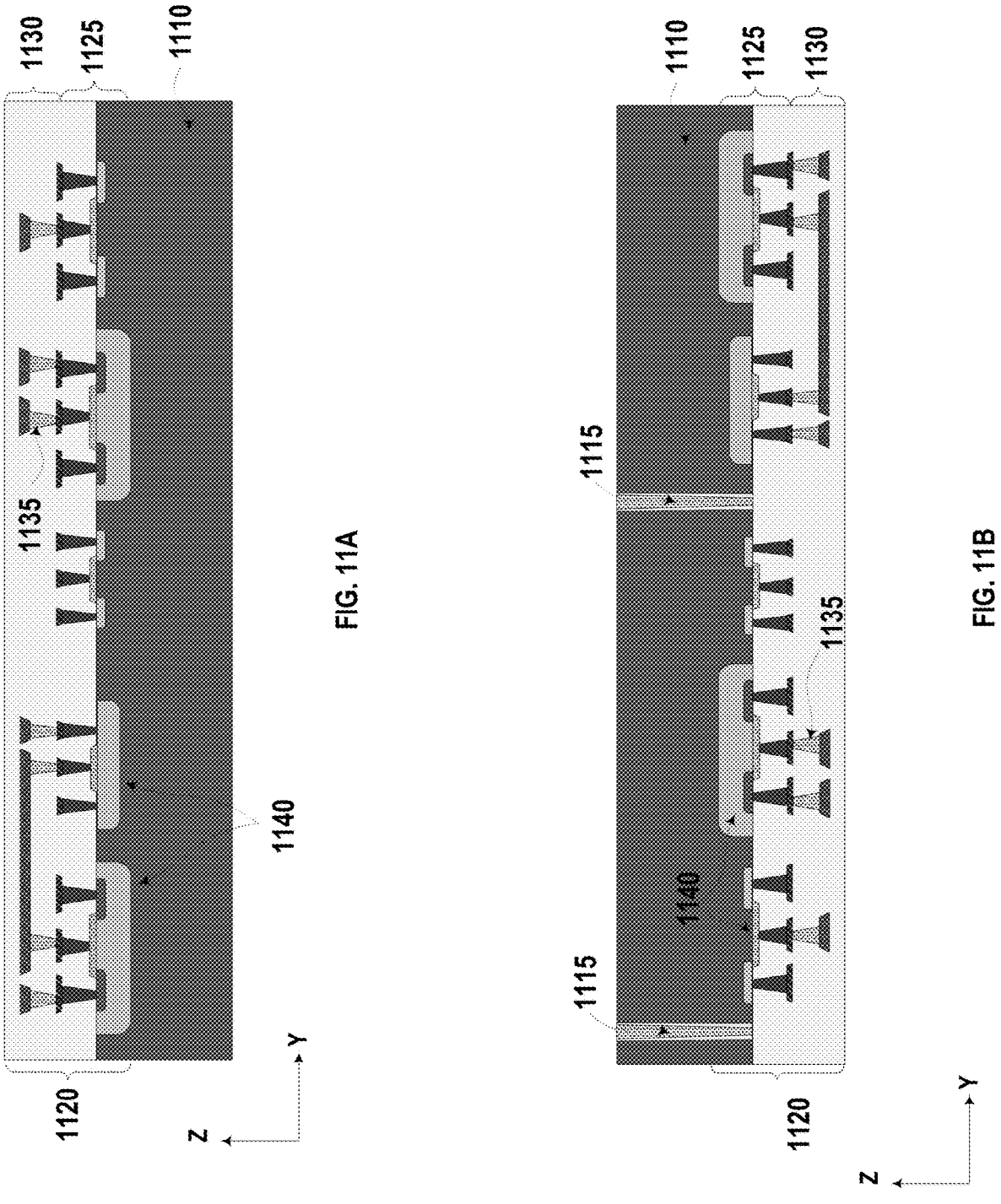
FIGS. 11A-11D illustrate a fabrication process for forming an exemplary 3D memory device according to some aspects of the present disclosure.

As illustrated in FIG. 11A, in some implementations, the second substrate 1110 can be any suitable semiconductor substrate having any suitable structure, such as a monocrystalline single-layer substrate, a polycrystalline silicon (polysilicon) single-layer substrate, a polysilicon and metal multi-layer substrate, etc. The first periphery circuit layer 1125 is formed on a first side of the second substrate 1110. The first periphery circuit layer 1125 can include a plurality of transistors 1140. In some implementations, transistors 1140 can form a NAND LV− circuit 363, a NAND LLV circuit 361, a Main-C circuit 352, and a FeRAM-C circuit 374. Transistors 1140 can be formed by a plurality of processes including, but not limited to, photolithography, dry/wet etch, thin film deposition, thermal growth, implantation, CMP, and any other suitable processes. In some implementations, doped regions are formed in the second substrate 1110 by ion implantation and/or thermal diffusion, which function, for example, as wells and source/drain regions of transistors 1140. In some implementations, isolation regions (e.g., STIs, now shown) are also formed in the second substrate 1110 by wet/dry etch and thin film deposition. It is understood that the details of fabricating different transistors 1140 may vary depending on the types of the transistors 1140 (e.g., planar transistors or 3D transistors) and thus, are not elaborated for ease of description.

In some implementations, a second interconnect layer 1130 is formed above the transistors 1140. The second interconnect layer 1130 can include a plurality of second interconnects 1135 of MEOL and/or BEOL in one or more ILD layers to make electrical connections with transistors 1140. In some implementations, the second interconnect layer 1130 includes multiple ILD layers and second interconnects 1135 therein formed in multiple processes. For example, the second interconnects 1135 in the second interconnect layer 1130 can include conductive materials deposited by one or more thin film deposition processes including, but not limited to, CVD, PVD, ALD, electroplating, electroless plating, or any combination thereof. Fabrication processes to form the second interconnects 1135 can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and second interconnects 1135 illustrated in FIG. 11A can be collectively referred to as the second interconnect layer 1130. As such, the second semiconductor structure 1120 is formed.

Method 1200 proceeded to operation 1205, as illustrated in FIG. 10, in which one or more through contacts can be formed to penetrate the second substrate and in contact with the second interconnects.

As shown in FIG. 11B, in some implementations, one or more through contacts 1115 penetrating the second substrate 1110 can be formed. As illustrated in FIG. 11B, one or more through contacts 1115 each extending vertically through the second substrate 1110 can be formed to couple the second interconnects 1135 in the second interconnect layers 1130. Through contacts 1115 can be formed by first patterning contact holes through the second substrate 1110 using a patterning process (e.g., photolithography and dry/wet etch processes). The contact holes can be filled with a conductor (e.g., W or Cu). In some implementations, filling the contact holes includes depositing a spacer (e.g., a silicon oxide layer) before depositing the conductor.

Referring to FIG. 10, method 1200 proceeds to operation 1207, in which a second periphery circuit layer is formed on a second side of the second substrate. Method 1200 then proceeds to operation 1209, in which a third interconnect layer including multiple third interconnects can be formed on the second periphery circuit layer.

Figure 11C:
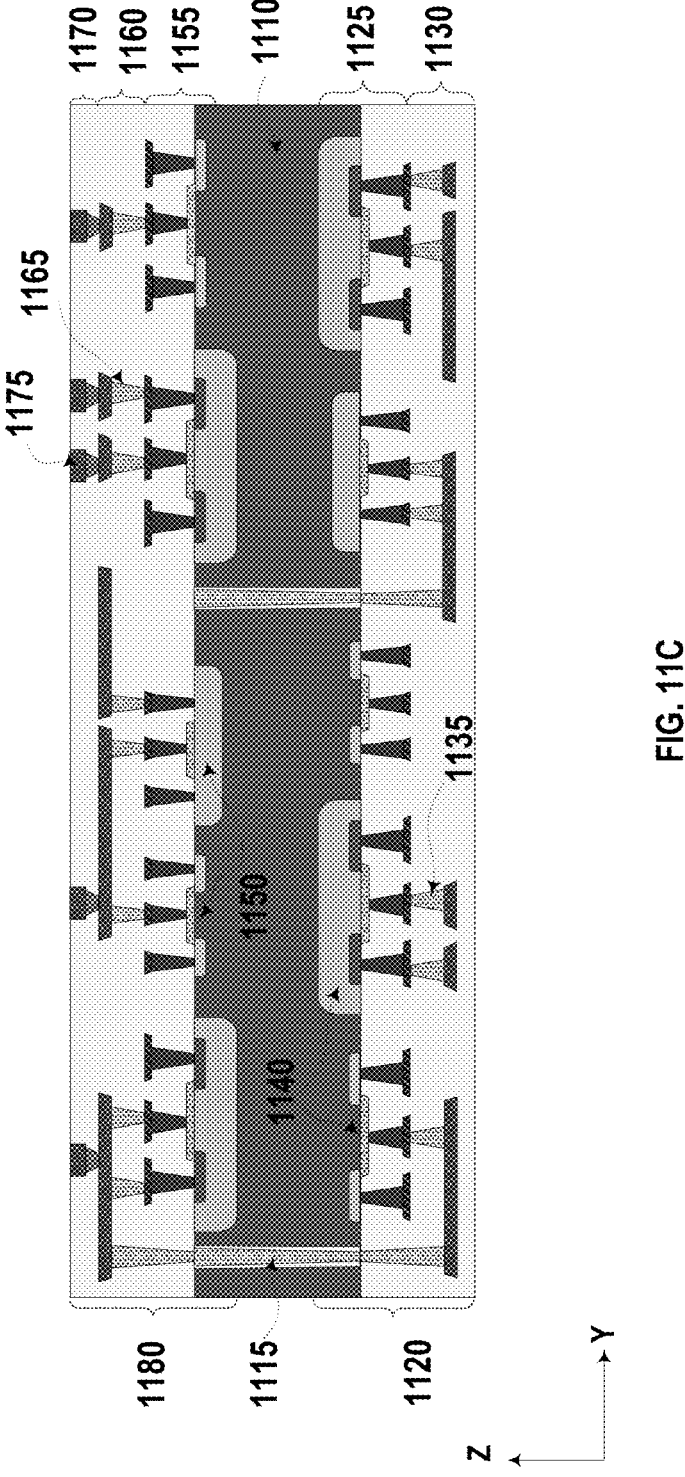

As illustrated in FIG. 11C, the second periphery circuit layer 1155 is formed on a second side of the second substrate 1110. The second periphery circuit layer 1155 can include a plurality of transistors 1150. In some implementations, transistors 1150 can form a NAND HV circuit 367 and a NAND LV+ circuit 365. Transistors 1150 can be formed by a plurality of processes including, but not limited to, photolithography, dry/wet etch, thin film deposition, thermal growth, implantation, CMP, and any other suitable processes. In some implementations, doped regions are formed in the second substrate 1110 by ion implantation and/or thermal diffusion, which function, for example, as wells and source/drain regions of transistors 1150. In some implementations, isolation regions (e.g., STIs, now shown) are also formed in the second substrate 1110 by wet/dry etch and thin film deposition. It is understood that the details of fabricating different transistors 1150 may vary depending on the types of the transistors 1150 (e.g., planar transistors or 3D transistors) and thus, are not elaborated for ease of description.

In some implementations, a third interconnect layer 1160 is formed above the transistors 1150. The third interconnect layer 1160 can include a plurality of third interconnects 1165 of MEOL and/or BEOL in one or more ILD layers to make electrical connections with transistors 1150. In some implementations, the third interconnect layer 1160 includes multiple ILD layers and third interconnects 1165 therein formed in multiple processes. For example, the third interconnects 1165 in the third interconnect layer 1160 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and the third interconnects 1165 illustrated in FIG. 11C can be collectively referred to as the third interconnect layer 1160.

Referring back to FIG. 12, method 1200 proceeds to operation 1211, in which a second bonding layer can be formed on the third interconnect layer. Method 1200 then proceeds to operation 1213, in which the second bonding layer of the third semiconductor structure can be bonded to the first bonding layer of the first semiconductor structure. The bonding can include hybrid bonding.

In some implementations as shown in FIG. 9C, a second bonding layer 1170 can be formed on the third interconnect layer 1160. Second bonding layer 1170 can include second bonding contacts 1175 and dielectrics electrically isolating the second bonding contacts 1175, which can be used, for example, for hybrid bonding as described below in detail. Second bonding contacts 1175 can be MEOL/BEOL interconnects and/or contact pads including any suitable conductive materials including, but not limited to, W, Co, Cu, Al, silicides, or any combination thereof. As such, the first semiconductor structure can be formed. As such, the third semiconductor structure 1180 can be formed.

Figure 11D:
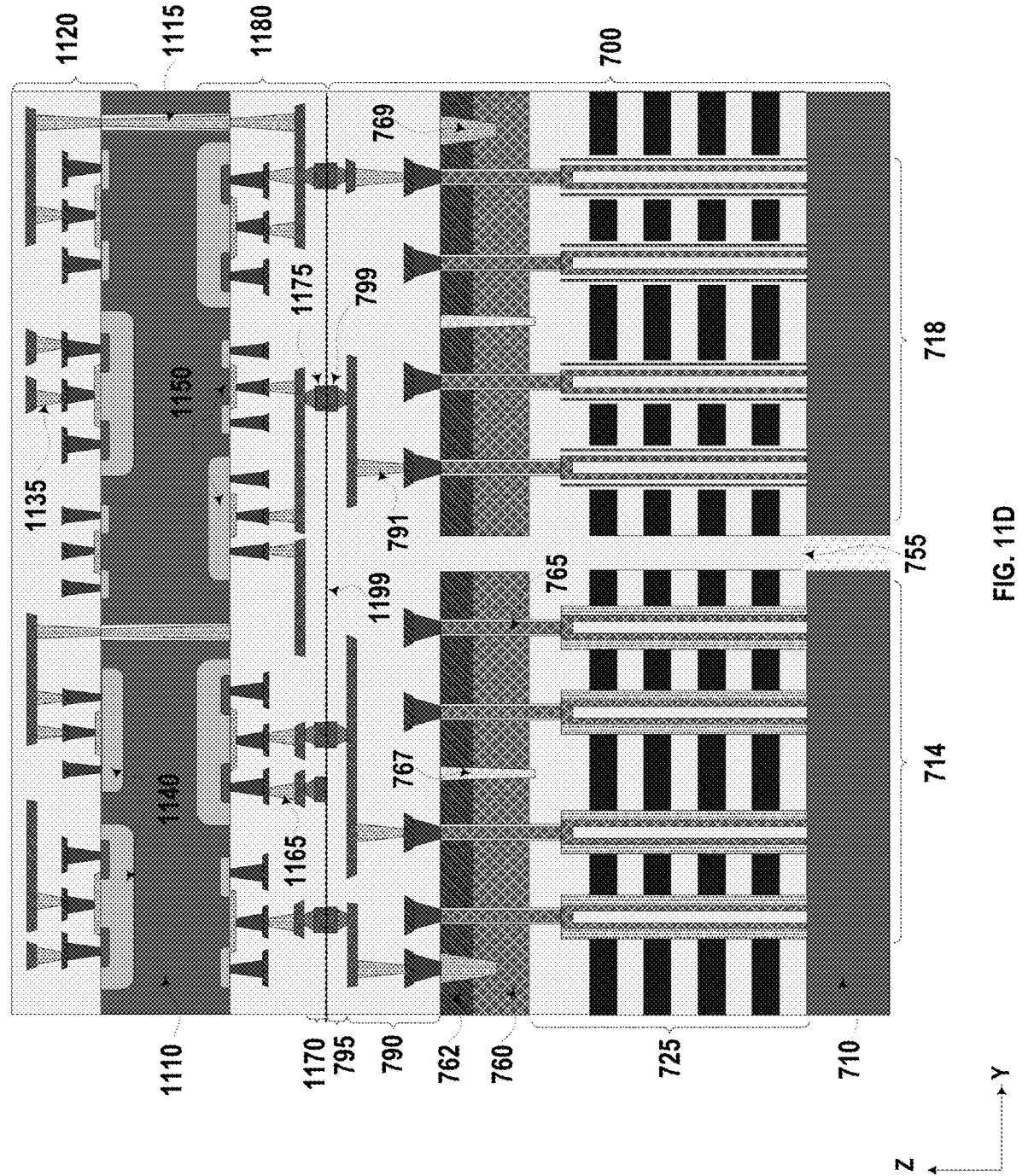

As illustrated in FIG. 11D, the bonded structure including the second semiconductor structure 1120 and the third semiconductor structure 1180 can be flipped upside down. The second bonding layer 1170 in the third semiconductor structure 1180 facing down is bonded with the first bonding layer 795 in the first semiconductor structure 700 facing up, i.e., in a face-to-face manner, thereby forming a bonding interface 1199. The first bonding contacts 799 in the first bonding layer 795 are in contact with the second bonding contacts 1175 in the second bonding layer 1170 at the bonding interface 1199. In some implementations, a treatment process, e.g., plasma treatment, wet treatment and/or thermal treatment, is applied to bonding surfaces prior to bonding.

As a result of the bonding, e.g., hybrid bonding, the first and second bonding contacts 799 and 1175 on opposite sides of bonding interface 1199 can be inter-mixed. After the bonding, the first bonding contacts 799 in the first bonding layer 795 are in contact with the second bonding contacts 1175 in the second bonding layer 1170 are aligned and in contact with one another, such that memory stack 725, as well as the NAND memory cell array and the ferroelectric memory cell array formed therethrough can be coupled to transistors 1140 and 1150 through the bonded bonding contacts 799 and 1175 across the bonding interface 1199, according to some implementations. Accordingly, the 3D memory structure is formed.

Figure 13:
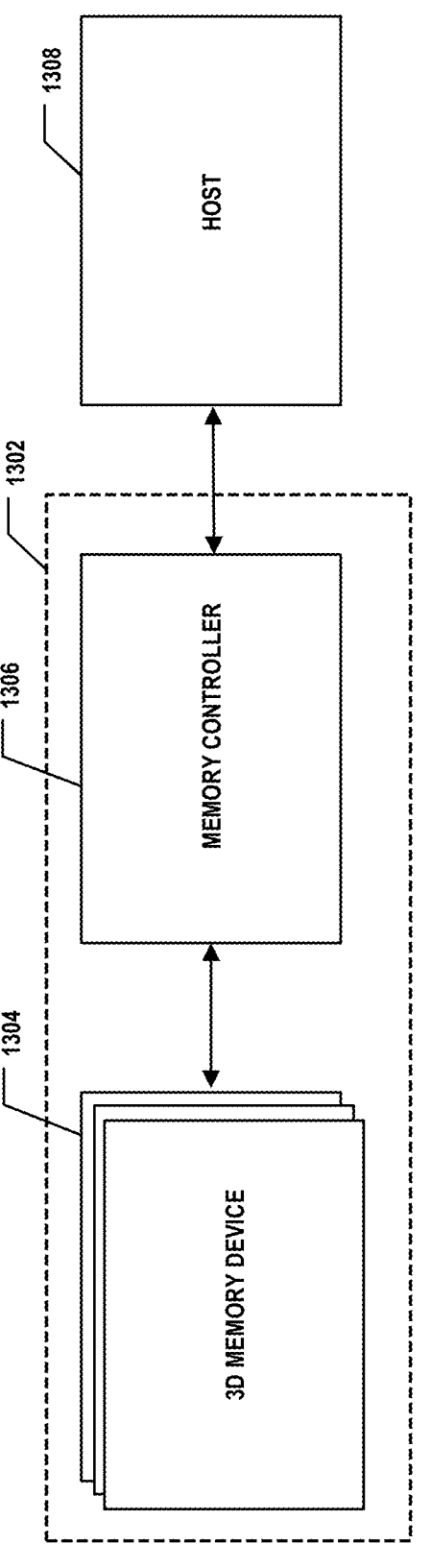
FIG. 13 illustrates a block diagram of an exemplary system having a memory device, according to some aspects of the present disclosure.

FIG. 13 illustrates a block diagram of a system 1300 having a memory device, according to some aspects of the present disclosure. System 1300 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 13, system 1300 can include a host 1308 and a memory system 1302 having one or more memory devices 1304 and a memory controller 1306. Host 1308 can be a processor of an electronic device, such as a central processing unit (CPU), or a system-on-chip (SoC), such as an application processor (AP). Host 1308 can be configured to send or receive the data to or from memory devices 1304.

Memory device 1304 can be any memory devices disclosed herein, such as 3D memory device 100, 400. In some implementations, each memory device 1304 includes memory cell arrays and peripheral circuits of the memory cell arrays that are stacked over one another in different planes, as described above in detail.

Memory controller 1306 is coupled to memory device 1304 and host 1308 and is configured to control memory device 1304, according to some implementations. Memory controller 1306 can manage the data stored in memory device 1304 and communicate with host 1308. In some implementations, memory controller 1306 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1306 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1306 can be configured to control operations of memory device 1304, such as read, erase, and program operations. In some implementations, memory controller 1306 is configured to control the array of memory cells through the first peripheral circuit and the second peripheral circuit. Memory controller 1306 can also be configured to manage various functions with respect to the data stored or to be stored in memory device 1304 including, but not limited to bad-block management, garbage collection, logical-to-physical address conversion, wear leveling, etc. In some implementations, memory controller 1306 is further configured to process error correction codes (ECCs) with respect to the data read from or written to memory device 1304. Any other suitable functions may be performed by memory controller 1306 as well, for example, formatting memory device 1304. Memory controller 1306 can communicate with an external device (e.g., host 1308) according to a particular communication protocol. For example, memory controller 1306 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 1306 and one or more memory devices 1304 can be integrated into various types of storage devices, for example, be included in the same package, such as a universal Flash storage (UFS) package or an eMMC package. That is, memory system 1302 can be implemented and packaged into different types of end electronic products.

Figure 14B:
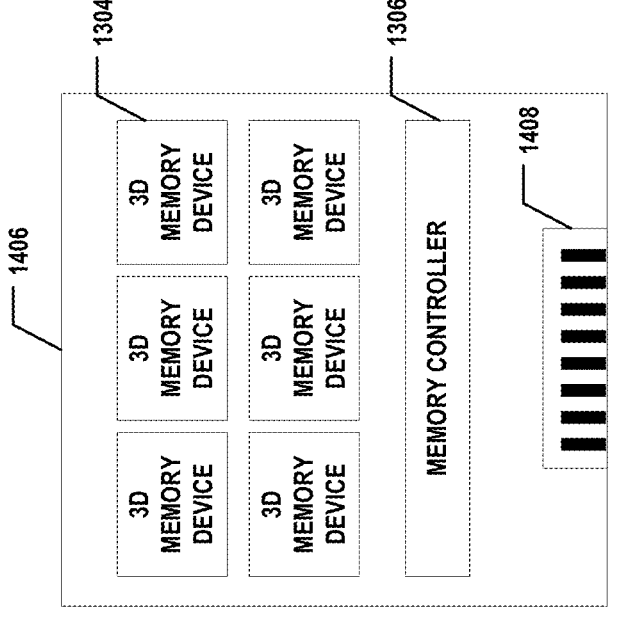
FIG. 14B illustrates a diagram of an exemplary solid-state drive (SSD) having a memory device, according to some aspects of the present disclosure.
Figure 14A:
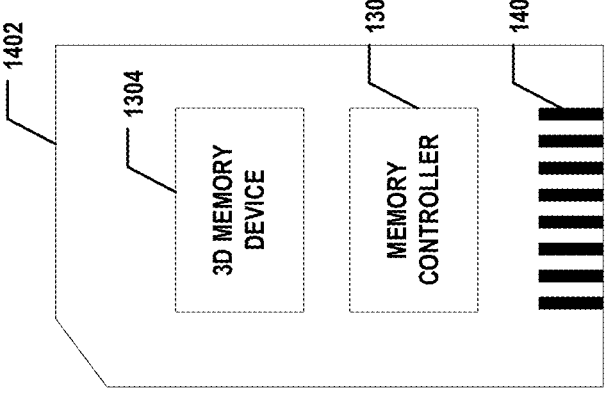
FIG. 14A illustrates a diagram of an exemplary memory card having a memory device, according to some aspects of the present disclosure.

In one example as shown in FIG. 14A, memory controller 1306 and a single memory device 1304 may be integrated into a memory card 1402. Memory card 1402 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 1402 can further include a memory card connector 1404 coupling memory card 1402 with a host (e.g., host 1308 in FIG. 13). In another example as shown in FIG. 14B, memory controller 1306 and multiple memory devices 1304 may be integrated into an SSD 1406. SSD 1406 can further include an SSD connector 1408 coupling SSD 1406 with a host (e.g., host 1308 in FIG. 13). In some implementations, the storage capacity and/or the operation speed of SSD 1406 is greater than those of memory card 1402.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A method for forming a three-dimensional (3D) memory device, comprising:

forming a first semiconductor structure, comprising:

forming an array of first-type through stack structures in a first region and an array of second-type through stack structures in a second region, and forming a slit structure to separate the array of first-type through stack structures from the array of second-type through stack structures;

forming a periphery circuit semiconductor structure, comprising:

forming a first periphery circuit and a second periphery circuit at different levels; and bonding the periphery circuit semiconductor structure to the first semiconductor structure.

2. The method of claim 1, wherein forming the first semiconductor structure further comprises:

forming a semiconductor layer including a first portion on the array of first-type through stack structures and a second portion on the array of second-type through stack structures, wherein the slit structure further separates the first portion of the semiconductor layer from the second portion of the semiconductor layer; and forming a plurality of vias each penetrating the semiconductor layer and in contact with a corresponding one of the first-type through stack structures or a corresponding one of the second-type through stack structures.

3. The method of claim 2, wherein forming the first semiconductor structure further comprises:

forming a dielectric stack including a plurality of interleaved dielectric layers and sacrificial layers stacked on a first substrate;

forming a slit vertically penetrating the dielectric stack and laterally separating the array of first-type through stack structures from the array of second-type through stack structures; and replacing the plurality of sacrificial layers with a plurality of conductive layers to transform the dielectric stack into a memory stack;

wherein the slit structure is formed to fill the slit.

4. The method of claim 3, wherein forming the first-type and second-type through stack structures comprises:

forming a plurality of through stack holes each penetrating the dielectric stack;

filing a first subset of through stack holes in the first region with a sacrificial material;

forming the second-type through stack structures in a second subset of through stack holes in the second region;

removing the sacrificial material in the first subset of through stack holes; and forming the first-type through stack structures in the first subset of through stack holes.

5. The method of claim 4, wherein:

forming the first-type through stack structures comprises forming a FeFET through stack structure; and forming the second-type through stack structures comprises forming a NAND channel structure FeFET through stack structure.

6. The method of claim 5, wherein forming the FeFET through stack structure comprises:

forming a ferroelectric layer on a sidewall of each of the first subset of through stack holes;

forming a conductive layer to cover the ferroelectric layer; and forming a dielectric filling structure on the ferroelectric layer to fill the first subset of through stack holes.

7. The method of claim 4, wherein:

forming the first-type through stack structures comprises forming a FeRAM through stack structure; and forming the second-type through stack structures comprises forming a NAND channel structure.

8. The method of claim 7, wherein forming the FeRAM through stack structure comprises:

forming a ferroelectric layer on a sidewall of each of the first subset of through stack holes; and forming a conductive filling structure on the ferroelectric layer to fill the first subset of through stack holes.

9. The method of claim 3, wherein forming the vias comprises:

forming a plurality of through holes each penetrating the semiconductor layer and exposing a corresponding first type or second-type through stack structure;

filling the through holes with a dielectric material; and forming the vias each in a corresponding through hole and surrounded by the dielectric material.

10. The method of claim 9, further comprising:

forming a plurality of cut structures each laterally extending between the vias and vertically separating portions of the semiconductor layer.

11. The method of claim 3, further comprising:

forming a first interconnect layer comprising a plurality of first interconnects in contact with the vias; and forming a first bonding layer comprising a plurality of first bonding contacts in contact with the first interconnects.

12. The method of claim 3, wherein forming the second periphery circuit semiconductor structure, comprising:

forming the first periphery circuit at a first side of a second substrate; and forming the second periphery circuit on a second semiconductor layer on the first periphery circuit, or at a second side of the second substrate.

13. The method of claim 12, wherein forming the first periphery circuit comprises:

forming a main control circuit configured to control the array of first-type through stack structures and the array of second-type through stack structures;

forming a second array periphery circuit configured to operating of the array of second-type through stack structures;

forming a first portion of a first array periphery circuit having a first operating voltage range; and forming a second portion of the first array periphery circuit having a second operating voltage range higher than the first operating voltage range.

14. The method of claim 13, wherein forming the second periphery circuit comprises:

forming a third portion of the first array periphery circuit having a third operating voltage range higher than the second operating voltage range; and forming a fourth portion of the first array periphery circuit having a fourth operating voltage range higher than the third operating voltage range.

15. The method of claim 11, wherein:

forming the periphery circuit semiconductor structure comprises:

forming a second interconnect layer comprising a plurality of second interconnects in contact with a plurality of transistors of the periphery circuit, and forming a second bonding layer comprising a plurality of second bonding contacts in contact with the second interconnects; and bonding the periphery circuit semiconductor structure to the first semiconductor structure comprises hybrid bonding the first bonding layer to the second bonding layer, such that each first bonding contact is joined with one corresponding second bonding contact.

16. A three-dimensional (3D) memory device, comprising:

a first semiconductor structure, comprising:
  an array of first-type through stack structures in a first region and an array of second-type through stack structures in a second region, and
  a slit structure separating the array of first-type through stack structures from the array of second-type through stack structures;

a periphery circuit semiconductor structure comprising, a first periphery circuit and a second periphery circuit at different levels;

wherein the periphery circuit semiconductor structure and the first semiconductor structure are bonded together, such that the first periphery circuit is located between the second periphery circuit and the first semiconductor structure.

17. The memory device of claim 16, further comprising:

a semiconductor layer including a first portion on the array of first-type through stack structures and a second portion on the array of second-type through stack structures that are separated by the slit structure; and a plurality of vias each penetrating the semiconductor layer and in contact with a corresponding one of the first-type through stack structures or the array of second-type through stack structures.

18. The memory device of claim 16, wherein:

the first-type through stack structures are FeFET through stack structures; and the second-type through stack structures are NAND channel structures.

19. The memory device of claim 18, wherein each FeFET through stack structure comprises:

a ferroelectric layer;

a conductive layer laterally surrounded by the ferroelectric layer; and a dielectric filling structure laterally surrounded by the conductive layer.

20. The memory device of claim 16, wherein:

the first-type through stack structures are FeRAM through stack structures; and the second-type through stack structures are NAND channel structures.

* * * * *